United States Patent [19]
Linz et al.

[11] Patent Number: 5,589,830
[45] Date of Patent: Dec. 31, 1996

[54] STEREO AUDIO CODEC

[75] Inventors: Alfredo R. Linz; Carlin D. Cabler; Glen W. Brown; Martin P. Soques, all of Austin, Tex.

[73] Assignee: Advanced Micro Devices, Inc., Sunnyvale, Calif.

[21] Appl. No.: 333,467

[22] Filed: Nov. 2, 1994

[51] Int. Cl.[6] ................................................. H03M 1/00
[52] U.S. Cl. ........................................................ 341/110
[58] Field of Search ................................. 341/110, 108, 341/123, 144, 155

[56]  References Cited

U.S. PATENT DOCUMENTS

| | | | |
|---|---|---|---|
| 4,317,221 | 2/1982 | Toya | 455/76 |
| 4,746,899 | 5/1988 | Swanson et al. | 340/347 |
| 4,800,524 | 1/1989 | Roesgen | 364/900 |
| 4,823,312 | 4/1989 | Michael et al. | 364/900 |
| 4,903,022 | 2/1990 | Hester et al. | 341/110 |
| 4,918,339 | 4/1990 | Shigeo et al. | 307/542 |
| 5,124,579 | 6/1992 | Naghshineh | 307/443 |
| 5,140,679 | 8/1992 | Michael | 395/325 |
| 5,199,105 | 3/1993 | Michael | 395/275 |
| 5,218,239 | 6/1993 | Boomer | 307/443 |
| 5,233,309 | 8/1993 | Spitalny et al. | 330/84 |
| 5,280,595 | 1/1994 | Lemay et al. | 395/425 |
| 5,287,457 | 2/1994 | Arimilli et al. | 395/200 |
| 5,287,470 | 2/1994 | Simpson | 395/425 |
| 5,289,584 | 2/1994 | Thome et al. | 395/325 |
| 5,299,315 | 3/1994 | Chin et al. | 395/250 |

OTHER PUBLICATIONS

Samsung Semiconductor OmniWave™ Multimedia Audio KS0161, Rev. A, Nov. 1994.
OPTi/MediaCHIPS Multimedia Audio Controller 82C929, Mar. 29, 1993 Spec Sheet.
Analog Devices Parallel–Port 16–Bit SoundPort Stereo Codec AD 1848, Rev. A (no date given).
Crystal Semiconductor Corporation Parallel Interface, Multimedia Audio Codec CS–4231 Mar. 1993.

*Primary Examiner*—Brian K. Young
*Attorney, Agent, or Firm*—Fulbright & Jaworski L.L.P.

[57]  ABSTRACT

A stereo audio CODEC, including means for performing D/A and A/D conversions, means for reducing digitally induced noise during attenuation/gain changes, data format conversion means, analog and digital filtering means, analog mixing means, on-chip 16-sample, 32-bit wide record and playback FIFOs, serial interface with external serial DSP, large local memory for supplementing on-chip record and playback FIFOs, control registers, register data bus and synthesizer DAC.

30 Claims, 61 Drawing Sheets

| 0 TO +22.5dB (4-BIT) GAIN TABLE ||||||||
|---|---|---|---|---|---|---|---|
| VALUE | dB | VALUE | dB | VALUE | dB | VALUE | dB |
| 00h | 00.0 | 04h | +06.0 | 08h | +12.0 | 0Ch | +18.0 |
| 01h | +01.5 | 05h | +07.5 | 09h | +13.5 | 0Dh | +19.5 |
| 02h | +03.0 | 06h | +09.0 | 0Ah | +15.0 | 0Eh | +21.0 |
| 03h | +04.5 | 07h | +10.5 | 0Bh | +16.5 | 0Fh | +22.5 |

| 0 to -45.0dB (4-BIT) ATTENUATION TABLE ||||||||
|---|---|---|---|---|---|---|---|
| VALUE | dB | VALUE | dB | VALUE | dB | VALUE | dB |
| 00h | 00.0 | 04h | -12.0 | 08h | -24.0 | 0Ch | -36.0 |
| 01h | -03.0 | 05h | -15.0 | 09h | -27.0 | 0Dh | -39.0 |
| 02h | -06.0 | 06h | -18.0 | 0Ah | -30.0 | 0Eh | -42.0 |
| 03h | -09.0 | 07h | -21.0 | 0Bh | -33.0 | 0Fh | -45.0 |

| 12 TO -34.5dB (5-BIT) GAIN-ATTENUATION TABLE ||||||||
|---|---|---|---|---|---|---|---|
| VALUE | dB | VALUE | dB | VALUE | dB | VALUE | dB |
| 00h | +12.0 | 08h | 00.0 | 10h | -12.0 | 18h | -24.0 |
| 01h | +10.5 | 09h | -01.5 | 11h | -13.5 | 19h | -25.5 |
| 02h | +09.0 | 0Ah | -03.0 | 12h | -15.0 | 1Ah | -27.0 |
| 03h | +07.5 | 0Bh | -04.5 | 13h | -16.5 | 1Bh | -28.5 |
| 04h | +06.0 | 0Ch | -06.0 | 14h | -18.0 | 1Ch | -30.0 |
| 05h | +04.5 | 0Dh | -07.5 | 15h | -19.5 | 1Dh | -31.5 |
| 06h | +03.0 | 0Eh | -09.0 | 16h | -21.0 | 1Eh | -33.0 |
| 07h | +01.5 | 0Fh | -10.5 | 17h | -22.5 | 1Fh | -34.5 |

| 0 TO -46.5dB (5-BIT) ATTENUATION TABLE FOR CLOAI AND CROAI ||||||||
|---|---|---|---|---|---|---|---|
| VALUE | dB | VALUE | dB | VALUE | dB | VALUE | dB |
| 00h | 00.0 | 08h | -12.0 | 10h | -24.0 | 18h | -36.0 |
| 01h | -01.5 | 09h | -13.5 | 11h | -25.5 | 19h | -37.5 |
| 02h | -03.0 | 0Ah | -15.0 | 12h | -27.0 | 1Ah | -39.0 |
| 03h | -04.5 | 0Bh | -16.5 | 13h | -28.5 | 1Bh | -40.5 |
| 04h | -06.0 | 0Ch | -18.0 | 14h | -30.0 | 1Ch | -42.0 |
| 05h | -07.5 | 0Dh | -19.5 | 15h | -31.5 | 1Dh | -43.5 |
| 06h | -09.0 | 0Eh | -21.0 | 16h | -33.0 | 1Eh | -45.0 |
| 07h | -10.5 | 0Fh | -22.5 | 17h | -34.5 | 1Fh | -46.5 |

FIG. 2A-1

| 0 TO -94.5dB (6-BIT) ATTENUATION TABLE ||||||||
|---|---|---|---|---|---|---|---|
| VALUE | dB | VALUE | dB | VALUE | dB | VALUE | dB |
| 00h | 00.0 | 10h | -24.0 | 20h | -48.0 | 30h | -72.0 |
| 01h | -01.5 | 11h | -25.5 | 21h | -49.5 | 31h | -73.5 |
| 02h | -03.0 | 12h | -27.0 | 22h | -51.0 | 32h | -75.0 |
| 03h | -04.5 | 13h | -28.5 | 23h | -52.5 | 33h | -76.5 |
| 04h | -06.0 | 14h | -30.0 | 24h | -54.0 | 34h | -78.0 |
| 05h | -07.5 | 15h | -31.5 | 25h | -55.5 | 35h | -79.5 |
| 06h | -09.0 | 16h | -33.0 | 26h | -57.0 | 36h | -81.0 |
| 07h | -10.5 | 17h | -34.5 | 27h | -58.5 | 37h | -82.5 |
| 08h | -12.0 | 18h | -36.0 | 28h | -60.0 | 38h | -84.0 |
| 09h | -13.5 | 19h | -37.5 | 29h | -61.5 | 39h | -85.5 |
| 0Ah | -15.0 | 1Ah | -39.0 | 2Ah | -63.0 | 3Ah | -87.0 |
| 0Bh | -16.5 | 1Bh | -40.5 | 2Bh | -64.5 | 3Bh | -88.5 |
| 0Ch | -18.0 | 1Ch | -42.0 | 2Ch | -66.0 | 3Ch | -90.0 |
| 0Dh | -19.5 | 1Dh | -43.5 | 2Dh | -67.5 | 3Dh | -91.5 |
| 0Eh | -21.0 | 1Eh | -45.0 | 2Eh | -69.0 | 3Eh | -93.0 |
| 0Fh | -22.5 | 1Fh | -46.5 | 2Fh | -70.5 | 3Fh | -94.5 |

FIG. 2A-2

NOISE SHAPER SIGNAL FLOW GRAPH (SFG)

$$I = \frac{Z^{-1}}{1-Z^{-1}}$$

× = POLES
○ = ZEROS

BLOCK DIAGRAM OF HALF-BAND FILTER-DIRECT FORM

STEREO AUDIO CODEC

CROSS REFERENCE TO RELATED APPLICATIONS

The instant application is related to the following patent applications filed on even date herewith, all of which are assigned to the common assignee of the present invention, and all of which are hereby incorporated by referenced thereto and made a part hereof as if fully set forth herein:

Hazard-Free Divider Circuit, application Ser. No. 08/333,410; Monolithic PC Audio Circuit, application Ser. No. 08/333,451; Modular Integrated Circuit Power Control, application Ser. No. 08/333,537; Audio Processing Chip with External Serial Port, application Ser. No. 08/333,387; Wavetable Audio Synthesizer with Delay-Based Effects Processing, application Ser. No. 08/334,462; Wavetable Audio Synthesizer with Low Frequency Oscillators for Tremolo and Vibrato Effects, application. Ser. No. 08/333,564; Wavetable Audio Synthesizer with Multiple Volume Components and Two Modes of Stereo Positioning, application Ser. No. 08/333,389; Wavetable Audio Synthesizer with an Interpolation Technique for Improving Audio Quality, application Ser. No. 08/333,398; Monolithic PC Audio Circuit with Enhanced Digital Wavetable Audio Synthesizer, 08/333,536; Wavetable Audio Synthesizer with Waveform Volume Control for Eliminating Zipper Noise, application Ser. No. 08/333,562; Digital Signal Processor Architecture for Wavetable Audio Synthesizer, application Ser. No. 08/334,461; Wavetable Audio Synthesizer with Enhanced Register Array, application Ser. No. 08/334,463; A Digital Decimation and Compensation Filter System, application Ser. No. 08/333,403; Digital Interpolation Circuit for Digital to Analog Converter Circuit, application Ser. No. 08/333,399; Analog to Digital Converter Circuit, application Ser. No. 08/333,535; Digital Noise Shaper, application Ser. No. 08/333,386; and Digital to Analog Converter, application Ser. No. 08/333,460.

BACKGROUND OF THE INVENTION

1. Field of the Invention

The field of the invention relates to an electronic coder, decoder (CODEC) device for converting analog audio signals to digital and digital audio signals to analog. The field of the invention further relates to a stereo audio CODEC with data format conversion, analog and digital filtering, and analog mixing capabilities.

2. Brief Description of the Related Technology

Audio CODEC devices are known in the art. Many of these devices have 8-bit data ports. Two examples are: the AD1848 SoundPort Stereo CODEC, manufactured by Analog Devices of Norwood, Mass.; and the CS4231 Multimedia Audio CODEC, manufactured by Crystal Semiconductor Corporation of Austin, Tex. These CODEC devices provide 16-bit audio data over an 8-bit parallel interface between the CODEC and an external industry standard architecture (ISA) has or an extended industry standard architecture (EISA) bus. These CODEC devices also provide analog-to-digital (ADC) and digital-to-analog (DAC) conversions of stereo audio signals, and certain mixing functions.

The CS4231 device includes a 16-sample on-chip first-in first-out (FIFO) memory for holding signal samples for the record or playback paths, but does not provide other larger off-chip local memory for storing additional samples. Thus, when either the record or playback FIFO needs to be read from or written to, a direct memory access (DMA) or programmed input/output (I/O) data transfer operation must occur with off-chip system memory. Since each CS4231 FIFO, for record or playback, may hold only 16 samples, a DMA or PIO request for a write to, or read from, the respective FIFO must occur before the respective FIFO is full (during record) or empty (during playback) to prevent data loss and sound discontinuities. No capability exists with the Analog Devices or Crystal CODEC devices to retrieve data from, or send data to, an off-chip local memory to avoid a DMA or PIO cycle on the external system bus during record or playback modes.

Additionally, the CS4321 device and other current art devices do not provide programmable thresholds on its on-chip FIFOs. Additionally, the CS4231 device provides only 16 mA bus drivers. If 24 mA drive current is required, additional off-chip drivers must be installed.

The AD1848 device does not contain an on-chip FIFO or other memory for storing samples along the playback or record path. All playback path data is sent from off-chip external system memory through the device 8-bit parallel port interface to the CODEC device. Likewise, recorded data is sent from the CODEC device through the 8-bit parallel interface to be stored in external system memory. DMA and/or PIO cycles are required by the CODEC during playback or record mode in order to transfer audio data. Additionally, the AD1848 device requires the use of an external 74_245 transceiver to interface with the ISA bus.

Both the CS4321 and AD1848 devices provide only 14 sample rates for record and playback modes, which range between 5.51 and 48.0 Khz. Also, each device can only use the same sample rate for simultaneous record and playback. Record and playback rates are not independently programmable.

Neither the CS4321 nor the AD1848 device contain an external serial audio data port or selectable bus drive capability. Additionally, neither current art CODEC device contains a CD-ROM interface, or serial EPROM interface for Plug-n-Play support. Also, these devices do not provide an analog feedback loop or an analog audio synthesizer input in the mixer section of the CODEC.

NOISE SHAPING METHODS

Several noise shaping techniques used in digital-to-analog (D/A) circuits are known. In the communications technologies, several such techniques have been used in a comparatively simple form, for example, the single and double "error feedback" mechanisms in AMD telephony SLAC/DSLAC devices, ISDN chips and AMD cordless telephony PHoX devices. These devices all include a simple FIR feedback network, which shapes the noise by introducing zeros at DC. By choosing the coefficients of the FIR filter adequately, it is possible to introduce zeros at other frequencies as well. This makes it possible to extend the bandwidth over which the noise is attenuated, providing an advantage over simple error feedback mechanisms. This type of noise shaping technique is described in H. A. Spang, P. M. Schultheiss, "Reduction of Quantizing Noise by Use of Feedback", IRE Trans. Commun. Systems, pp. 373–380, December 1962.

Simple FIR feedback networks suffer from the same problem as FIR filters: high attenuations require large numbers of coefficients. The output noise grows proportionally to the sum of the squares of the coefficients, which complicates post-filtering requirements. The Signal Transfer Function (STF) of an FIR filter can be made exactly equal to 1, however, for reduced signal loss. On the other hand, it is possible to use an IIR feedback circuit, which allows high noise attenuation with relatively few coefficients. The drawback to such an IIR feedback circuit is that phase linearity and flat response for the signal are no longer strictly maintained.

Various designs have attempted to attack the problem of maintaining phase linearity and flat response for the signal. See T. Rietoniemi, T. Karema, H. Tenhunen, "Design of Stable High Order 1-Bit Sigma-Delta Modulators" IEEE Proc. ISCAS '90, pp. 3267–3270, May 1990; K. Chao, S. Nadeem, W. L. Lee, C. Sodini, "A Higher Order Topology for Interpolative Modulators for Oversampling A/D Converters", IEEE Trans. Circuits & Systems, vol. CAS-37, pp. 309–318, March 1990; D. R. Welland, B. P. Del Signore, E. J. Swanson, T. Tanaka, K. Hamashita, S. Hara, K. Takasuka: "A Stereo 16-Bit Delta-Sigma A/D Converter for Digital Audio", Journal of the Audio Engineering Society, vol. 37, pp. 476–486, June 1989; and C. Thompson, K. D'Angelo, L. C. Eoan, A. Early, A. Horak, S. Park: "A Monolithic 50 KHz 16-bit A/D-D/A Converter Using Sigma-Delta Modulation", (Motorola), Proc. ISCAS '90, pp. 906–909, May 1990.

However, these designs do not fully address nor solve the problem of providing a IIR feedback circuit with maintained phase linearity and relatively flat response for a signal.

SUMMARY OF THE INVENTION

There is a growing market demand for a high performance 16-bit CODEC device with a 16-bit parallel data interface to external computer systems, or an external microprocessor, for use in audiophile-quality audio applications, including multimedia, video game and/or musical instrument environments. Additionally, there is a need for high performance 16-bit, high quality CODEC subsystem circuitry, or module, for integration on a single monolithic semiconductor chip with other audio support subsystems, circuitry or modules, which include subsystems, circuitry and modules for audio signal synthesis, data format conversion, digital and analog filtering, off-chip local memory, internal and external bus control, and game and MIDI ports. Single monolithic high-quality audio circuits of this type are needed for installation on sound boards in personal desktop or laptop computers.

The present invention provides significant improvements over CODEC devices of the prior art. This CODEC provides 16-bit audiophile-quality stereo audio signals. The CODEC is fully compatible with existing sound boards and the AD 1848 and the CS 4231 CODECs, for programming purposes.

The CODEC includes a unique and improved combination of large, off-chip DRAM, capable of being configured as large record and play FIFOs, for supplementing the on-chip 16 sample, 32-bit wide audio record and playback FIFOs. The size of the off-chip local memory is determined by setting a memory counter and may range from 8 to 256K samples. In the prior art, DMA or PIO operations over a system bus are necessary to provide data transfers directly to and from external system memory from and to the on-chip FIFOs. No local memory off-chip FIFOs are provided. Additionally, the CODEC of the present invention includes a data transfer mode of operation whereby interrupt requests can be generated to provide a PIO capability for transferring data between external system memory, and on-chip record and/or playback FIFOs, or between external system memory and off-chip local memory.

Each on-chip record and playback FIFO is 32-bits wide—16 bits for left channel data and 16-bits for right channel data. A DMA mode of data transfer operation is also included for DMA transfers between the on-chip FIFOs and external system memory and/or between off-chip local memory FIFOs and the external system memory. The CODEC includes a capability for non-DMA data transfers from applications such as PCMCIA architecture, by allowing PIO data transfers rather than DMA.

For PCMCIA and other non-DMA applications, use of these large off-chip FIFO's facilitates more efficient PIO operations, since data can be transferred from or to external system memory to or from the off-chip FIFOs as a block in one PIO operation. The large off-chip FIFOs can then allow data to trickle down to or up from the on-chip CODEC playback and record FIFOs, respectively, without further external system interaction.

An interleaved DMA data mode is included to transfer audio data between external system memory and off-chip local memory. The data transfer operations in this mode includes interleaving the data, that is, changing the order of the data from that stored in external system memory to that stored in off-chip local memory, and vice versa. External system memory typically stores audio data samples sequentially in memory as $L_1$, $R_1$, $L_2$, $R_2$, etc. In this mode, a DMA cycle would, during a write operation to off-chip local memory playback FIFO, retrieve system memory audio data and transfer it to local memory FIFO, whereby an on-chip local memory control would reconfigure the data so the data is stored in off-chip local memory with all left channel and right channel audio data samples stored together and sequentially (i.e., $L_1$, $L_2$, $L_3$, etc. in a memory block and $R_1$, $R_2$, $R_3$, etc. stored in another block). This DMA interleaved mode data storage scheme would be reversed during a DMA read cycle from off-chip local record FIFO memory, back through the on-chip local memory control circuitry, and on to external system memory.

Additionally, the present invention provides enhanced mixing functions over the prior art. An analog feedback path with programmable attenuation/gain control, and the output from a synthesizer DAC, are included as additional mixer inputs. The analog feedback path includes the capability to dub over a pre-recorded audio signal as the signal is being played back. Additionally, the input from the synthesizer DAC is capable of being mixed with various other analog audio inputs, giving the CODEC mixer of the present invention greater flexibility for producing a greater variety of audio sounds.

The present CODEC includes a serial transfer control block which provides the ability to loop a recorded audio signal from the output of the record path ADC to the input of the playback path DAC. Likewise, an audio signal from the playback path DAC can be looped back to the record path ADC. This allows greater system flexibility, and a system test path for the playback and record paths.

The CODEC is compatible with existing systems and includes a mode whereby one of 14 different record and playback sample rates, from 5.5 to 48 Khz, is provided. Additionally, the CODEC includes a playback mode with continuously variable selectable sample rates over 256 steps in one of two ranges: from 3.5 KHz to 22.05 KHz, and from 5.0 KHz to 32.00 KHz.

The CODEC also includes a 16-bit parallel data port for access to ISA or EISA buses. This is a distinct advantage over the prior art which use 8-bit parallel data ports. A serial port is included in the CODEC to allow expandability and flexibility so that the serial port may provide a serial data path to or from an external digital signal processor (DSP) engine, a synthesizer, or other serial device or interface.

Circuitry is included to detect whether the CODEC is operating at 3.3 or 5 volts. Additionally, the CODEC includes circuitry to reduce digitally induced noise to minimize interference between inherently noisy digital operations and noise susceptible analog operations performed by the CODEC.

CODEC PLAYBACK PATH DAC

The CODEC DAC digital playback path is able to preserve a signal-to-distortion (STD) in excess of 90 dB m the frequency band from 0 to 0.45 $f_s$, where $f_s$ is the input sampling rate of the digital data. This sampling rate is variable. The CODEC DAC playback path functions are tied to the fact that although the digital sampling rate is variable, the bandwidth of the analog circuitry is fixed at a value compatible with the highest sampling rate. Stop band rejection in the CODEC playback path DAC circuitry is included for signals greater than 0.6 $F_s$ up to 22 KHz. The stop band rejection circuitry includes improved filtering capability.

When the CODEC DAC operates at its lowest sampling rate, quantization noise, or spectral images, that would be considered out of band energy would be passed through to the output as audible noise. To avoid this, out of band energy components are sufficiently filtered before appearing at the output. To achieve this high STD performance during playback mode, the digital signal is oversampled (interpolated) and then quantized to one bit. A relatively large quantization noise is inherent in such an operation. The noise is then filtered, or shaped, to move it to higher frequencies and away from the signal band. The one bit signal is then converted to an analog audio signal by a semi-digital FIR filter and filtered in the analog domain to remove undesired high frequency noise.

The noise shaper circuit included in the playback path DAC includes a fifth order network. The fifth order network is selected to maximize the noise rejection bandwidth while maintaining a good rejection level, so as to allow the semi-digital filter connected to the output of the noise shaper to have a more gradual roll-off, so less compensation from an interpolation filter prior to the noise shaper is required. Noise shapers typically have a certain number of integrators, with feedback coefficients to realize zeros and feed forward coefficients to realize poles.

In previous systems, feed forward coefficients were used to multiply integrator outputs, sum them, then quantize the result to one bit before providing feedback to a single input adder. Since these coefficients acted on multi-bit signals, multiplication was required in some form or another. Typically, the coefficients were approximated by adds and shifts, resulting in appreciable circuit complexity, especially in higher order loops, and did not allow for programmability.

The topology for the present 1-bit noise shaper quantizes the last integrator output signal first to one bit, then "multiplies" it by the appropriate coefficients, and feeds it back to multiple integrator inputs. This eliminates the complexity of multiplication, and provides for programmability if desired. The 1-bit topology is known in relation to analog Σ-Δ modulation but not in relation to digital signal shaping included in the present invention.

The noise shaper circuit includes a quantizer to truncate the signal to the desired length (1-bit, here), truncation error feedback, which can be multiple feedback, and oversampling. Oversampling provides a wide frequency band of which the desired signal covers only a small portion, and is carried out by one or more interpolation stages. Use of feedback shapes the quantization noise in such a way that it concentrates at higher frequencies outside the audio signal band.

In the noise shaper, two transfer functions are defined. One is the signal Transfer Function (STF), relating the 1-bit output signal to the multi-bit digital audio input signal, and the other is the noise Transfer Function (NTF) relating the 1-bit output signal to the quantization noise. The STF is ideally equal to one so the input signal passes through to the output, unchanged, and the NTF is determined to reduce the noise as much as possible in the signal band. There are tradeoffs, however. The total output noise power is always larger than the original truncation noise, and in most cases must be filtered in a later stage.

In the present system, the stopband width is as large as possible, and the first zero of the semi-digital FIR filter is determined at as high a frequency as possible outside the signal band to reduce signal rolloff in the passband. The stopband width selected is large because at the lowest sampling rate at which the system operates, the out of band energy from the noise shaper is significant up to 20 KHz, which is the bandwidth the audio output stages require for operation at the maximum sampling rate. This noise must then be filtered.

In order to maintain phase linearity for the signal path, the semi-digital FIR filter, with coefficients implemented as current sources, is employed in the DAC after the interpolation circuitry and the 1-bit noise shaper circuitry. The current sources are weighted according to a desired frequency response and are controlled by a 1-bit signal (on or off) from a shift register. The current sources are then summed to produce an analog equivalent at the summer output.

The output of the semi-digital FIR filter cannot be made flat in the passband if the number of coefficients is to be minimized. Its first zero, therefore, should ideally be selected to coincide with the frequency at which frequency the noise of the noise shaper begins to rise. The closer the zero is to a DC value, the greater the roll-off introduced by the filter. For this reason, the noise shaper's noise rejection band is made as wide as possible to allow the semi-digital filter to roll-off slowly. The farther the first zero is from the signal band, the lower the in-band roll-off, and the lower the number of filter coefficients required. For implementation reasons, the semi-digital filter preferably has neither a very large number of coefficients nor a large coefficient spread. This means that response of the filter inside the signal band is not flat, and has significant roll-off, which must be compensated in the first digital interpolator stage in the CODEC DAC playback path. The noise shaper's stopband edge is located at about 6 KHz and the first SDF zero located at about 10 KHz, when $f_s$=8 KHz.

BRIEF DESCRIPTION OF THE DRAWINGS

FIGS. 2a-1 and 2a-2 is a table of gain and attenuation values;

DETAILED DESCRIPTION OF THE PREFERRED EMBODIMENT

Figure 1:
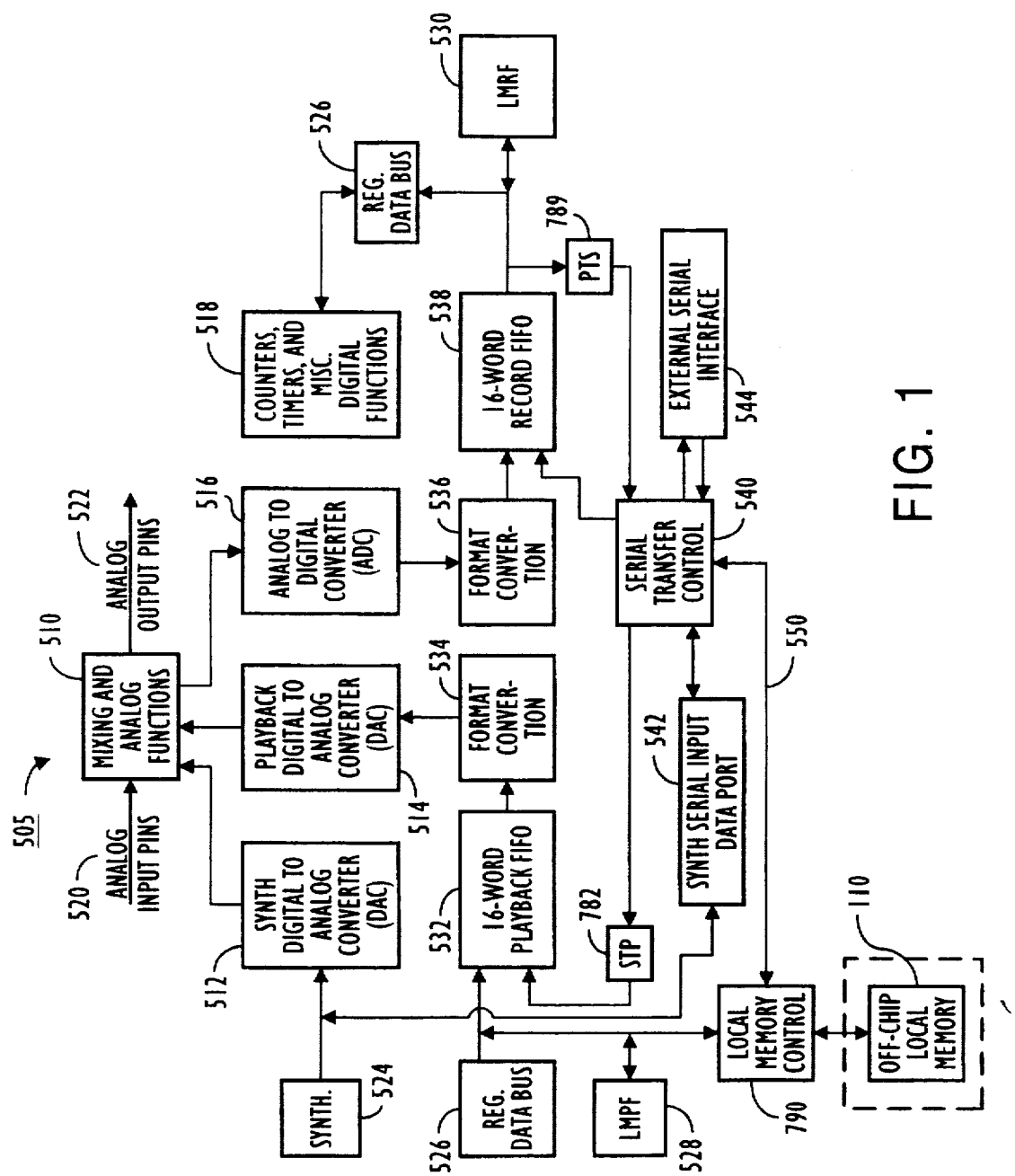
FIG. 1 is a block diagram of the various functional blocks of the present invention.

FIG. 1 depicts, in block diagram format, the various features and functions included within the CODEC module device 505. The CODEC device 505 includes on-chip memory, which is preferably configured as 16-sample, 32-bit wide, record and playback FIFOs, 538, 532, with selectable thresholds capable of generating DMA and I/O interrupts for data read and write operations. The Mixing and Analog Functions block 510 includes left and right channel analog mixing, muxing and loopback functions. Left channel and right channel stereo, and single channel mono, analog audio signals are summed in Mixing and Analog Functions block 5 10. These mono and stereo audio signals are output from the CODEC 505 for external use, on analog output pins 522. Inputs to the Mixing and Analog Functions block 510 are provided from: external Analog Input Pins 520, analog output from a Synthesizer Digital-to-Analog Converter block 512, which is external to CODEC 505 or may be a processing block within CODEC 505, and from the Playback Digital-to-Analog Converter block 514. Analog audio output from Mixing Analog Functions block 510 is provided to record Analog-to-Digital Converter 516 block. Synthesizer Digital-to-Analog Converter block 512 receives Digital data from a synthesizer 524. Throughout this description, it should be understood that synthesizer 524 is an external device, or may be integrated onto the same monolithic integrated circuit as the CODEC device 505.

The record path for the CODEC 505 is illustrated in FIG. 1, with analog audio data being output from Mixing and Analog Functions block 510 and provided to record Analog-to-Digital Converter (ADC) 516 block to be converted to 16-bit signed data. The selected sample rate for record ADC 516 affects the sound quality such that the higher the sample rate for record ADC 516, the better the recorded digital audio signal approaches the original audio signal in quality. The function and operation of a fourth order cascaded delta-sigma modulator, preferably implemented in record ADC 516 block, is described in application Ser. No. 08/071,091, filed Dec. 21, 1993, entitled "Fourth Order Cascaded Sigma-Delta Modulator," assigned to the common assignee of the present invention. The converted digital audio data is then sent to format conversion block 536 which converts the 16-bit digital audio data to a preselected data format. The formatted digital data is then sent to 32-bit wide record FIFO 538 as 16-bit left and 16-bit right channel data for further submission to register data bus 526 for output to external system memory (not shown) or to off-chip local memory record FIFO 530 (LMRF).

The playback path for CODEC 505 includes digital data, in a preselected data format, being sent to 32-bit wide playback FIFO 532 from the off-chip local memory playback FIFO (LMPF) 528 or from external system memory (not shown), via the register data bus 526. It should be understood throughout this application that LMRF 530 and LMPF 528 may be discreet off-chip FIFOs, or may be dedicated address space within off-chip local memory 110 configured as FIFOs. The formatted data is then input to format conversion clock 534, where it is converted to 16-bit signed data. The data is then sent to the CODEC playback DAC 514, where it is converted to an analog audio signal and output to the input of Mixing and Analog functions block 510.

A Serial Transfer Control block 540 provides serial-to-parallel and parallel-to-serial conversion functions, and loop back capability between the output of 32-bit wide record FIFO 538 and the input of 32-bit wide playback FIFO 532. Also, synthesizer serial input data port 542 (FIG. 1), which receives serial data from synthesizer 524, communicates with serial Transfer Control block 540. Serial Transfer Control block 540 is connected to record FIFO 538, playback FIFO 532, off-chip local memory 110 (or, LMRF 530 and LMPF 528) via local memory control 790, synth serial input data port 542, and to External Serial Interface. Bi-directional serial data communication over External Serial Interface 544, which includes an external serial port, is provided to Serial Transfer Control block 540 (also see FIG. 6). External serial interface 544 may be a UART, or other device that provides either synchronous or asynchronous controlled serial data transfers. External Serial Interface 544 (FIG. 1) can be connected to communicate serially with an external digital signal processor (DSP) for off-chip generation of special audio effects, or with any other device capable of bi-directional serial data communication. External serial interface 544 can also connect to and provide a serial data path from external synthesizer serial input port 542. Bi-directional data transfer is also accomplished via data path 550 between serial transfer control 540 and local memory control 790.

Figure 6:
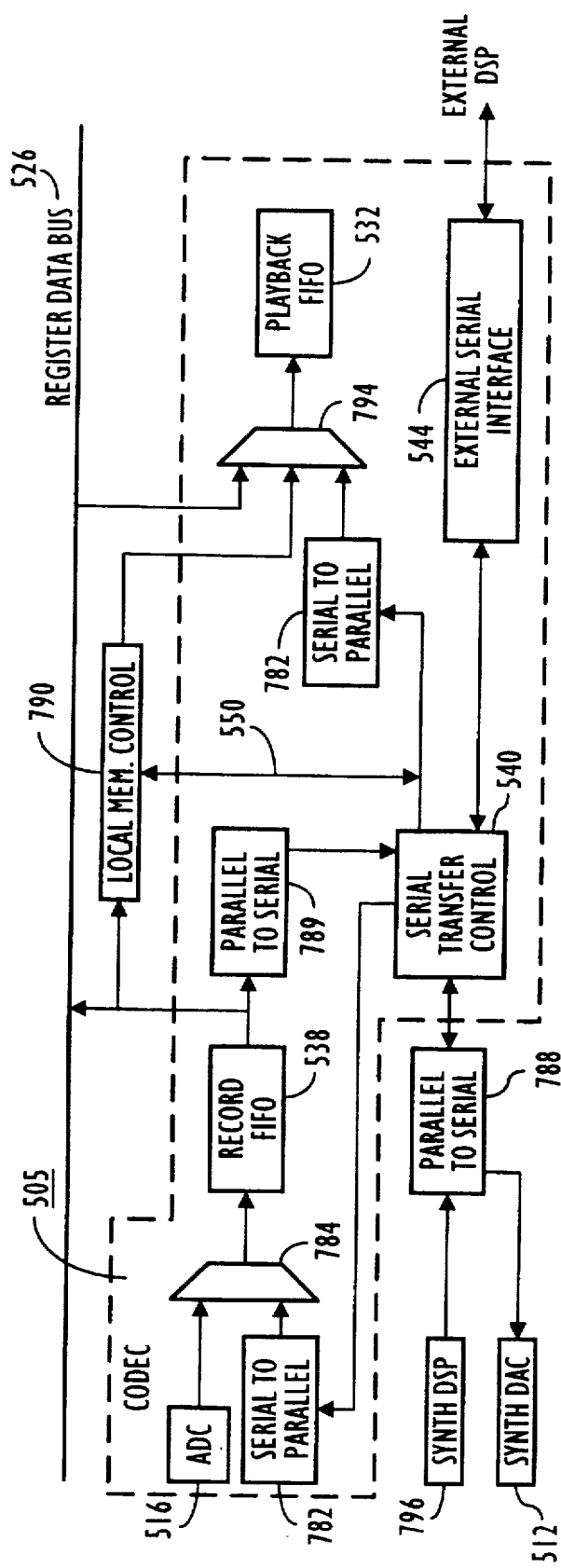
FIG. 6 is a block diagram of serial transfer functions of the present invention.
Figure 6A:
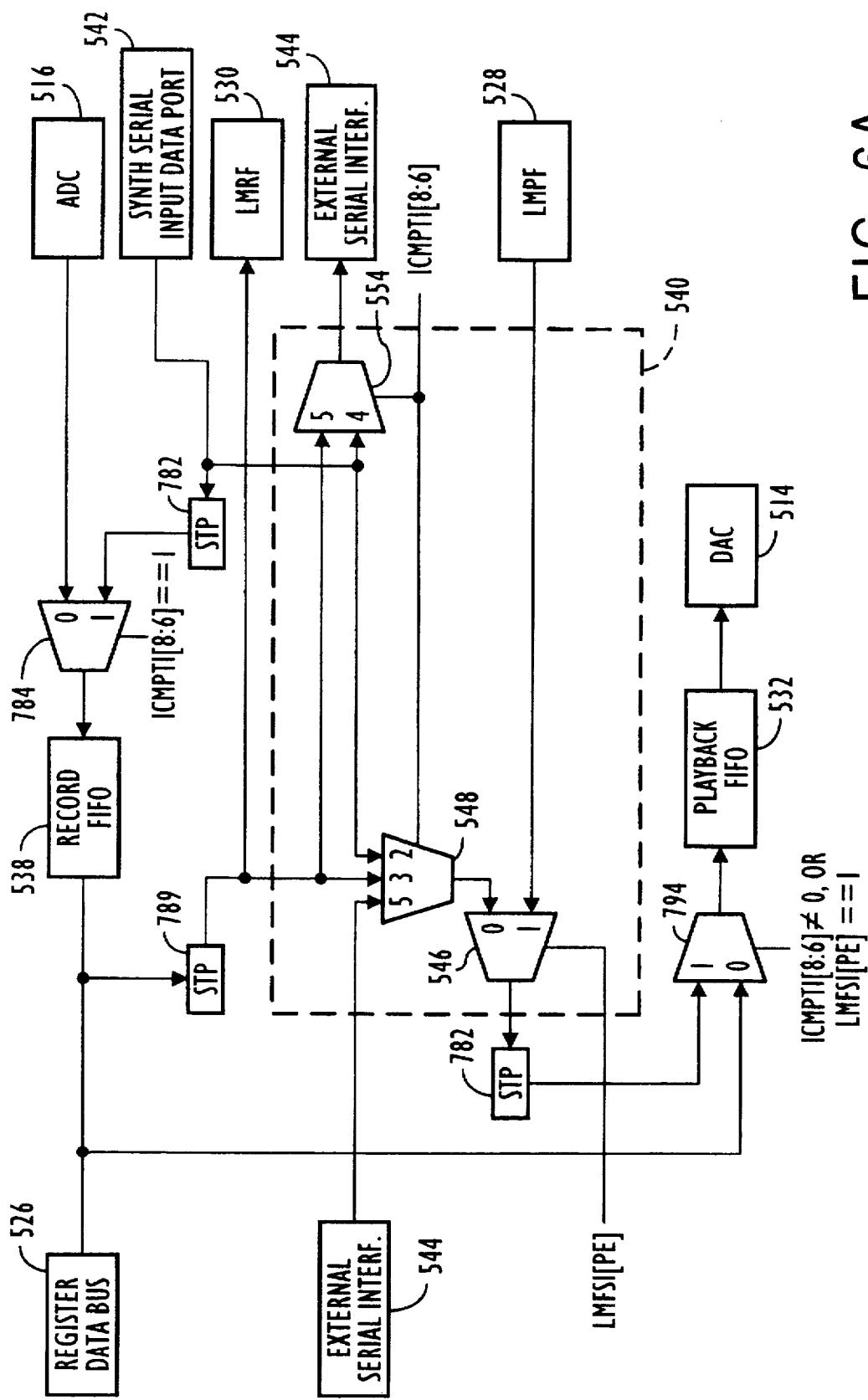
FIG. 6a is a block diagram of the serial transfer control block.

The various loop back and data conversion functions associated with Serial Transfer Control block 540 are shown in more detail in FIGS. 6 and 6a.

The CODEC 505 includes A/D conversion functions in the record path and D/A conversion functions in the playback path. These conversion functions are capable of operating independently of each other at different sample rates so A/D and D/A operations may be performed simultaneously, each having a different sample rate and data format. Loop access circuitry (in mixing block 606) provides a capability to sample an audio signal and perform an A/D operation at one rate, digitize the signal, and then playback the digitized sample back through the playback D/A at a different sample rate.

The block designated Counters, Timers and Miscellaneous digital functions 518 includes circuitry which controls: the A/D and D/A conversions in CODEC 505, format conversion blocks 532, 536, and data transfer functions. CODEC 505 operation allows the following data formats: 8-bit unsigned linear; 8-bit µ-law; 8-bit A-law; 16-bit signed little endian; 16-bit signed big endian; or 4-bit 4:1 IMA ADPCM format.

Figure 2:
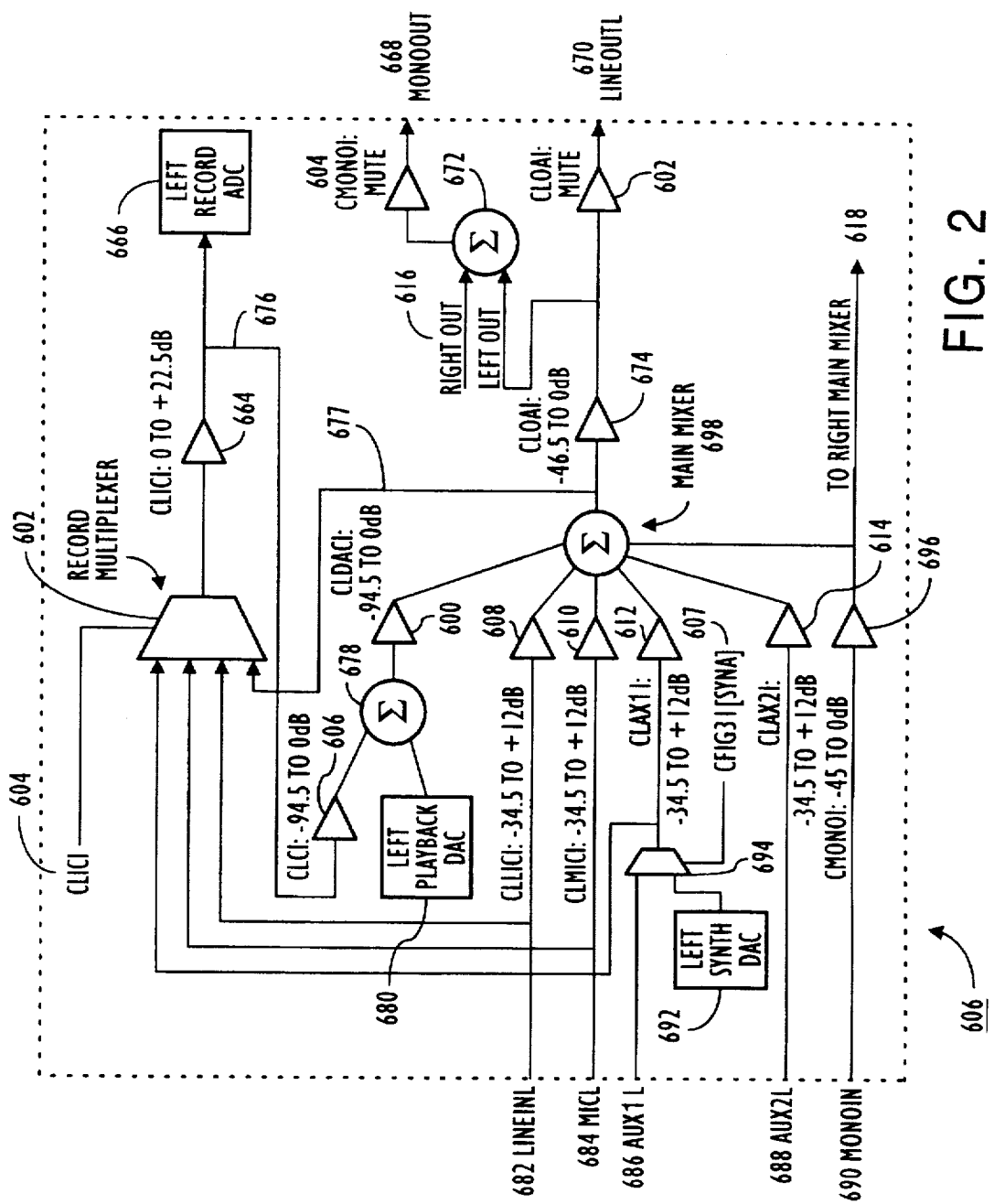
FIG. 2 is a schematic of the preferred embodiment of the left channel stereo mixer of the present invention.

Referring to FIG. 2, the left channel of CODEC analog mixer 606 of Mixing and Analog functions block 510 is depicted. The layout of the right channel of mixer 606 is identical to the left channel, but is not shown in FIG. 2. Except for minor signal name modifications, all descriptions of left channel signals and functions are applicable to the right channel.

The CODEC analog mixer 606 has more programmable features and more functions than prior CODEC audio devices. Each of the five input lines to the analog mixer 606 in FIG. 2 (LINEINL 682, MICL 684, AUXIL 686, AUX2 688 and MONOIN 690) includes a programmable attenuation/gain control circuit 608, 610, 612, 614 and 696, respectively. All inputs and outputs to and from analog mixer 606, are stereo signals, except for input MONOIN 690 and output MONOOUT 668, which are mono signals. The choice of mono or stereo audio signal inputs or outputs is also selectable.

Each of the triangle blocks depicted in FIG. 2 represents a programmable attenuation/gain control circuit. The registers that control the respective attenuation/gain control circuits and the attenuation/gain range for that circuit are identified in FIG. 2 next to the respective triangle block, and are located in the Registers block 566 in FIG. 7. The description and address of each of these registers is described below. Individual bits in these registers are capable of being modified as described in application Ser. No. 08/171,313, entitled Method and Apparatus for Modifying the Contents of a Register via a Command Bit, which describes a single-bit manipulation technique that obviates the need to address an entire register, and is assigned to the common assignee of the present invention and incorporated herein for all purposes.

The range of attenuation values for these registers are shown in FIGS. 2a-1 and 2a-2. The value stored in each attenuation/gain control register is used to provide the selected gain or attenuation value to CODEC control logic in the Counters, Timers and Misc. Digital Functions block 518, and Gain/attenuation Block 734 (FIG. 4) explained below. The amplitude of the analog audio signal input to the respective attenuation/gain circuit is controlled by the value stored in the respective attenuation/gain control register.

The overview of the registers used in CODEC 505 Registers block 566, including their preferred functions, are as follows:

The CODEC 505 is designed to be generally register-compatible with the CS4231 (Modes 1 and 2), with the AD1848 and other prior art. An indirect addressing mechanism is used for accessing most of the CODEC registers. In Mode 1 (discussed below), there are 16 indirect registers; in Mode 2 (discussed below), there are 28 indirect registers; and in Mode 3 (discussed below), there are 32 indirect registers.

In the following register definitions, RES or RESERVED specifies reserved bits. All such fields must be written with zeros; reads return indeterminate values; a read-modify-write operation can write back the value read.

CODEC DIRECT REGISTERS

CODEC INDEX ADDRESS REGISTER (CIDXR)

Address: PCODAR+0 read, write

Default: 0100 0000

Modes: bits[7:5,3:0] modes 1, 2, and 3; bit[4] modes 2 and 3

| 7 | 6 | 5 | 4 | 3 | 2 | 1 | 0 |
|---|---|---|---|---|---|---|---|
| INIT | MCE | DTD | | IA[4:0] | | | |

INIT Initialization. This read-only bit will be read as high if the CODEC is in an initialization phase and unable to respond to I/O activity. This bit is set only by software resets and cleared once the 16 MHz oscillator is stable and the CODEC 505 has initialized.
MCE Mode Change Enable. This bit protects the CPDFI, CRDFI, and CFIG1I from being written (except CFIG1I[1:0]; these can be changed at any time). When high, the protected registers can be modified; also, the DAC outputs (CLDACI and CRDACI) are forced to mute. When low, the protected registers cannot be modified.
DTD DMA Transfer Disable. This bit high causes DMA transfers to be suspended when either of the sample counter interrupts of CSR3R becomes active. Mode 1: DUA is suspended (whether it be playback or record) and the sample counter stops after the sample counter causes an interrupt; also, the active FIFO is disabled from transferring more data to CODEC 505. DMA transfers, FIFO transfers and the sample counter resume when GINT is cleared or DTD is cleared. Modes 2 and 3: Record DMA, the re cord sample counter stop when the record sample counter causes an interrupt; playback DMA, the playback FIFO and the playback sample counter stop when the playback sample counter causes an interrupt. The pertinent DAM transfers and sample counter resume when the appropriate interrupt bit in CSR3I is cleared or DTD is cleared. In mode 3, this bit also works to discontinue the transfer of data between the CODEC FIFOs and the LMRF and the LMPF.
IA[4:0] Indirect Address Pointer. These bits are used to point to registers in the indirect address space. In mode 1, a 16-register space is defined; IA[4] is reserved. In modes 2 and 3, a 32-register space is defined.

CODEC INDEXED DATA PORT (CDATAP)

Address: PCODAR+1 read, write

Modes: 1, 2, and 3

This is the access port through which all CODEC indexed registers—pointed to by the CODEC Indexed Address Register (CIDXR[4:0])—are written or read.

CODEC STATUS 1 REGISTER (CSR1R)

Address: PCODAR+2 read, (also, a write to this address clears GINT)

Default: 11001110

Modes: 1, 2, and 3

This register reports the interrupt status and various playback and record FIFO conditions. Reading this register also clears CSR2I[7:6] and CSR3I[3:0], if any are set. Writing to this register will clear all CODEC interrupts.

| 7 | 6 | 5 | 4 | 3 | 2 | 1 | 0 |
|---|---|---|---|---|---|---|---|
| RULB | RLR | RDA | SE | PULB | PLR | PBA | GINT |

RULB Record Channel Upper/Lower Byte Indication. When high, this bit indicates that a read of the record FIFO will return the upper byte of a 16-bit sample (bits[15:8]) or that the record data is 8-or-less bits wide. When low, this bit indicates that a read of the record FIFO will return the lower byte of a 16-bit sample (bits[7:0]). After the last byte of the last received sample has been read from the record FIFO, this bit does not change from its state during that byte until the next sample is received.
RLR Record Channel Left/Right Sample Indication. When high, this bit indicates that a read of the record FIFO will return the left sample or that the record path is in either mono or ADPCM mode (or both). When low, a read will return the right sample. After the last byte of the last received sample has been read from the record FIFO, this bit does not change from is state during that byte until the next sample is received.
RDA Record Channel Data Available. When high, there is valid data to be read from the record FIFO. When low, the FIFO is empty.
SE Sample Error. This bit is high whenever data has been lost because of either a record FIFO overrun or a playback FIFO underrun (it is a logical OR of CSR2I[7:6]). If both record and playback channels are enabled, the specific channel that set this bit can be determined by reading CSR2I or CSR3I.
PULB Playback Channel Upper/Lower Byte Indication. When high, this bit indicates that the next write to the playback FIFO should be the upper byte of a 16-bit sample (bits[15:8]) or that playback data is 8-or-less bits wide. When low, this bit indicates that next write to the playback FIFO should be the lower byte (bits[7:0]) of a 16-bit sample. After the playback FIFO becomes full, this stays in the state of the last byte written until a space becomes available in the FIFO.
PLR Playback Channel Left/Right Sample Indication. When high, this bit indicates that the next write to the playback FIFO should be the left sample or that the playback path is in either mono or ADPCM mode. When low, the right sample is expected. After the playback FIFO becomes full, this stays in the state of the last byte written until a space becomes available in the FIFO.
PBA Playback Channel Buffer Available. When high, there is room in the playback FIFO for additional data. When low, the FIFO is full.
GINT Global Interrupt Status. This bit is high whenever there is an active condition that can request an interrupt. It is implemented by ORing together all the sources of interrupts in the CODEC: CSR3I[6:4].

PLAYBACK and RECORD DATA REGISTERS (CPDR, CRDR)

Address: PCODAR+3 read (record FIFO), write (playback FIFO)

Modes: 1, 2, and 3

Data written to this address is loaded into the playback FIFO. Data read from this address is removed from the record FIFO. Bits in Status Register 1 indicate whether the data is the left or right channel, and, for 16-bit samples, the upper or lower portion of the sample. Writes to this address when either the playback FIFO is in DMA mode or the playback path is not enabled (CFIG1I) are ignored; reads from this address when either the record FIFO is in DMA mode or the record path is not enabled (CFIG1I) are ignored.

CODEC CIDXR, CDATAP INDEXED REGISTERS

LEFT, RIGHT A/D INPUT CONTROL (CLICI, CRICI)

Address: PCODAR+1 read, write; left index CIDXR[4:0]=0, right index CIDXR[4:0]=1

Default: 000X 0000 (for both)

Modes: 1, 2, and 3

This pair of registers is used to select the input source to the A/D converters, and to specify the amount of gain to be applied to each signal path. The registers are identical, one controls the left channel and the other controls the right channel.

| 7 | 6 | 5 | 4 | 3 | 2 | 1 | 0 |
|---|---|---|---|---|---|---|---|
| LSS[1:0], RSS[1:0] | | RWB | RES | LADIG[3:0], RADIG[3:0] | | | |

LSS[1:0]  Left, Right ADC Source Select. These bits select which input source will
RSS[1:0]  be fed to the analog to digital codverter.

| BIT 10 | SOURCE |
|---|---|
| 00 | Line |
| 01 | Aux 1 |
| 10 | Stereo Microphone |
| 11 | Mixer Output |

RWB  Read/Write Bit. This bit does not control anything. Whatever is written to it will be read back.
LADIG[3:0]  Left, Right A/D Input Gain Select. The selected input source is fed to the
RADIG[3:0]  A/D converter via a gain stage. These four bits specify the amount of gain applied to the signal. The values vary from 0 h = 0 dB to 0 Fh = +22.5 dB with 1.5 dB per step (see FIGS. 2a-1 and 2a-2).

LEFT, RIGHT AUX 1/SYNTH INPUT CONTROL (CLAX1I, CRAX1I)

Address: PCODAR+1 read, write; left index CIDXR[4:0] =2, right index CIDXR[4:0]=3

Default: 1XX0 1000 (for both)

Modes: 1, 2, and 3

This register pair controls the left and right AUX1 or Synth (multiplexed by CFIG3I) inputs to the mixer. The registers are identical, one controls the left channel and the other controls the right channel.

| 7 | 6 | 5 | 4 | 3 | 2 | 1 | 0 |
|---|---|---|---|---|---|---|---|
| LA1ME, RA1ME | RES | RES | LA1G[4:0], RA1G[4:0] | | | | |

LA1ME, Left, Right AUX1/Synth Mute Enable. When high, the selected input is
RA1ME muted. When low, the input operates normally.
LA1G[4:0], Left, Right AUX1/Synth Gain Select. This specifies the amount of gain.
RA1G[4:0] applied to the selected-AUX1 or synth-input signal. The values vary from 00 h = +12 dB to 1 Fh = −34.5 dB with 1.5 dB per step (see FIGS. 2a-1 and 2a-2).

LEFT, RIGHT AUXILIARY 2 INPUT CONTROL (CLAX2I, CRAX2I)

Address: PCODAR+1 read, write; left index CIDXR[4:0] =4, right index CIDXR[4:0]=5

Default: 1XX0 1000 (for both)

Modes: 1, 2, and 3

This register pair controls the left and right AUX2 inputs to the mixer. The registers are identical, one controls the left channel and the other controls the right channel.

| 7 | 6 | 5 | 4 | 3 | 2 | 1 | 0 |
|---|---|---|---|---|---|---|---|
| LA2ME, RA2ME | RES | RES | LA2G[4:0], RA2G[4:0] | | | | |

LA2ME, Left, Right AUX2 Mute Enable. When high, the AUX2 input is muted.
RA2ME When low, the input operates normally.
LA2G[4:0], Left, Right AUX2 Gain Select. This specifies the amount of gain applied.
RA2G[4:0] to the AUX2 input signal. The values vary from 00 h = +12 dB to 1 Fh = −34.5 dB with 1.5 dB per step (see FIG. 2a-1 and 2a-2).

LEFT, RIGHT PLAYBACK DAC CONTROL (CLDACI, CRDACI)

Address: PCODAR+1 read, write; left index CIDXR[4:0] =6, right index CIDXR[4:0]=7

Default: 1X00 0000 (for both)

Modes: 1, 2, and 3

This register pair controls the left and right DAC analog outputs as they are input to the mixer. The registers are identical, one controls the left channel and the other controls the right channel.

| 7 | 6 | 5 | 4 | 3 | 2 | 1 | 0 |
|---|---|---|---|---|---|---|---|
| LDME, RDME | RES | LA[5:0], RA[5:0] | | | | | |

LDME, Left, Right Mute Enable. When high, the DAC input to the mixer is
RDME muted. When low, the input operates normally.
LA[5:0], Left, Right D/A Attenuation Select. This specifies the amount of
RA[5:0] attenuation applied to the DAC input signal. The values vary from 00 h = 0 dB to 3 Fh = −94.5 dB with 1.5 dB per step (see FIGS. 2a-1 and 2a-2).

PLAYBACK DATA FORMAT REGISTER (CPDFI)

Address: PCODAR+1 read, write; index CIDXR[4:0]=8

Default: 0000 0000

Modes: The definition of this register varies based on the mode

This register specifies the sample rate (selects which of the two oscillator is to be used and the divide factor for that oscillator), stereo or mono operation, linear or companded data, and 8 or 16 bit data. It can only be changed when the mode change enable bit (CIDXR[6]) is active.

In mode 1, this register controls both the playback and record paths.

In mode 2, bits[3:0] of this register controls both the record and playback sample rate (i.e., they must be the same) and bits[7:4] specify the state of the playback-path data format.

In mode 3, this register controls only the playback path; the record sample rate is controlled by CRDFI.

| 7 | 6 | 5 | 4 | 3 | 2 | 1 | 0 |
|---|---|---|---|---|---|---|---|
| PDF[2:0] | | | PSM | PCD[2:0] | | | PCS |

PDF[2:0]  Playback Data Format Selection. These three bits specify the play-back data format for the CODEC.
*Modes 2 and 3 only. In Mode 1, PDF[2] is treated as a low regardless of the value written by the user.

| BIT | | | |
|---|---|---|---|
| 2 | 1 | 0 | Format |

-continued

| | | | |
|---|---|---|---|
| 0 | 0 | 0 | 8-bit unsigned |
| 0 | 0 | 1 | µ-Law |
| 0 | 1 | 0 | 16-bit signed, little endian |
| 0 | 1 | 1 | A-Law |
| 1 | 0 | 0 | Reserved, default to 8-bit unsigned* |
| 1 | 0 | 1 | IMA-compliant ADPCM* |
| 1 | 1 | 0 | 16-Bit signed, big endian* |
| 1 | 1 | 1 | Reserved, default to 8-bit unsigned* |

| | |
|---|---|
| PSM | Playback Stereo/Mono Select. When high, stereo operation is selected; samples will alternate left then right. When low, mono mode is selected; playback samples are fed to both left and right FIFOs. Record samples (in mode 1) come only from the left ADC. |
| PCD[2:0] | Playback Clock Divider Select. These three bits specify the playback clock rate in mode 3, and the record and playback rate in modes 1 and 2. *These divide-downs are provided, to function when XTAL1 is less than 18.5 MHz. |

| Bits | | | Sampling Rate (kilohertz) | |
|---|---|---|---|---|
| 3 | 2 | 1 | 24.5 MHz XTAL | 16.9 MHz XTAL |
| 0 | 0 | 0 | 8.0 | 5.51 |
| 0 | 0 | 1 | 16.0 | 11.025 |
| 0 | 1 | 0 | 27.42 | 18.9 |
| 0 | 1 | 1 | 32.0 | 22.05 |
| 1 | 0 | 0 | +448* | 37.8 |
| 1 | 0 | 1 | +384* | 44.1 |
| 1 | 1 | 0 | 48.0 | 33.075 |
| 1 | 1 | 1 | 9.6 | 6.62 |

| | |
|---|---|
| PCS | Playback Crystal Select. When high, the 16.9344 MHz crystal oscillator (XTAL2) is used for the playback sample frequency. When low, the 24.576 MHz crystal oscillator (XTAL1) is used. |

CONFIGURATION REGISTER 1 (CFIG1I)

Address: PCODAR+1 read, write; index CIDXR[4:0]=9

Default: 00XX 1000

Modes: 1, 2, and 3

This register specifies whether I/O cycles or DMA are used to service the CODEC FIFOs, one or two channel DMA operation, and enables/disables the record and playback paths. Bits[7:2] are protected; to write to protected bits, CIDXR[MCE] must be set.

| 7 | 6 | 5 | 4 | 3 | 2 | 1 | 0 |
|---|---|---|---|---|---|---|---|
| RFIOS | PFIOS | RES | RES | CALEM | DS½ | RE | PE |

RFIOS Record FIFO I/O Select. When high, the record FIFO can only be serviced via I/O cycles. When low, DNM operation is supported.
PFIOS Playback FIFO I/O Select. When high, the playback FIFO can only be serviced via I/O cycles. When low, DMA operation is supported.
CALEM Calibration Emulation. This is a readable-writable bit. When high, it affects CSR2I[5].
DS½ 1 or 2 Channel DMA Operation Select. When high, single channel DMA operation is selected; only record or playback operation is allowed, not both; when both record and playback DMA are enabled in this mode, only the playback transfers will be serviced. When low, two-channel DMA operation is allowed.
RE Record Enable. When high, the record CODEC path is enabled. When low, the record path is turned off and the record data available status bit (Status Register 1) is held inactive (low).
PE Playback Enable. When high, the playback CODEC path is enabled. When low, the playback path is turned off and the playback buffer available status bit (Status Register 1) is held inactive (low).

EXTERNAL CONTROL REGISTER (CEXTI)

Address: PCODAR+1 read, write; index CIDXR[4:0]= Ah

Default: 00XX 0X0X

Modes: 1, 2, and 3

This register contains the global interrupt enable control as well as control bits for the two general purpose external output pins.

| 7 | 6 | 5 | 4 | 3 | 2 | 1 | 0 |
|---|---|---|---|---|---|---|---|
| GPOUT[1:0] | | RES | RES | RWB | RES | GIE | RES |

GPOUT[1:0] General Purpose Output Flags. The state of these bits are reflected on the GPOUT[1:0] pins.
RWB Read Write Bit. This bit is writable and readable; it does not control anything within the Device.
GIE Global Interrupt Enable. When high, CODEC interrupts are enabled. When low, CODEC interrupts will not be passed on to the selected IRQ pin. The status bits are not affected by the state of this bit.

STATUS REGISTER 2 (CSR2I)

Address: PCODAR+1 read; index CIDXR[4:0]=Bh

Default: 0000 0000

Modes: 1, 2, and 3

This register reports certain FIFO errors, the state of the record and playback data request bits, and allows testing the A/D paths for clipping.

| 7 | 6 | 5 | 4 | 3 | 2 | 1 | 0 |
|---|---|---|---|---|---|---|---|
| RFO | PFU | CACT | DRPS | RADO[1:0] | | LADOE[1:0] | |

| | |
|---|---|
| RFO | Record FIFO Overrun. This bit is set high whenever the record FIFO is full and the CODEC needs to load another sample (the sample is discarded). This bit is cleared to low by either a read of CSRLR or when CIDXR[MCE] goes from 1 to 0. |
| PFU | Playback FIFO Underrun. This bit is set high whenever the playback FIFO is empty and the CODEC needs another sample. This bit is cleared to low by either a read of CSR1R or when CIDXR[MCE] goes from 1 to 0. (In mode 1, the previous sample is reused. In modes 2 and 3, either the previous sample is reused or the data is forced to all zeros depending on the programming of CFIG2I.) |
| CACT | Calibration Active Emulation. If CFIG1I is high, this bit goes high as a result of the mode change enable bit (CIDXR[6]) going inactive; it goes back low after the trailing edge of the first subsequent read of CSR2I. |
| DRPS | DMA Request Pin Status. This bit is high anytime that either the record or playback DMA request pins are active. |
| RADO[1:0], LADO[1:0] | Right and Left Overrange Detect. These two pairs of bits are updated on a sample by sample basis to reflect whether the signal into the DAC is causing clipping. |

| BIT | | CONDITION OF |
|---|---|---|
| 1 | 0 | SIGNAL |
| 0 | 0 | Less than 1.5 dB underrange |
| 0 | 1 | Between 1.5 dB and 0 dB underrange |
| 1 | 0 | Between 0 dB and 1.5 dB overrange |

| 1 | 1 | More than 1.5 dB overrange |

MODE SELECT, ID REGISTER (CMODEI)

Address: PCODAR+1 read, write; index CIDXR[4:0]=Ch

Default: 100X 1010

Modes: 1, 2, and 3

| 7 | 6 | 5 | 4 | 3 | 2 | 1 | 0 |
|---|---|---|---|---|---|---|---|
| ID[4] | MODE[1:0] | | RES | ID[3:0] | | | |

This register specifies the operating mode of the CODEC and reports the revision number of the circuit C.
ID[4], Revision ID Number. These five bits specify the revision number of the ID[3:0] present invention CODEC circuit C, which is initially 1,1010. These bits are read-only and cannot be changed.
MODE[1:0] Mode Select. (0, 0) = mode 1; (1, 0) = mode 2; (0, 1) = reserved; (1, 1) = mode 3. In order to enter mode 3, a write of 6Ch must be made to this port; i.e., bit[5] will be forced low for writes of any other value.

LOOPBACK CONTROL REGISTER (CLCI)

Address: PCODAR+1 read, write; index CIDXR[4:0]= Dh

Default: 0000 00X0

Modes: 1, 2, and 3

This register enables and specifies the attenuation of the analog path between the output of the ADC path gain stage (at the input to the ADC) and the input of the DAC-loopback sum. This register affects both the left and right channels.

| 7 | 6 | 5 | 4 | 3 | 2 | 1 | 0 |
|---|---|---|---|---|---|---|---|
| | LBA[5:0] | | | | | RES | LBE |

LBA[5:0] Loopback Attenuation. This specifies the amount of attenuation applied to the loopback signals before being summed with the DAC outputs. The values vary from 00 h = 0 dB to 3Fh = −94.5 dB with 1.5 dB per step (see FIGS. 2a-1 and 2a-2).
LBE Loopback Enable. When high, the loopback path is enabled to be mixed with the DAC outputs. When cleared, the path is disabled and the signal is muted.

UPPER, LOWER PLAYBACK COUNT REGISTERS (CUPCTI, CLPCTI)

Address: PCODAR+1 read, write; upper index CIDXR [4:0]=Eh, lower index CIDXR[4:0]=Fh Default: 0000 0000 (for both)

Modes: definition of these registers vary based on the mode

These registers collectively provide the 16-bit preload value used by the playback sample counters. CUPCTI provides the upper preload bits [15:8] and CLPCTI provides the lower preload bits [7:0]. All 16 bits are loaded into the counter during the write of the upper byte; therefore, the lower byte should be written first; however, if only the low byte is written and the counter underflows, the new value will be placed into the timer. Reads of these registers return the value written into them, not the current state of the counter. In mode 1, this register is used for both playback and capture; in modes 2 and 3 it is used for playback only.

CONFIGURATION REGISTER 2 (CFIG2I)

Address: PCODAR+1 read, write; index CIDXR[4:0]= 10h

Default: 0000 XXX0

Modes: 2 and 3

| 7 | 6 | 5 | 4 | 3 | 2 | 1 | 0 |
|---|---|---|---|---|---|---|---|
| OFVS | TE | RSCD | PSCD | RES | RES | RES | DAOF |

OFVS Output Full Scale Voltage Select. When high, the full scale output is 2.9V for Vcc = 5V and 1.34 for Vcc = 3.3V. When low, the full scale output is 2.0V for Vcc = 5V and 1.00 for Vcc = 3.3V. This bit affects the left and right signals that exit the mixers, prior to entering CLOAI and CROAI; so it also changes the input to the record multiplexer.
TE Timer Enable. When high, the timer and its associated interrupt are enabled. When low, the timer is disabled. The timer count is specified in CLTIMI and CUTIMI.
RSCD Record Sample Counter Disable. When high, this bit disables the record sample counter from counting. This bit is mode 3 accessible only and only affect the sample counter in mode 3.
PSCD Playback Sample Counter Disable. When high, this bit disables the playback sample counter from counting. This bit is mode 3 accessible only and only affect the sample counter in mode 3.
DAOF D/A Output Force Enable. When high, the output of the D/A converters are forced to the center of the scale whenever a playback FIFO underrun error occurs. When cleared, the last valid sample will be output in the event of an underrun.

CONFIGURATION REGISTER 3 (CFIG3I)

Address: PCODAR+1 read, write; index CIDXR[4:0]= 11h

Default: 0000 X000

Modes: bits[7:1] mode 3; bit[0] modes 2 and 3

In mode 3 this register provides for the programming of FIFO thresholds and the generation of I/O-mode FIFO service interrupts.

| 7 | 6 | 5 | 4 | 3 | 2 | 1 | 0 |
|---|---|---|---|---|---|---|---|
| RPIE | PPIE | FT[1:0] | | RES | PVFM | SYNA | RWB |

RPIE   Record FIFO Service Request Interrupt Enable. When the record path is enabled and I/O operation is selected (CFIG1I), setting this bit high enables the generation of an interrupt request whenever the record FIFO/DMA interrupt bit in Status Register 3 becomes set. This bit is mode 3 accessible only.
PPIE   Playback FIFO Service Request Interrupt Enable. When the playback path is enabled and I/O operation is selected (CFIG1I), setting this bit high enables the generation of an interrupt request whenever the playback FIFO/DMA interrupt bit in Status Register 3 becomes set. This bit is mode 3 accessible only.
FT[1:0]   FIFO Threshold Select. These two bits specify the record and playback FIFO thresholds for when DMA or interrupt requests become active. These bits are mode 3 accessible only and do not have an effect in modes 1 and 2.

| FT | | Point At Which Request Becomes Active |
|---|---|---|
| 1 | 0 | |
| 0 | 0 | Minimum: Record FIFO not empty; playback FIFO not full |
| 0 | 1 | Middle: Record FIFO half full; playback FIFO half empty |
| 1 | 0 | Maximum: Record FIFO full; playback FIFO empty |
| 1 | 1 | Reserved (behaves the same as the minimum mode) |

PVFM   Playback Variable Frequency Mode. This bit high selects playback-variable-frequency mode. In this mode, the sample rate is selected by a combination of CPDFI[0]

-continued

| | |
|---|---|
| | and CPVFI to allow variable frequencies between 3.5 KHz and 32 KHz. The sound quality may be reduced when in this mode. This bit is mode 3 accessible only. |
| SYNA | AUX1/Synth Signal Select. This bit selects the source of the signals that enter the CLAX11 and CRAX11 attenuators before entering the left and right mixers. This bit low selects the AUX1[L,R] input pins. This bit high selects the output of the synth DACs. This bit is mode 3 accessible only. |
| RWB | Read Write Bit. This bit is writable and readable; it does not control anything within the device. This is mode 2 and mode 3 accessible. |

LEFT, RIGHT LINE INPUT CONTROL REGISTERS (CLLICI, CRLICI)

Address: PCODAR+1 read, write; left index CIDXR[4:0]=12h, right index CIDXR[4:0]=13h Default: 1XX0 1000 (for both)

Modes: 2 and 3

This register pair controls the gain/attenuation applied to the LINEIN inputs to the mixer. The registers are identical, one controls the left channel and the other controls the right channel.

| 7 | 6 | 5 | 4 | 3 | 2 | 1 | 0 |
|---|---|---|---|---|---|---|---|
| LLIME, RLIME | RES | RES | LLIG[4:0], RLIG[4:0] | | | | |

LLIME, Left, Right LINE Input Mute Enable. When high, the LINEIN input is
RLIME muted. When low, the input operates normally.
LLIG[4:0], Left, Right LINE Input Gain Select. This specifies the amount of gain
RLIG[4:0] applied to the LINEIN[L, R] input signals. The values vary from 0 = +12 dB to 1 Fh = −34.5 dB with 1.5 dB per step (see FIGS. 2a-1 and 2a-2).

LOWER, UPPER TIMER REGISTERS (CLTIMI, CUTIMI)

Address: PCODAR+1 read, write; low index CIDXR[4:0]=14h, upper index CIDXR[4:0]=15h Default: 0000 0000 (for both)

Modes: 2 and 3

These registers collectively provide the 16-bit preload value used by the general purpose timer. Each count represents 10 microseconds (total of 650 milliseconds). CUTIMII provides the upper preload bits [15:8] and CLTIMI provides the lower preload bits [7:0]. Writing to CLTIMI causes all 16 bits to be loaded into the general purpose timer. Reads of these registers return the value written into them, not the current state of the counter.

LEFT, RIGHT MIC INPUT CONTROL REGISTERS (CLMICI, CRMICI)

Address: PCODAR+1 read, write; left index CIDXR[4:0]=16h, right index CIDXR[4:0]=17h Default: 1XX0 1000 (for both)

Modes: 3

This register pair controls the left and right MIC inputs to the mixer. The registers are identical, one controls the left channel and the other controls the right channel.

| 7 | 6 | 5 | 4 | 3 | 2 | 1 | 0 |
|---|---|---|---|---|---|---|---|
| LMME, RMME | RES | RES | LMG[4:0], RMG[4:0] | | | | |

LMME, Left, Right MIC Mute Enable. When high, the MIC input is muted.
RMME When low, the input operates normally.
LMG[4:0], Left, Right MIC Gain Select. This specifies the amount of gain applied to
RMG[4:0] the MIC [L, R] input signals. The values vary from 0 = +12 dB to 1 Fh = −34.5 dB with 1.5 dB per step (see FIGS. 2a-1 and 2a-2).

STATUS REGISTER 3 (CSR3I)

Address: PCODAR+1 read, write (to clear specific bits); index CIDXR[4:0]=18h

Default: X000 0000

Modes: 2 and 3; definition of bits[5:4] vary based on the mode

This register provides additional status information on the FIFOs as well as reporting the cause of various interrupt requests. Each of the TIR, RFDI, and PFDI bits are cleared by writing a 0 to the active bit; writing a 1 to a bit is ignored; these bits can also be cleared by a write of any value to CSR1R. Bits[3:0], the overrun-underrun bits, are cleared to a low by reading CSR1R; these bits are also cleared when the mode change enable bit in CIDXR goes from high to low.

| 7 | 6 | 5 | 4 | 3 | 2 | 1 | 0 |
|---|---|---|---|---|---|---|---|
| RES | TIR | RFDI | PFDI | RFU | RFO | PFO | PFU |

TIR Timer Interrupt Request. This bit high indicates an interrupt request from the timer. It is cleared by a writing a zero to this bit or by writing any value to CSR1R.
RFDI Record FIFO Interrupt Request. This bit high indicates a record path interrupt. It is cleared by a writing a zero to this bit or by writing any value to CSR1R. Mode 2: this bit indicates an interrupt request from the record sample counter. Mode 3 and CFIG1I = 0 (DMA): this bit indicates an interrupt request from the record sample counter. Mode 3 and CFIG1I = 1 (I/O): this bit indicates that the record FIFO threshold (CFIG3I) has been reached.
PFDI Playback FIFO Interrupt Request. This bit high indicates a playback path interrupt. It is cleared by a writing a zero to this bit or by writing any value to CSR1R. Mode 2: this bit indicates an interrupt request from the playback sample counter. Mode 3 and CFIG1I = 0 (DMA): this bit indicates an interrupt request from the playback sample counter. Mode 3 and CFIG1I = 1 (I/O): this bit indicates that the playback FIFO threshold (CFIG3I) has been reached.
RFU Record FIFO Underrun (Modes 2, 3). This bit is set high if there is an attempt to read from an empty record FIFO.
RFO Record FIFO Overrun (Modes 2, 3). This bit is set high if the ADC needs to load a sample into a full record FIFO. It is identical to CSR2I[RFO].
PFO Playback FIFO Overrun (Modes 2, 3). This bit is set high if there is an attempt to write to a full playback FIFO.
PFU Playback FIFO Underrun (Modes 2, 3). This bit is set high if the DAC needs a sample from an empty playback FIFO. It is identical to CSR2I[PFU].

LEFT, RIGHT OUTPUT ATTENUATION REGISTER (CLOAI, CROAI)

Address: PCODAR+1 read, write; left index CIDXR[4:0]=19h, right index CIDXR[4:0]=1Bh Default: 1XX0 0000 (for both);

Modes: 3 only; in mode 2 CLOAI is a read-only register that drives an 80h when read.

This register pair controls the left and right MONO and LINE output levels. The Line output mute control bit is also located in this register pair.

| 7 | 6 | 5 | 4 | 3 | 2 | 1 | 0 |
|---|---|---|---|---|---|---|---|
| LLOME, RLOME | RES | RES | LLOA[4:0], RLOA[4:0] | | | | |

LLOME, Line Output Mute Enable. When high, the LINE output is muted. When
RLOME low, the output operates normally.
LLOA[4:0], Line Output Attenuation Select. This specifies the amount of attenuation
RLOA[4:0] applied to the both the MONO and LINE output signals. The values vary from 00 h = 0 dB to 1 Fh = −46.5 dB with 1.5 dB per step (see FIGS. 2a-1 and 2a-2).

MONO I/O CONTROL REGISTER (CMONOI)

Address: PCODAR+1 read, write; index CIDXR[4:0]= 1Ah

Default: 110X 0000

Modes: bits [7:6,4:0] modes 2 and 3; bit [5] mode 3

This register specifies the amount of attenuation applied to the mono input path. The mute controls for the mono input and output are also located here.

| 7 | 6 | 5 | 4 | 3 | 2 | 1 | 0 |
|---|---|---|---|---|---|---|---|
| MIME | MOME | AR3S | RES | MIA[3:0] | | | |

MIME Mono Input Mute Enable. When high, the mono input is muted. When low, the input is active.
MOME Mono Output Mute Enable. When high, the mono output is muted. When low, the output operates normally.
AR3S AREF to high impedance. When high, the AREF pin is placed into high impedance mode. When low, AREF operates normally. this bit is mode 3 accessible only.
MIA[3:0] Mono Input Attenuation. This specifies the amount of attenuation to be applied to the mono input path. The values vary from 0 = 0 dB to 0 Fh = −45 dB with 3.0 dB per step (see FIGS. 2a-1 and 2a-2).

RECORD DATA FORMAT REGISTER (CRDFI)

Address: PCODAR+1 read, write; index CIDXR[4:0]= 1CH

Default: 0000 0000

Modes: 2 and 3; definition of register varies based on the mode

This register specifies the sample rate (selects which of the two oscillator is to be used and the divide factor for that oscillator), stereo or mono operation, linear or companded data, and 8 or 16 bit data. It can only be changed when the mode change enable bit (CIDXR[6]) is active.

In mode 2, bits[3:0] are not used (the record-path sample rate is specified in CPDFI) and bits[7:4] specify the record-path data format.

In mode 3, all of this register controls record path attributes; the playback attributes are controlled by CPDFI.

| 7 | 6 | 5 | 4 | 3 | 2 | 1 | 0 |
|---|---|---|---|---|---|---|---|
| RDF[2:0] | | | RSM | RCD[2:0] | | | RCS |

RDF[2:0] Record Data Format Selection. These three bits specify the record data format for the CODEC. These bits are accessible in Modes 2 and 3 only.

| BIT | | | |
|---|---|---|---|
| 2 | 1 | 0 | Format |
| 0 | 0 | 0 | 8-bit unsigned |
| 0 | 0 | 1 | μ-Law |
| 0 | 1 | 0 | 16-bit signed, little endian |
| 0 | 1 | 1 | A-Law |
| 1 | 0 | 0 | Reserved, default to 8-bit unsigned |
| 1 | 0 | 1 | IMA-compliant ADPCM |
| 1 | 1 | 0 | 16-Bit signed, big endian |
| 1 | 1 | 1 | Reserved, default to 8-bit unsigned |

RSM Record Stereo/Mono Select. When high, stereo operation is selected; samples will alternate left then right. When low, mono mode is selected; record samples come only from the left ADC. This bit is accessible in modes 2 and 3 only.
RCD[2:0] Record Clock Divider Select. These three bits specify the record clock rate. These bits are accessible from mode 3 only; in mode 2, these bits are reserved. *These divide-downs are provided to function when XTAL1 is less than 18.5 MHz.

| Bits | | | Sampling Rate (kilohertz) | |
|---|---|---|---|---|
| | | | | 16.9 MHz |
| 3 | 2 | 1 | 24.5 MHz XTAL | XTAL |
| 0 | 0 | 0 | 8.0 | 5.51 |
| 0 | 0 | 1 | 16.0 | 11.025 |
| 0 | 1 | 0 | 27.42 | 18.9 |
| 0 | 1 | 1 | 32.0 | 22.05 |
| 1 | 0 | 0 | +448* | 37.8 |
| 1 | 0 | 1 | +384* | 44.1 |
| 1 | 1 | 0 | 48.0 | 33.075 |
| 1 | 1 | 1 | 9.6 | 6.62 |

RCS Record Crystal Select. When high, the 16.9344 MHz crystal oscillator is used. When low, the 24.576 MHz crystal oscillator is used. This bit is accessible from mode 3 only; in mode 2, this bit is reserved.

UPPER, LOWER RECORD COUNT REGISTERS (CURCTI, CLRCTI)

Address: PCODAR+1 rd, wr; upper index CIDXR[4:0]= 1Eh, lower index CIDXR[4:0]=1Fh Default: 0000 0000 (for both)

Modes: 2 and 3; in mode 1, function is moved to CUPCTI and CLPCTI

These registers collectively provide the 16-bit preload value used by the record sample counters. CURCTI provides the upper preload bits [15:8] and CLRCTI provides the lower preload bits [7:0]. All 16 bits are loaded into the counter during the write of the upper byte; therefore, the lower byte should be written first; however, if only the low byte is written and the counter underflows, the new value will be placed in the timer. Reads of these registers return the value written into them, not the current state of the counter.

PLAYBACK VARIABLE FREQUENCY REGISTER (CPVFI)

Address: PCODAR+1 read, write; index CIDXR[4:0]= 1Dh

Default: 0000 0000

Modes: 3 only

This 8-bit register specifies the playback frequency when variable-frequency-playback mode has been enabled via CFIG3I. The playback frequency will be PCS/(16*(48+ CPVFI)), where PCS is the frequency of the oscillator selected by CPDFI[0]. The 16.9 MHz oscillator provides a range from about 3.5 KHz to 22.05 KHz; the 24.5 MHz oscillator provides a range from about 5.0 KHz to 32 KHz. It is not necessary to set CIDXR[MCE] when altering the value of this register.

Referring to FIG. 2, in mixer 606, for the record path of CODEC 505, the status of control register CLICI 604 controls multiplexer (MUX) 602 such that only one of four analog audio signals pass through MUX 602 and attenuation/gain control circuit 664. If not muted by attenuation/gain control circuit 664, the selected signal is then provided to either left record ADC 666, or looped back through attenuation/gain control circuit 606 to be summed in playback mixer 678 with the output of left playback DAC 680. This loop back is accomplished over loop back path 676, which provides a loop back path for system test and dubover capability so that in playback mode, MICL 684, LINEINL 682, AUX1L 686, or left synthesizer DAC 692 output signals may be superimposed over audio signals coming from the output of left playback DAC 680. This provides a Karioke-type capability with stored audio signals coming from left playback DAC 680.

The contents of control register CFIG3I[SYNA] 607 is used to control left synth DAC MUX 694 to select between analog inputs AUX1L 686 and left synthesizer DAC 692. The selected analog audio signal then passes to the input of MUX 602 and to attenuation/gain control circuit 612. The output of attenuation/gain control circuit 612 is then input to main mixer 698 to be summed with all other non-muted analog audio input signals available at the input to main mixer 698.

Main mixer loopback path 677 provides the output of main mixer 698 to the input of MUX 602. Main mixer 698 output is also provided to attenuation/gain control circuit 674 for further submission to mono mixer 672, as LEFTOUT, where it is summed with analog output RIGHTOUT 616 from the right channel mixer (not shown). Signals LEFTOUT and RIGHTOUT are summed in mono mixer 672 and then sent through mute control 604 to be available as analog output signal MONOOUT 668. Signal LEFTOUT is also input to attenuation/gain control circuit 602. If not muted, LEFTOUT is available as an analog output left channel stereos signal LINEOUTL 670.

The analog audio input signal MONOIN 690 passes through attenuation/gain control circuit 696 and is available to main mixer 698 as an input signal, and as an analog mono input signal 618 to the right channel main mixer (not shown).

Figure 3:
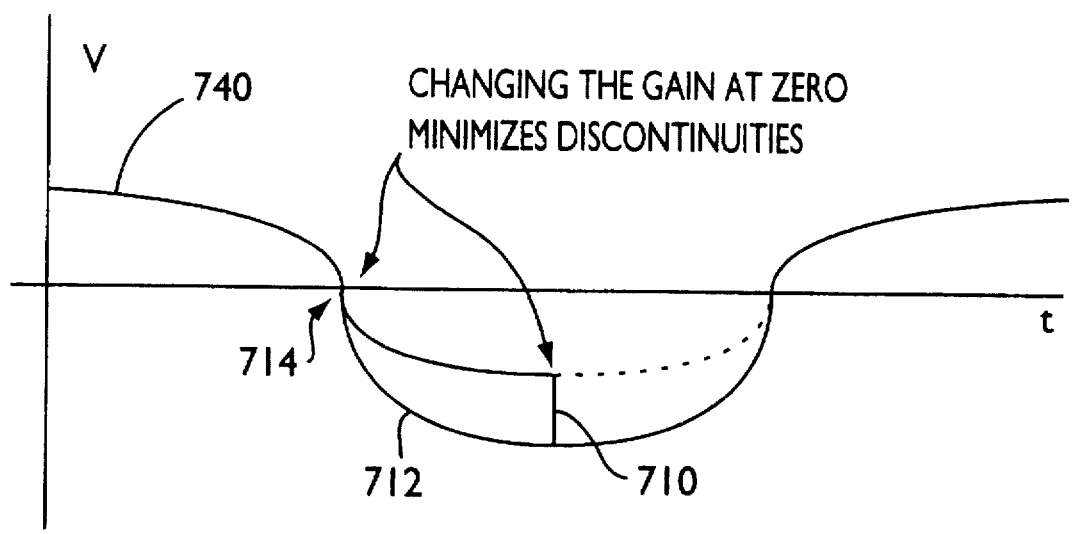
FIG. 3 is a diagram of a partial wave form indicating signal discontinuities for attenuation/gain changes.
Figure 4:
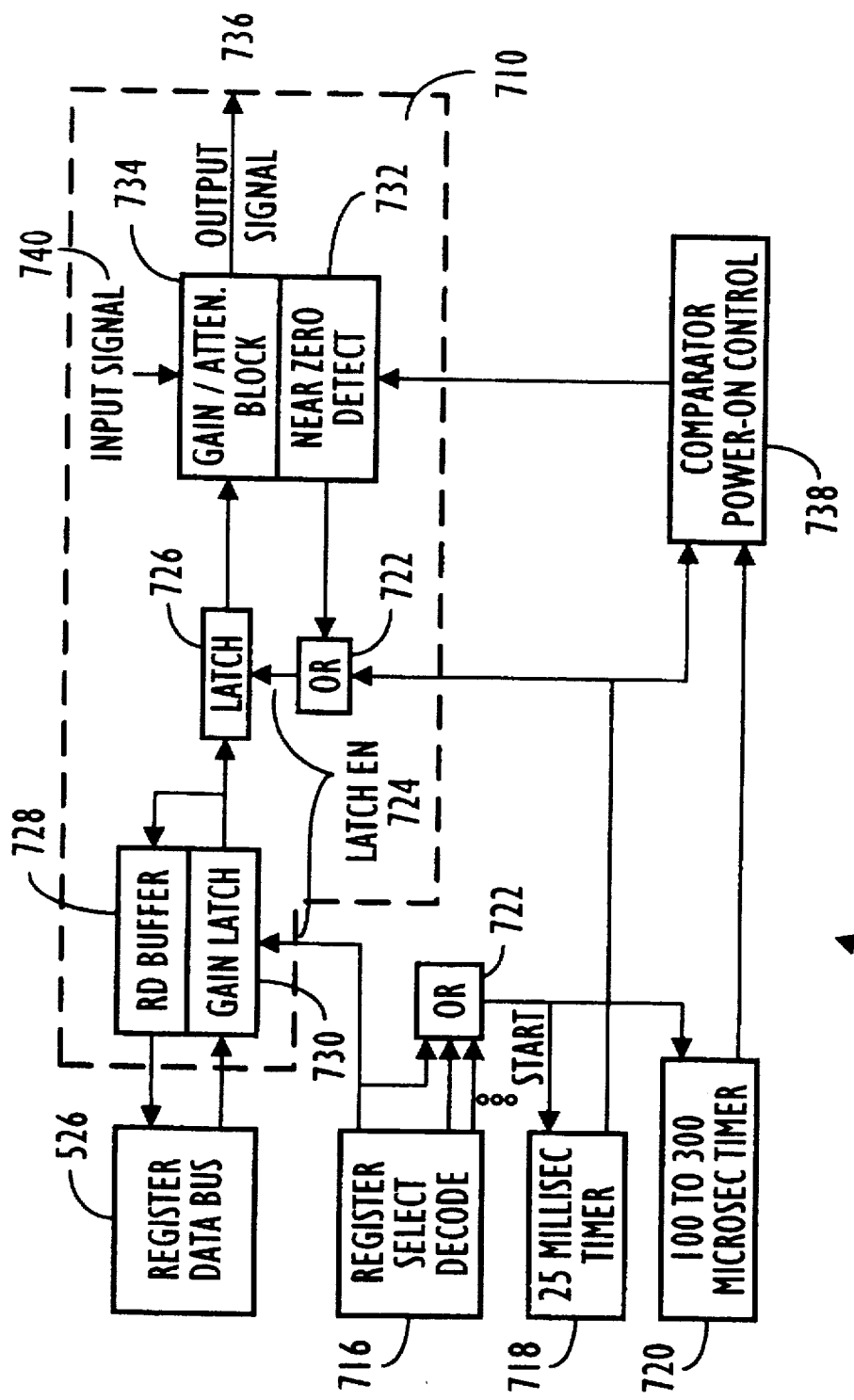
FIG. 4 is a block diagram showing zero detect circuits for eliminating "zipper" noise.

As shown in FIG. 4, the CODEC 505 includes circuitry to ensure that the amplitude of each respective analog audio signal in analog mixer 606 is maintained until the signal attains a nominal value. This is accomplished by zero detect circuit 715. Updated attenuation/gain control information is not loaded into the respective attenuation/gain control register until the analog audio signal that is to be acted on with the new attenuation/gain control value either crosses zero volts 714 (FIG. 3) with respect to a reference voltage, or until a time-out count is reached by 25 millisecond timer 718 which will result in a default condition causing the respective attenuation/gain control register in Registers block 566 (FIG. 7) to be loaded with the new gain/attenuation control value.

The attenuation/gain control circuit 710, shown within dotted line in FIG. 4, is provided for each attenuation/gain control register in Registers block 566 of FIG. 1. In the preferred embodiment, there are sixteen attenuation/gain control registers (CLCI, CLICI, CRICI, CLAX1I, CRAX1I, CLAX2I, CRAX2I, CLDACI, CRDACI, CLLICI, CRLICI, CLMICI, CRMICI, CLOAI, CROAI and CMONOI) which may be written to change the gain or attenuation control values stored therein, which value is in turn is used to change the amplitude of the analog audio signal being processed by the particular attenuation/gain control register being written to. In other applications, more or less attenuation/gain control registers may be implemented.

In operation, whenever one of the attenuation/gain control registers is written to, Register Select Decode block 716 latches the new attenuation/gain control value into gain latch 730. After decoding the write to one of the attenuation/gain control registers, Register Select Record block 716 sends an enable to 25 millisecond timer block 718 and 100 To 300 Microsecond block 720 to initiate a power-up. Power is then provided for 100 to 300 microseconds to each of the Near Zero Detect blocks 732, by Comparator Power-On Control block 738, enabled by 100 to 300 microsecond block 720.

The 25 millisecond timer block 718 utilizes ICLK3K, the 3.15 KHz clock, to count to 80. The timing in 100 to 300 Microsecond timer block 720 is accomplished by the logic therein waiting for two edges of 3.15 KHz clock, ICLK3K. Once powered, the Near Zero detect block 732 generates a strobe when the audio input signal 740 approaches nominal voltage. The zero detect logic in each Near Zero Detect block 732 may be implemented with comparators, or other circuits capable of providing an output signal whenever the input audio signal 740 is equal to a predetermined reference voltage. The zero detect strobe is used to latch the new attenuation/gain value into latch 726. The zero detect circuitry 732 will remain powered until the fixed 25 millisecond timer 718 completes its count.

An analog reference voltage (AREF) is used such that when VCC is 5 volts, the value of AREF is 0.376 times VCC, nominal. When VCC is 3.3 volts, the value of AREF is 0.303 times VCC, nominal. AREF is capable of driving up to 250 microamps without degradation and can be placed into high-impedance mode, controlled by CMONOI[AR3S].

If input signal 740 has not reached nominal voltage before the 25 millisecond timer 718 completes its count, the new attenuation/gain control value is nevertheless loaded into the respective attenuation/gain control register, as a default condition. If a write to any of the attenuation/gain control registers in Register block 566 (FIG. 7) occurs before the 25 millisecond timeout is reached, the 25 millisecond timer 718 is reset, regardless of its count status.

The zero detect circuit 715 minimizes "zipper" noise or other audible discontinuities when input signal 740 is to be increased or decreased in amplitude. By powering up the near zero detect circuits 732 only when an attenuation/gain register is written to, unnecessary noise, from comparators or other voltage detect circuits in Near Zero Detect block 732 switching every time a zero crossing is sensed is eliminated.

Referring to FIG. 3, by increasing the gain at input signal zero crossing 714, signal discontinuity 710 is eliminated. By using zero detect block 732, input signal 740 changes amplitude at zero crossing 714 is output from zero detect circuit 715 as output signal 736 (FIG. 4), and continues with its new amplitude along curve 712 (FIG. 3).

Figure 7:
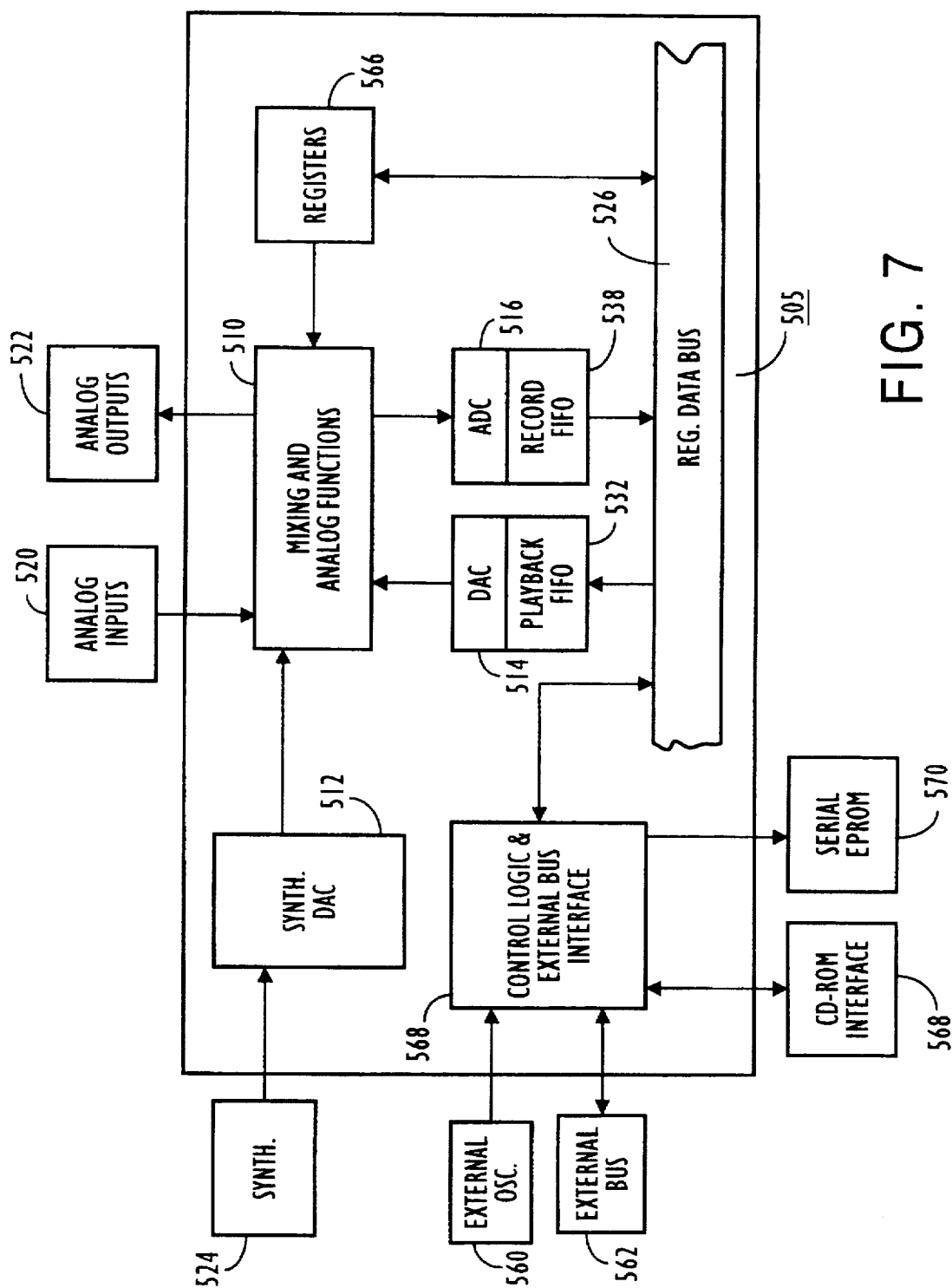
FIG. 7 is a block diagram showing internal and external data paths and interfacing with external devices, supported by the present invention.

All programmable attenuation/gain control circuits in CODEC 505 (triangles in analog mixer 606) include zero crossing detect circuitry 715. Zero crossing circuit 715 performs identically for each attenuation/gain control register in Registers block 566 (FIG. 7).

An additional noise management feature of CODEC 505 is used to suppress noise on power-up. Audible glitches from audio outputs LINEOUT 670 and MONOOUT 668 (FIG. 2) are suppressed when power is being applied or removed from CODEC 505, or when low-power mode is entered or exited. During all power-up and power-down phases, CODEC 505 output amplifiers in mute circuits 602 and 604 (FIG. 2) are muted.

To enhance the performance of the CODEC, digital operations occur on the rising edge of the 16.9 MHz system clock, and analog operations are performed on the falling edge of the system clock, or at some other time prior to the next rising edge of the system clock. Generally, digital operations inherently produce noise which must be attenuated as much as possible before analog operations are performed. Using different edges of the system clock, in addition to delaying the clocks generated from the system clock that are used by the analog circuitry with respect to the clocks used by the digital circuitry, will produce the desired result. Inherently noisy digital operations include, RAM reads, precharging a bus and performing an addition. Analog functions require a quiet supply and ground. For example, a comparator requires a low level noise background to be able to detect a one millivolt level to achieve a proper compare.

The record and playback paths of CODEC 505 are independently programmable to provide a different sample rate for playback and record. A continuously variable rate playback mode is provided for playback DAC 514 (FIG. 1), which includes a choice of two ranges of sample clock rates ranging from 3.5 to 22.05 KHz or from 5.0 to 32.00 KHz. Each sample rate range contains 256 incremental clock rates. By enabling this variable playback mode by modifying the status of control register CFIG3I, the playback frequency for playback DAC 514 can be continuously varied over 256 steps, resulting in smooth transitions between audio sample rates which produces high quality sounds. Previously, with only fourteen different sample rates being used, the data sample rate had to be increased and interpolated, then the rate increased again and the signal interpolated again to achieve the desired sound and transition between sample rates. This required excessive processor intervention.

Utilizing the feedback loops within CODEC analog mixer 606 (FIG. 2), and the independent programmability of the sample rates of record ADC 516 and playback DAC 514, an analog audio signal may be sampled and converted to digital by record ADC 516 at one rate, then played back through playback DAC 514 at another rate. This feature provides a translator capability between an audio signal recorded and played at different sample rates. For example, the direct recording of compact disc (CD) audio, or digital audio tape data (DAT) onto formatted tapes without significant degradation of signal quality is implemented by CD audio data being converted to analog through playback DAC 514 at 44.1 KHz, then being processed through record ADC 516 circuitry and made available as serial or parallel digital audio data that can be recorded by external audio equipment on DAT at 48 KHz.

In the present invention, the continuously variable playback frequency mode can be selected to incrementally increase the playback sample rate in CODEC 505 without external processor intervention for up-sampling and interpolation. The frequency range is preferably selected by control register CPDFI[0] in the Registers block 566 (FIG. 7), which is programmable to be able to select, at any time, the playback frequency to be used, and thus, which clock is to be used. See FIG. 5. This requires some external processor intervention to load the frequency select instruction, but not as much overhead as previous audio systems. For software compatibility with existing systems, however, the playback-variable frequency mode is different than the 14 sample rate mode operation of playback DAC 514 and record ADC 516.

Oscillators with external crystals 560 (FIG. 7) are used to generate the range of frequencies for the playback variable frequency mode. Preferably, two external crystals in conjunction with on-chip circuitry are used to produce two clocks, one being at 24.576 MHz and one being at 16.9344 MHz. Selecting the 16.9 MHz clock with select logic circuit 762 will provide a 256 step frequency range from between 3.5 KHz to 22.05 KHz. Selecting the 24.5 MHz crystal will provide a 256 step frequency range of 5.0 to 32.00 KHz.

Figure 5:
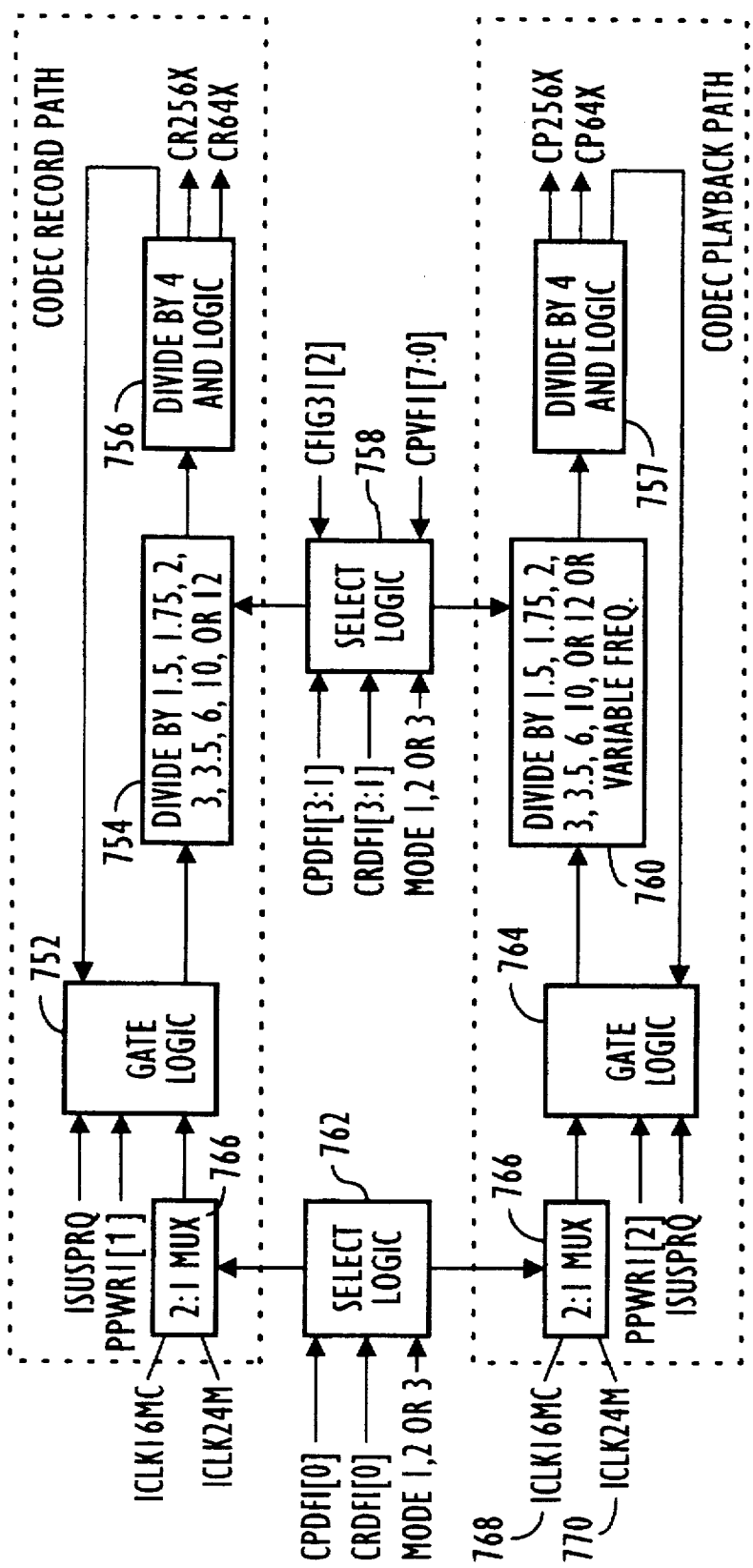
FIG. 5 is a block diagram showing clock generation functions in the present invention.

To provide each of the 256 steps over a selected frequency range, the chosen crystal oscillator is divided by three or more to create an X256 clock (sample rate times 256). The X256 clock is then divided by four to create the X64 clock (sample rate times 64). The X64 clock repeats an 8-cycle, aperiodic pattern which produces the frequencies within the selected range. The various clocks, generated by the divide-down logic in FIG. 5, are used to change the sample rate (pitch) during playback through the playback DAC (FIG. 1), such that the higher the sample rate, the higher the pitch and the lower the sample rate, the lower the pitch. This capability of continuously variable playback sample rates can be used with any DAC, and is not limited to the Σ-Δ playback DAC 514 described herein.

TABLE C1 describes the formulas preferably used to select the sample frequency of each range.

TABLE C1

| Oscillator | Formula For Frequency | Range |
| --- | --- | --- |
| 16.9344 MHz | 16,934,400/<br>(16*(48 + CPVFI)) | 3.5 KHz. to 22.05 KHz. |
| 24.576 MHz | 24,576,000/<br>(16*(48 + CPVFI)) | 5.0 KHz. to 32.00 KHz. |

Table C2 illustrates how the first ten clock frequencies in one range are generated using the 16.9 MHz external crystal oscillator.

TABLE C2

| CPVFI | Number of oscillator clocks per X64 cycle based on SMX65[4:2] | | | | | | | | Frequency for 16.9 MHz. osc. |
| --- | --- | --- | --- | --- | --- | --- | --- | --- | --- |
| | 0 | 1 | 2 | 3 | 4 | 5 | 6 | 7 | |
| 00 h | 12 | 12 | 12 | 12 | 12 | 12 | 12 | 12 | 22.050 KHz. |
| 01 h | 14 | 12 | 12 | 12 | 12 | 12 | 12 | 12 | 21.600 KHz. |
| 02 h | 14 | 14 | 12 | 12 | 12 | 12 | 12 | 12 | 21.168 KHz. |
| 03 h | 14 | 14 | 14 | 12 | 12 | 12 | 12 | 12 | 20.753 KHz. |
| 04 h | 14 | 14 | 14 | 14 | 12 | 12 | 12 | 12 | 20.353 KHz. |
| 05 h | 14 | 14 | 14 | 14 | 14 | 12 | 12 | 12 | 19.970 KHz. |
| 06 h | 14 | 14 | 14 | 14 | 14 | 14 | 12 | 12 | 19.600 KHz. |
| 07 h | 14 | 14 | 14 | 14 | 14 | 14 | 14 | 12 | 19.244 KHz. |
| 08 h | 14 | 14 | 14 | 14 | 14 | 14 | 14 | 14 | 18.900 KHz. |
| 09 h | 16 | 14 | 14 | 14 | 14 | 14 | 14 | 14 | 18.568 KHz. |

Table C3 illustrates the preferred way of using the X256 clock to create the wave forms illustrated Table C2. The 4-cycle pattern illustrated in Table C3, given by the status of register SMX64[1:0], is used to ensure that the X64 clock maintains a 50 percent duty cycle, which is preferred.

TABLE C3

| SMX65[1:0] | Number of osciator clocks per X256 cycle |
| --- | --- |
| 0 | 3 + CPVFI[7:4] + (1 if ((SMX64[4:2] < CPVFI [2:0]) AND CPVFI[3] = 0))) + (1 if (CPVFI[3] = 1)) |
| 1 | 3 + CPVFI[7:4] + (1 if (SMX64[4:2] < CPVFI [2:0]) AND (CPVFI[3] = 1))) |
| 2 | 3 + CPVFI[7:4] + (1 if ((SMX64[4:2] < CPVFI [2:0]) AND (CPVFI[3] = 0))) + (1 if (CPVFI[3] = 1)) |
| 3 | 3 + CFVFI[7:4] + (1 if ((SMX64[4:2] < CPVFI [2:0]) AND (CPVFI[3] = 1))) |

FIG. 5 illustrates the clock select circuitry which provides the independently selectable sample rates for the record and playback paths of CODEC 505, and the continuously variable playback sample rates for playback DAC 514. Playback DAC 514 and record ADC 516 (FIG. 1) are each capable of operating at one of 14 different sample rates ranging from 5.5 to 48.0 KHz. These sample rates are preferably derived from the two external crystal oscillators 560 (FIG. 7). Select logic circuitry 762 in CODEC 505 controls each 2:1 MUX 766 to select the output of either the 16 MHz or 24 MHz oscillator, depending on which sample rate is selected.

Figure 8:
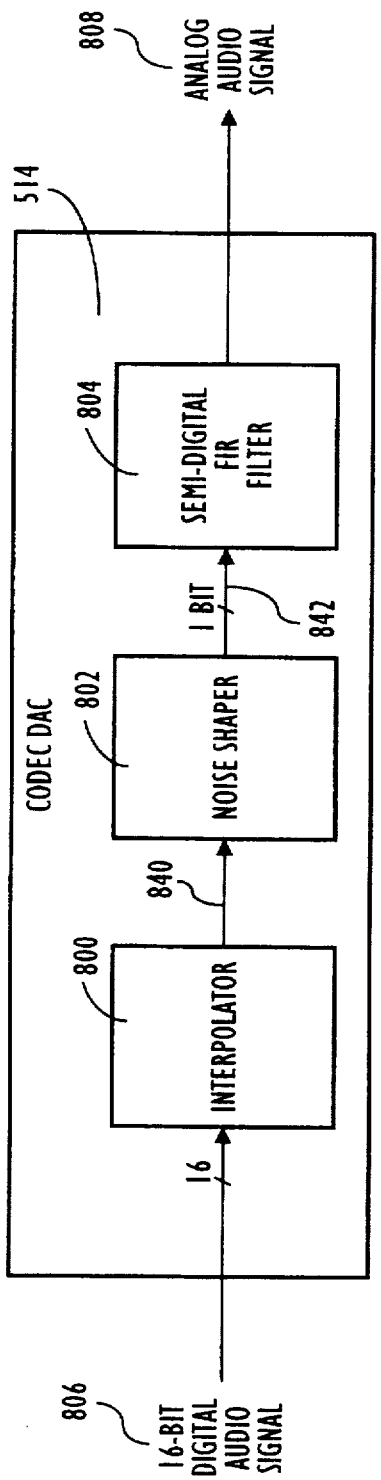
FIG. 8 is a block diagram of the digital to analog converter block of the present invention.

Gate logic block 752 in the record path, and 764 in the playback path, provide the selected clock signal to divide-down logic blocks 754, 756, and blocks 760, 757, respectively, to provide a selected slower clock. As shown in FIG. 5, the status of control registers CPDFI[0], CPDFI[3:1], CRDFI[0], CRDFI[3:10], CFIG3I and CPVFI[7:0] controls the divide-down logic to be used to generate a selected clock signal. Clock CP256X is used to control operations in the playback DAC 514. Clock CP64X is used to control operations in the semi-digital filter 804 (FIG. 8).

Referring to FIGS. 6 and 6a, CODEC 505 includes logic and control for transfers of serial digital audio data, including parallel-to-serial (PTS) conversion blocks 788, 789 and serial-to-parallel (STP) conversion logic 782. A record multiplexer (MUX) 784 is controlled by control register ICMPTI[8:6]. If bits [8:6] equal zero, MUX 784 selects parallel digital audio data from record ADC 516. If equal to one, MUX 784 selects the output of STP conversion logic 782. In the record path, the output of record MUX 784 is provided to the CODEC record FIFO 538. Referring to FIG. 1, the output of record FIFO 538 is available on register data bus 526; at local memory control 790 (which may transfer the data to off-chip local memory 110, FIG. 1, for storage as a record FIFO) via parallel to serial converter 789, serial transfer control 540 and data path 550; and at the input of PTS block 789 whereby the data is then provided, via Serial Transfer Control block 540, to: record FIFO 538, playback FIFO 532 (via serial to parallel converter 782), or to External Serial Interface 544.

As shown in FIG. 6a, in the CODEC playback path, a playback MUX 794 is controlled by control registers ICMPTI[8:6] and LMFSI[PE]. If ICMPTI[8:6] is not equal to one, or if LMFSI[PE] equals one, then audio data from STP block 782 is available at the input to playback FIFO 532. Otherwise, data from register data bus 526 is available at playback FIFO 532. As shown if FIG. 6, data from local memory control 790 (which may obtain data from local memory 110, FIG. 1) is provided to playback FIFO 532 via playback MUX 794. Audio data from synth DSP 796 or record FIFO 538 may also be available at the input of playback MUX 794. As illustrated in FIG. 6a, the value of ICMPTI[8:6] determines the operation of serial transfer control MUXES 554 and 548. Serial transfer control MUX 546 operation is controlled by the status of LMFSI[PE].

As shown in FIG. 1, audio data from synthesizer DSP 796 is also available at the input of synthesizer DAC 5 12. The output of synth DAC 512 is provided as an analog input to left synth DAC MUX 649 (and right synth DAC MUX, not shown) in CODEC analog mixer 606 (FIG. 2). Synthesizer DSP 796 may be an external device, or may be included in a synthesizer module on the same monolithic integrated circuit as the CODEC device 505 to increase the flexibility and speed of operation between the CODEC 505 and the synthesizer.

With the arrangement of STP and PTS converter logic blocks 782 and 789, respectively, and Serial Transfer Control block 540, a digital loop back capability between record and playback paths of CODEC 505 exists. This provides greater flexibility for testing and for data transfer of audio data from external sources to or from record FIFO 538 or playback FIFO 532, or to off-chip local memory 110, FIG. 1, via local memory control 790, or to external system memory (not shown). A digital data path (FIGS. 1, 6), via PTS and STP blocks 789 and 782 is depicted between the record FIFO 538 output and the playback FIFO 532 input. The loop between the playback DAC 514 output and the record ADC 516 input is analog and resides in Mixer 606, FIG. 2, and is illustrated with left playback DAC 680 looping to left record ADC 666.

External serial interface 544 may be connected to a synthesizer DSP having a serial input and output (not shown) whereby that synthesizer DSP could receive serial data from, via Serial Transfer Control block 540, record FIFO 538, and could send serial data to, via Serial Transfer Control block 540, playback FIFO 532.

The record and playback MUXES 784 and 794, in the serial data transfer logic of CODEC 505 are preferably bit-stream multiplexers. Preferably, state machines are used to generate and/or operate on the control signals and clocks necessary to accomplish the transfers. See the description of control signals during serial data transfers, above. Most transfers in Serial Transfer Control block 540, operate off a 2.1 MHz, 50 percent duty cycle clock, derived by dividing the 16.9344 MHz crystal oscillator by eight. Transfers from the synth DSP 796 to an external device utilize 32 clocks per frame, based on the synth DSP frame rate. The STP logic blocks 782 are 16-bit slaves to the bit streams that drive them. A pulse, STSYNC, generated by serial transfer control block 540, is followed by 16 bits of data, MSB first. As with the PTS blocks 788, 789 the data configuration and order is the same as for 16-bit DMA transfers. STSYNC toggles after the LSB of each 16-bit left or right data sample is transferred.

Each PTS converter blocks 788, 789 transfer operation brings in 16-bits of data to be shifted out serially. The number of transfers, the data configuration, and the order of the data varies based on the transfer mode selected, discussed below. The PTS blocks 788, 789 behave the same as that of 16-bit DMA transfers to the FIFOs, described below and depicted in Table C4 (e.g., if in 8-bit mono mode, there is one serial transfer for every two data samples, with the first sample being the LSBs and the second being the MSBs or, if in 16-bit stereo mode, there are two transfers for every sample received.)

TABLE C4

| Sample Mode | 8-bit DMA | | 16-bit DMA | |
|---|---|---|---|---|
| | Samples per DRQ | Cycles per DRQ | Samples per DRQ | Cycles per DRQ |
| 4-bit ADPCM mono | 2 | 1 | 4 | 1 |
| 4-bit ADPCM stereo | 1 | 1 | 2 | 1 |
| 8-bit mono (linear, u-law, A-law) | 1 | 1 | 2 | 1 |
| 8-bit stereo (linear, u-law, A-law) | 1 | 2 | 1 | 1 |
| 16-bit mono | 1 | 2 | 1 | 1 |
| 16-bit stereo | 1 | 4 | 1 | 2 |

The PTS blocks 788, 789 indicates that there is data ready to be transferred out by setting a flag. The serial transfer control block 540 responds by generating a pulse, STSYNC (serial transfer sync) that is intended to initiate the flow of serial data, MSB first. After 16 bits are transferred, a clear pulse is sent to PTS blocks 788, 789 from the serial transfer control block 540 so new data can be loaded into the respective PTS block 788 or 789.

Preferably, there are three sources and three destinations for all digital audio data multiplexed through the serial transfer control block 540. Various operating modes can be selected by modifying the contents of a control register, ICPMTI in Registers block 566 (FIG. 7), to the selected mode of operation shown in Table C5.

through Mixing and Analog Functions block 510, and are provided as left and right channel stereo 16-bit signed digital signals to record ADC 516. The 16-bit left and right channel stereo data from record ADC 516 is then formatted to a pre-selected format and sent to 32-bit wide record FIFO 538 for further submission to register data bus 526, then to

TABLE C5

| ICMPTI[STM] | Source | Destination | Format | Sample Rate |
|---|---|---|---|---|
| 0 | | Serial transfer mode not enabled | | |
| 1 | Synth DSP | Record FIFO input | 16-bit stereo | 44.1 KHz. |
| 2 | Synth DSP | Playback FIFO input | 16-bit stereo | 44.1 KHz. |
| 3 | Record FIFO output | Playback FIFO input | CRDFI[3:0] | CRDFI[7:4] |
| 4 | Synth DSP | External serial interface (port) out | 16-bit stereo | 44.1 KHz. or less |
| 5 | Record FIFO output | External serial interface (port) out | CRDFI[3:0] | CRDFI[7:4] |
| | External serial interface (port) in | Playback FIFO input | | |

In general, if record or playback FIFO 538,532 is the data destination, the format and sample rate of that path must conform to that shown in Table C5, otherwise, indeterminate data transfers will result. For example, with STM=2, the playback path sample rate and format must be the same as the synth DSP 796 (16-bit stereo, 44.1 KHz). With STM=3, the playback path sample rate and format must match the record path. In mode 4, the sample rate is 44.1 KHz or less. The modes where synth DSP 796 specifies that the sample rate can be lower than 44.1 KHz is where the value in synthesizer global mode register SGMI[ENH] is low and the register indicating the number of active synthesizer voices, SAVI[AV], is set to greater than 14. That is, if more than 14 audio voices, or signals, are being processed, the sample rate in these modes can be lower than 44.1 KHz. Otherwise, the first fourteen signals are processed at 44.1 KHz. For modes STM=1 and STM=2, CODEC 505 only supports a sample rate of 44.1 KHz. In these two modes, if synth DSP 796 operates at other than 44.1 KHz, proper operation will not occur.

As shown in FIG. 7, during playback mode, digital audio data, from external system memory (not shown), which may be formatted in one of several selectable formats, is provided, via DMA or I/O transfers, to external bus 562, through control logic and external bus interface block 568, and on to register data bus 526 as left and right channel 16-bit stereo data, for ultimate submission to 32-bit wide playback FIFO 532, or LMPF 528 (FIG. 1). The LMPF 528 (FIG. 1) may down-load prerecorded left and right channel 16-bit wide digital stereo audio data signals directly over register data bus 526 to the playback FIFO 532, whereby prior I/O or DMA transfers would have been made between the external system memory and the LMPF 528, which reduces the number of DMA transfers necessary between external system memory and CODEC playback FIFO 532. During playback, the most common mode of data transfer is DMA transfers between the external system memory and the CODEC playback FIFO 532.

In either case, the audio data is then output from playback FIFO 532, formatted (decompressed) to 16-bit signed data, as described in discussion of Format Conversion block 534 in FIG. 1, and then input to the playback DAC 514 as 16-bit signed data. The data is then sent to the Mixing Analog Functions block 510, which contains left and right analog mixers, discussed previously regarding description of FIG. 2.

In the record path, external analog audio signals that are input through the CODEC analog input pins 520 are sent external bus 562, then to external system memory (not shown) via DMA or I/O data transfers or to LMRF 530 (FIG. 1). In record mode, DMA data transfers occur between either the LMRF 530 (where LMRF 530 has been loaded with audio data from on-chip record FIFO 538) and the external system memory via external bus 562 or, directly between the on-chip record FIFO 538 and the external system memory.

CODEC 505 is capable of performing I/O between the external system memory and the CODEC on-chip record and playback FIFOs 538, 532, and also between the system memory and the off-chip LMPF 528 and LMRF 530, for improved system flexibility.

Referring to FIG. 7, when the playback path of CODEC 505 is in mono mode, with control register CPDFI[4] being active low, both the left and right channel stereo DACs in playback DAC 514 block are provided with the same audio data from playback FIFO 532. When the record path is in mono mode, with control register CRDFI[4] being active low, preferably only data from the left stereo ADC in record ADC 516 block (data from right stereo ADC ignored) is processed and provided to the record FIFO 538. In an alternative embodiment in mono mode, only data from the right stereo ADC is provided to record FIFO 538.

Aliasing problems arise in the record ADC 516 when audio signal frequencies are processed at greater than the Nyquist rate, i.e. greater than $0.5\ f_s$ (one-half the sample rate). Stop band and reject circuitry is used to eliminate signal reflections at multiples of $f_s$, plus and minus the signal frequency. The stop band rejection at $0.6\ F_s$ for 22 KHz is preferably greater than 75 dB. Stop band rejection is used in combination with analog filtering to eliminate high frequency images (reflections) during D/A conversions in playback DAC 514.

Oversampling in record ADC 516 is performed at 64 times the sample rate at a lower bit resolution. The signal is then down-sampled and filtered in record ADC 516 until the desired resolution and sample rate, for instance, 44.1 KHz at 16 bits, is achieved. The detailed description of the functions and operation of record ADC 516 circuitry is discussed below.

Table C4, above, provides information regarding the number of audio data samples transformed per DMA transfer, and the number of cycles per DMA transfer for each 8-bit or 16-bit DMA transfer, depending on the type of DMA transfer selected. For example, in 8-bit DMA transfer mode, audio data formatted as 4-bit ADPCM mono audio data will transfer two 4-bit samples during one DMA cycle. In 16-bit DMA transfer mode, four 4-bit ADPCM mono samples will be transferred during one DMA cycle. During 16-bit DMA cycles, the first byte to playback FIFO 532 is assigned to bits [7:0] and the second byte bits [15:8]. Simultaneous record and playback (read and write) operation is provided.

During I/O operations, the external system processor (not shown) reads the CODEC 505 status registers to determine if an I/O operation is needed and addresses CODEC 505 via Control Logic and External Bus Interface 568 to determine which area within CODEC 505 has requested data. The external system control (not shown) can perform an I/O operation for data transfer to the playback or record FIFOs (532, 538), asynchronously. Error conditions for record FIFO 538 and playback FIFO 532 are shown in Table C6.

TABLE C6

| Error Condition | FIFO State | Action | Result |
| --- | --- | --- | --- |
| Playback FIFO Underrun | Playback FIFO empty | DAC needs another sample | In mode 1, the last sample in the FIFO will be reused; in modes 2 and 3, either the last sample will be reused or zeros will be used based on the state of configuration register CFIG2I. The condition is reported in status registers CSR1R[4], CSR2I[6], and CSR3I[0]. |
| Playback FIFO Overrun | Playback FIFO full | SBI writes another sample | The sample is thrown out and CSR1R[3:2] are not updated. The condition is reported in CSR3I[1]. |
| Record FIFO Underrun | Record FIFO empty | SBI reads another sample | The data is not valid and CSR1R[7:6] are not updated. The condition is reported in CSR3I[3]. |
| Record FIFO Overrun | Record FIFO full | ADC gets another sample | The new sample is thrown out; condition is reported in CSR1R[4], CSR2I[7], and CSR3R[2]. |

With the 16-sample, 32-bit record and playback FIFOs, 538, 532, preferably configured with 16-bits dedicated to left channel data and 16-bits to the right channel data, thresholds, or taps, on the record and playback FIFOs 538, 532 at the 0, 7, and 15 sample address, correspond to "empty," "half-full" and "full." These addresses are monitored by control logic block 568 so a I/O interrupt request (IRQ) or DMA request (DRQ) can be generated (Mode 3 only, explained below) depending on the state of CODEC 505's record or playback FIFOs 538, 532. This operation is explained in greater detail, below.

Separate DRQ signals are capable of being generated for the record and playback FIFOs 538, 532. In external systems that can spare only a single DMA channel for CODEC 505, a mode is provided that allows the playback DRQ to be shared so it can function as either the record or playback DMA request channel. Systems lacking DMA capability may use I/O transfers instead. The DMA transfer mode is specified in configuration control register CFIG1I of Registers block 566 (FIG. 7). If the record or playback paths are disabled (via CFIG1I [1:0]), after the associated DRQ request signal has become active, the audio data sample will continue to be transferred, while waiting for the acknowledge, as if the path were still enabled. After the final audio sample is transferred, no other DMA requests will be serviced.

When the record path is disabled, via CFIG1I, or when the record and playback paths both are being enabled for DMA transfers but single channel DMA operation is selected with CFIG1I[2:0]=[1,1,1], then all data remaining in record FIFO 538 is cleared so that when record FIFO 538 is reactivated, no old data will be available for processing. Before being disabled, however, the record path prior to record FIFO 538, including format conversion block 536 (FIG. 1), and filtering functions in record ADC 516, is not cleared for four sample periods.

When the playback path is disabled, via CFIG1I, the playback audio is immediately muted and all samples remaining in playback FIFO 532 are allowed to shift out of FIFO 532 at the sample rate. Four sample periods after playback FIFO 532 is empty, with zeros driven through the post-FIFO playback path, the playback path is disabled to minimize power consumption.

Off-chip local memory 110 (FIG. 1) is preferably used in conjunction with the on-chip playback and record FIFOs 532, 538. Preferably, local memory 110 is figured as a large record and a large playback FIFO, each with approximately 16-megabits of 8-bit addresses. A 19-bit counter in CODEC Counters, Timers block 518 is programmed to select the size of the area in DRAM to form the respective LMPF 528 and LMRF 530, which can be configured to hold up to 512K samples. More or less audio sample memory for the LMPF 528 and LMRF 530, or local memory 110, may be configured depending on design and/or application requirements. It is preferable to use DRAM instead of SRAM due to lower cost and power requirements.

CODEC 505 includes a mode for performing interleaved DMA transfers of data between external system memory and the LMPF 528, and vice versa. In interleaved data mode, external digital audio data samples, which are stored sequentially in external system memory as L1, R1, L2, R2, . . . are transferred over external bus 562, to local memory control 790 (FIG. 6), in Control Logic block 568 (FIG. 7), which reformats the data prior to storing it in the LMPF 528 such that the left channel data samples are stored in one area of off-chip local memory 110 as L1, L2, L3, . . . block and the right channel data samples are stored in another area of local memory 110 data as R1, R2, R3, . . . block. In mono mode, the same data is stored in both blocks of local memory 110. For record mode in CODEC 505, the samples would be sent from LMRF 530 to external system memory, using the same method in reverse.

Two 16-sample counters in Counters, Etc. block 518 (FIG. 1) are provided, one for playback FIFO 532 and one for record FIFO 538. The sample counters count the number of samples that go into or come out of each respective FIFO. Each counter decrements by one every sample period, except in ADPCM mode. After the counter reaches zero, an interrupt is generated, if not masked, and the counter is reloaded with the next value the counter is to decrement from. The count value of the counters are programmed by way of record and playback count registers (CURCTI, CORCTI, CUPCTI and CLPCTI) in Registers block 566 (FIG. 7). Status of the counters is reported via control register CSR3I in Registers block 566. In mode 3, explained below, the CODEC playback counter can be made to decrement when a DMA transfer is made from external system memory to off-chip local memory 110, as well as when DMA transfers are made from external system memory to the on-chip record or playback FIFOs 538, 532.

Table C7 shows the relationship between the data format and the events causing the sample counters to decrement.

TABLE C7

| Sample Mode | Event that causes the counter to decrement (sample event) |
| --- | --- |
| 4-bit ADPCM mono | every 4 bytes (8 mono samples) transferred into the record FIFO or out of playback FIFO |
| 4-bit ADPCM stereo | every 4 bytes (4 stereo samples) transferred into the record FIFO or out of playback FIFO |
| 8-bit mono | every byte (1 mono sample) transferred into the record FIFO or out of playback FIFO |
| 8-bit stereo | every 2 bytes (1 stereo sample) transferred into the record FIFO or out of playback FIFO |
| 16-bit mono | every 2 bytes (1 mono sample) transferred into the record FIFO or out of playback FIFO |
| 16-bit stereo | every 4 bytes (1 stereo sample) transferred into the record FIFO or out of playback FIFO |

Table C8 identifies the events causing the sample counters to decrement, and the variables used in the preferable Boolean equations, below, which are used to generate the count enable inputs to the counters.

FIFOs 538, 532 of CODEC 505 from the prospective of an external system or microprocessor (not shown). The letter "S" in Table C6 refers to "sample" and the number following the letter "S" refers to the sample number. The letter "R" or "L" after the sample number refers to right or left channel stereo audio data.

TABLE C8

```
CPLYSCEN = (MODE == 1)*/(CIDXR[DTD]*CSR1R[GINT])*
    (CFIG1I[PE]*(PLAYBACK SAMPLE EVENT) +/
    CFIG1I[PE]*CFIG1I[RE]*(RECORD SAMPLE EVENT)) +
CFIG1I[PE]*/(CIDXR[DTD]*CSR3I[PFDI])*(PLAYBACK SAMPLE EVENT)*
    ((MODE == 2) + ((MODE == 3)*/CFIG2I[PSCD]*/CFIG1I[PFIOS])):
CRECSCEN = CFIG1I[RE]*/(CIDXR[DTD]*CSR3I[RFDI])*(RECORD
    SAMPLE EVENT)*/(CFIGI[PE]*CFIG1I[DS½]*
    ((MODE == 2) + ((MODE == 3)*/CFIG2I[RCSD]*/CFIG1I[RFIOS]));
```

| Sample Event | The event that causes the counter to decrement as defined in the table above the equations |
| --- | --- |
| CPLYSCEN | Codec playback path sample counter count enable |
| CRECSCEN | Codec record path sample counter count enable |
| CIDXR[DTD] | DMA transfer disable on the sample counter's interrupt |
| CSR1R[GINT] | Global interrupt status bit set |
| SR3I[PFDI,RFDI] | Playback, record path interrupt status bits |
| CFIG1I[PE,RE] | Playback, record path enables |
| CFIG1I[PFIOS,RFIOS] | Playback, record path I/O (high) or DMA (low) selects |
| CFIG1I[DS½] | Selects single-channel DMA operation. |
| CFIG2I[PCSD,RCSD] | Playback, record sample counter disable |

Table C9 shows the format by which audio data is provided to and received from the record and playback

TABLE C9

| Sample Mode | Order (first byte, second byte, . . . ) |
| --- | --- |
| 4-bit ADPCM mono | (S2 in bits [7:4]; S1 in bits [3:0]), (S4 in bits [7:4]; S3 in bits [3:0]), . . . |
| 4-bit ADPCM stereo | (S1R in bits [7:4]; S1L in bits [3:0]), (S2R in bits [7:4]; S2L in bits [3:0]), . . . |
| 8-bit mono (linear, μ-law, A-law) | S1, S2, S3 . . . |
| 8-bit stereo (linear, μ-law, A-law) | S1L, S1R, S2L . . . |
| 16-bit mono little endian | S1[7:0], S1[15:8], S2[7:0] . . . |
| 16-bit mono big endian | S1[15:8], S1[7:0], S2[15:8] . . . |
| 16-bit stereo little endian | S1L[7:0], S1L[15:8], S1R[7:0], S1R[15:8], S2L[7:0] . . . |
| 16-bit stereo big endian | S1L[15:8], S1L[7:0], S1R[15:8], S1R[7:0], S2L[15:8] . . . |

The CODEC timers, located in Counters and Timers block 518 (FIG. 1), are used to time certain external system functions, such as length of time to play an audio signal, etc. An interrupt is generated when the timer count is complete. CODEC 505 preferably does not utilize a timer in this block for its functions, but having this capability for industry compatibility and expandability purposes is necessary.

The CODEC 505 can operate in one of three modes during playback or record. The CODEC 505 is generally register compatible with present audio systems, by operating in modes 1 and 2. An indirect addressing mechanism is used for accessing most of the CODEC registers, contained in Registers block 566 FIG. 7. In mode 1, there are preferably 16 indirect registers. In mode 2, there are preferably 28 indirect registers. In mode 3, which is unique to CODEC 505, there are preferably 32 indirect registers. These modes operate as follows:

MODE 1. The playback sample counter in Counters, etc. block 518, FIG. 1, decrements when the playback path is enabled (CFIG1I) or the record path is enabled (CFIG1I). When both paths are enabled, only the playback path affects the counter and the record sample counter is not available. If register CODEC index address register, CIDXR [DTD], is set and the active path generates an interrupt (CSR1R[GINT]), then the sample counter stops counting. The counter starts counting again once the interrupt or CIDXR[DTD] is cleared. The DMA or I/O cycle control bits, CFIG.1I[7:6], do not affect the sample counter's behavior.

MODE 2. The playback sample counter decrements when the playback path is enabled (CFIG1I). The record sample counter decrements when the record path is enabled (CFIG1I), unless CFIG1I and CFIG1I are also enabled. If CODEC index address register, CIDXR[DTD], is set and the active path generates an interrupt (CSR3R[5:4]), then the respective path that requested the interrupt stops operating. That data path begins operation and the counter starts counting again once the interrupt or CIDXR[DTD] is cleared. The DMA or I/O cycle control bits, CFIG.1I[7:6], do not affect the sample counter's behavior.

MODE 3. Same as mode 2 operation, except the sample counters do not count when in I/O mode (CFIG1I[7:6]). Also, an enable is provided for each sample counter from configuration register, CFIG2I[5:4]. This is an enhanced mode, with independent record and playback path sample rates, record and playback programmable FIFO thresholds, additional analog mixer input enabled for synthesizer DAC audio signals, attenuation/gain controls for mixer 606 (FIG. 2) LINE/MONO outputs, and continuously variable programmable sample frequency mode (256 steps) in playback path.

A programmable 16-bit timer is provided in modes 2 and 3. This timer has approximately a 10 microsecond resolution and uses a 100 KHz clock, CLK100K. The timer is enabled by CFIG2I.

A programmable register pair in CODEC 505 specifies the 16-bit counter preset (CUTIMI and CLTIMI). The counter decrements every 10 microseconds until it reaches zero. At this point, the timer interrupt bit in Status Register 3 is set, the interrupt bit in Status Register 1 is set, and an interrupt is generated, if enabled via CEXTI[1]. The counter is reloaded with CUTIMI and CLTIMI values on the next timer clock.

The record and playback FIFOs 538, 532 include programmable thresholds, or taps, for signaling an IRQ or DRQ from or to the respective FIFO from external system memory. Threshold operation is as follows: a pointer tree at record and playback FIFOs, 538, 532, indicates, if equal to zero, that the address is empty of data, and if equal to one, that data is present. The transition of the index pointer tree from a one (full) to a zero (empty) for a particular address in either FIFO will trigger an IRQ or DRQ interrupt for an external system to fill the playback FIFO 532 above the preselected threshold level (playback), or to empty the record FIFO 538 to an external system so it is below the preselected level (record).

The CODEC Logic Control block 568 (FIG. 7) is connected to each tap on either FIFO. The threshold select in configuration register CFIG3I[4,5]) in Registers block 566 (FIG. 7) determines whether the empty, full, or mid-level threshold is selected. The Logic Control block 568 continuously monitors the taps and automatically generates and performs whatever functions it is designed to perform (e.g., DMA or I/O interrupt generation). When the tap signals that the threshold address is empty (playback) or full (record), depending on whether the tap is located at the position of full, empty or mid-range in the FIFO, an interrupt request is generated. DMA counters in Counters, Timers, Etc. block 518 (FIG. 1) are set for a certain number of data samples to be transferred to or from CODEC 505. Whenever a counter has completed its count, an interrupt request is generated.

The value in the index pointer of the record and playback FIFO 538, 532 is provided to the CODEC control block 568. When the index pointer has reached the FIFO threshold, a bit will be changed in a status register, in Registers block 566. This status bit can be read by the external system processing to perform a write and read operation to or from that FIFO. The status register in Registers block 566 is changed in real-time based on the threshold (taps) in the FIFOs changing from a one to a zero. When that occurs, a bit toggles in a status register, and when the status register is checked by the external system processor, the processor will determine which device is requesting the interrupt. The CODEC registers in Register block 566 are addressed with a direct address over Register Data Bus 526, or via indirect addressing by way of an index register in Registers block 566.

In the CODEC 505, the following interrupts can be generated: (1) playback and record FIFO I/O threshold reached; (2) playback and record 5 sample counters have decremented to zero; and (3) CODEC timer has decremented to zero. The result of the CODEC interrupt logic located in Control Logic block 568 (FIG. 7) is combined into one interrupt signal, IACODEC, which is passed to interrupt selection logic in Control Logic block 568. The interrupt may be masked by a global enable, CEXTI[1]. The state of the interrupts are displayed in the global status register, CSR1R[0] located in Registers block 566 (FIG. 7).

The following interrupt equations describe the states required to set (CSET) and clear (CCLR) the logic in Control Logic block 568 associated with CODEC 505 interrupts. There is one latch in Control Logic block 568 to drive each of the three interrupt status bits in CSR2I. Referring now to Table C10, the definitions of the variables in the following interrupt equations are given.

The CODEC includes a low-power mode. Three programmable bits, selecting the low-power shut-down status of CODEC 505, power control register, PPWRI[2:0], located in Registers block 566 (FIG. 7) can disable the record path, the playback path or the analog circuitry of CODEC 505. In other embodiments, more or less bits may be used. In the shut-down mode, both external crystal oscillators 560 (FIG. 7) are disabled but all registers in Registers block 566 FIG. 1 are readable. In suspend mode, selected by the external computer system or processor, CODEC 505 performs as if all 3-bits in the power control register, PPWRI, are selecting low-power states, both oscillators 560 are disabled and most of the CODEC I/O pins (not shown) become inaccessible. A dedicated suspend mode control pin, SUSPEND# (active low), causes the CODEC I/O pins to be forced high, forced low, or be set into a digital or analog high-impedance mode. See Table C11, which describes the state of the I/O pins in suspend mode. A technique for reducing power consumed

TABLE C10

CSET_CSR3I[4] = "playback FIFO interrupt
    (((MODE == 1) + (MODE == 2))*(PLAYBACK SAMPLE COUNTER ROLLOVER) +
    (MODE == 3)*CFIG3I*/CFIG1I*(PLAYBACK SAMPLE COUNTER ROLLOVER) +
    (MODE == 3)*CFIG3I*CFIG1I*(PLAYBACK FIFO THRESHOLD
REACHED));
CCLR_CSR3I[4] = ((IOW to CDATAP)*(/RDB[4]*(CIDXR(4:01 == 18h)) + (IOW to
CSR1R);
CSET_CSR3I[5]= "record FIFO interrupt
    ((MODE == 2)*(RECORD SAMPLE COUNTER ROLLOVER) +
    (MODE == 3)*CFIG3I*/CFIG1I*(RECORD SAMPLE COUNTER ROLLOVER) +
    (MODE == 3)*CFIG3I*CFIG1I*(RECORD FIFO THRESHOLD REACHED));
CCLR_CSR3I[5] = ((IOW to CDATAP)*(/RDB [5]*(CIDXR(4:0] == 18 h)) + (IOW to
CSR1R);
CSET_CSR3I[6] = "timer interrupt
    (((MODE == 2) + (MODE == 3))*(TIMER REACHES ZERO));
CCLR_CSR3I[6] = ((IOW to CDATAP)*(/RDB [6]*(CIDXR[4:0] == 18 h)) + (IOW to
CSR1R);
CSR1R[0] = (CSR3I[4] + CSR3I[5] + CSR3I[6])*(MODE == 2 + MODE == 3) +
    (CSR3I[4]*(MODE == 1));
CIRQ = (CSR1R[0])*CEXTI[1];

| | |
|---|---|
| CSR3I[6, 5, 4] | The timer, record path, and playback path interrupt status bits of the Codec Status Register 3 |
| CFIG3I[7:6] | The record and playback path interrupt enables |
| CFIG1I[7:6] | The record and playback path DMA-I/O cycle selection bits |
| CDATAP | The codec indexed register data port |
| CIDXR[4:0] == 18 h | The codec indexed register index field is set to the Codec Status Register 3 |
| RDB[15:0] | The register data bus |
| CSR1R | The Codec Status Register 1 |
| CEXTI[1] | The global codec interrupt enable |

Two general purpose control signals are provided from Control Logic block 568, referenced, GPOUT [1:0]. The state of these digital outputs reflects the state of the corresponding control bit located in the External Control Register (CEXTI) in Registers block 566 (FIG. 7).

by clock driven circuits is described in application Ser. No. 07/918,622, entitled "Clock Generator Capable of Shut-Down Mode and Clock Generation Method," assigned to the common assignee of the present invention and incorporated herein for all purposes.

TABLE C11

| State of Pins | Pins and Registers Affected |
|---|---|
| High-impedance such that no current is consumed | SD[15:0], SA[11:0], SBHE#, IRQ[15, 12, 11, 7, 5, 3, 2], DRQ[7:5, 3, 1:0], DAK[7:5, 3, 1:0]#, TC, IOCHK#, IOR#, IOW#, IOCS16#, IOCHRDY, AEN, MD[7:0], CD_IRQ, CD_DRQ, CD_DAK#, CD_CS#, MIDIRX, MIDITX, GAMIN[3:0], GAMIO[3:0], XTAL1I, XTAL2I |
| Functional | RESET, SUSPEND#, C32KHZ, RAS#, BKSEL[3:0]#, GPOUT[1:0] |
| Forced high | ROMCS#, MWE# |
| Forced low | MA[10:0], RA[21:20], RAHLD#, PNPCS, XTAL1O, XTAL2O |
| Analog high-impedance | MIC[L, R], AUX1[L, R], AUX2[L, R], LINEIN[L, R], MONOIN, LINEOUT[L, R], MONOOUT, CFILT, IREF |

Table C12 describes what the PPWRI[2:0] bits cause to happen to CODEC 505 circuitry in power shut-down mode.

TABLE C12

PPWRI[0], Codec Analog Circuitry Enable. When this signal is low the codec analog circuitry is placed into a low-power state, and all the analog pins are placed into high-impedance mode. The codec outputs, LINEOUT[L, R] and MONOOUT (FIG. 2), will stay at their nominal voltage during the power suspend mode because of a weak resistor-divider networks connected at these outputs.
PPWRI[1], Codec Record Path Enable from High to Low. The record ADC 516 is immediately disabled. The record divide-down logic waits until the record path is in a state in which it is safe to stop the clocks and then disables the gate to the selected oscillator frequency. This gating is accomplished without possibility of glitching on the output of the gate.
PPWRI[1], Codec Record Path Enable from Low to High. The gated clock is re-enabled without the possibility of glitching and the ADC is re-enabled.
PPWRI[2]. Codec Playback Path Enable from High to Low. The playback DAC 514 is immediately disabled. The playback divide-down logic waits until the playback path is in a state in which it is safe to stop the clocks and then disables the gate to the selected oscillator frequency. This gating is accomplished without possibility of glitching on the output of the gate.
PPWRI[2], Codec Playback Path Enable from Low to High. The gated clock is re-enabled without the possibility of glitching and the DAC is re-enabled.

When the SUSPEND# pin becomes active (goes low), the CODEC behaves similarly to when it is placed into shut-down mode. Signal ISUSPRQ is logically ORed into I2LSUSPRQ and I2SSUSPRQ from the shut-down logic. ISUSPIP is logically ORed into I2LSUSPIP. If CODEC 505 is already in shut-down mode when SUSPEND# is asserted, then: (1) the I/O pins are changed to match the requirements of suspend mode described above; and (2) CODEC 505 analog circuitry in playback DAC 514, record ADC 516 and synth DAC 512 (if synth DAC 512 is embodied as a processing block within CODEC 505) is placed into low-power mode, if it is not already in that mode.

After the ISUSPRQ# is asserted, the logic in Control Logic block 568 waits for more than 100 microseconds before stopping the clocks of CODEC 505 and before disabling the oscillators. The 16 MHz clock ICLK16M and the 24 MHz clock ICLK24M are disabled (and later re-enabled) such that there are no distortions or glitches. After the clocks go into one of their high phases, they are held there until suspend mode is deactivated.

After SUSPEND# is deactivated, the external oscillators 560 are re-enabled, but ICLK16M and ICLK24M do not toggle again until the oscillators 560 have stabilized, 4 to 8 milliseconds later. This occurs after both oscillators 560 have successfully clocked 64K times. After the output clocks have been toggling for at least 100 microseconds, the ISUSPRQ# signal is de-asserted to allow the logic in the rest of CODEC 505 to operate. Signal ISUSPIP (suspend in progress) is active while the clocks are not valid. It is used to change the status of the I/O pins per the suspend requirements in Table C11.

The CODEC 505 can operate at either VCC=+3.3 or 5 volts. A voltage detect circuit in Control Logic block 568 (FIG. 7) determines whether the CODEC is in the 5 volt or 3.3 volt operating mode. The operating status is determined by the output of the voltage detect circuit register AVCCIS5. The operating voltage detect circuitry is utilized so the external computer system, or processor, can be informed that a signal cannot be generated greater than the operating VCC. For example, during 3.3 volt operation, a 4 volt signal cannot be generated. It also is used to set the analog full scale reference voltage and the range of drive capability of the digital I/O pins.

The CODEC 505 is capable of interacting with an external CD-ROM interface 568 (FIG. 7). Signals including chip select, DMA request, DMA acknowledge and interrupt request from the CD-ROM interface are supported by the CODEC 505.

An external serial EPROM or EEPROM 570 (FIG. 7) may be utilized by CODEC 505 to make the CODEC 505 Plug-n-Play (PNP) compatible with ISA, EISA or other industry standard buses or devices. Commercially available PNP software may be used to control the serial EPROM or EEPROM to configure the CODEC 505 for an external computer system or microprocessor. Where an external serial EPROM or EEPROM for PNP capability is not available, the external CD-ROM interface is not accessed by the CODEC.

A. Digital Signal Processing Portion of CODEC Playback Path.

The CODEC playback DAC 514 (FIG. 1), and synth DAC 512 if synth DAC 512 is embodied within CODEC 505, each include an interpolation block 800 (FIG. 8), a noise shaper 802 and a semi-digital FIR filter 804 for left and right channel stereo audio data. Only the left channel is shown in FIG. 8 and described herein. Operation of the right channel is identical. The operation of CODEC playback DAC 514 will be described herein. The operation of synth DAC 512 is identical if embodied within CODEC 505, otherwise the operation of the synth DAC may deviate.

A 16-bit digital audio signal 806 is output from Format Conversion block 534 (FIG. 1), and is input as a signed data signal to interpolator block 800 (FIG. 8) of playback DAC 514 where the signal is up-sampled. After the first three stages of interpolation, the multi-bit up-sampled digital audio signal 840 is output to the input of noise shaper 802, where it is quantized and converted to a 1-bit digital output signal 842. The 1-bit signal 842 is then input to semi-digital FIR filter 804 which filters out undesired out of band frequencies and converts the signal to an analog audio signal 808, which is available at the output of playback DAC 514. The left channel analog audio signal 808 is available as an input to left channel CODEC playback mixer 678 (FIG. 2).

Figure 9:
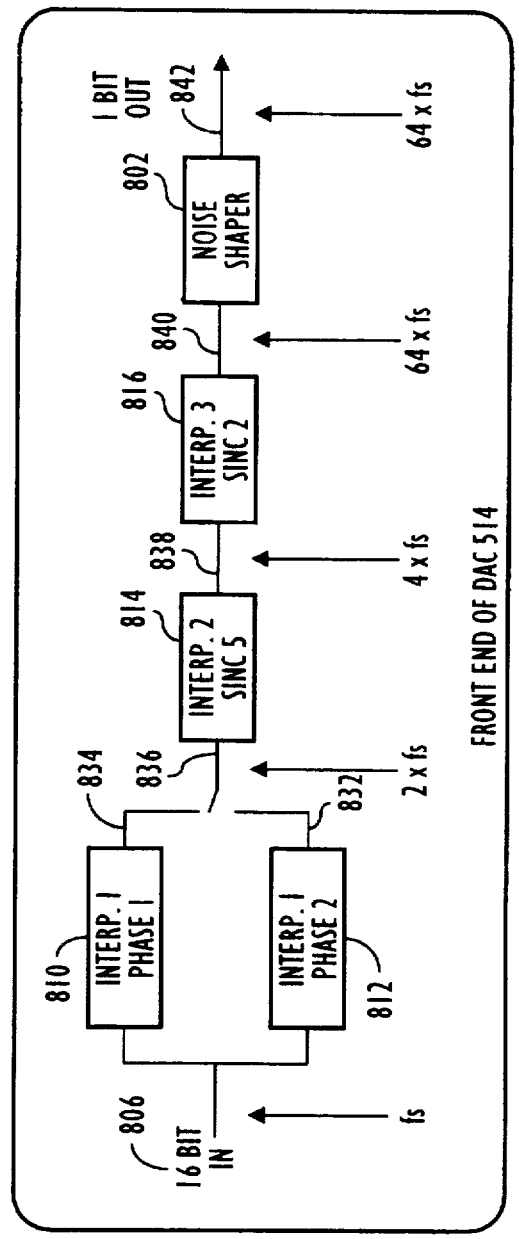
FIG. 9 is a block diagram of the digital portion, through the noise shaping block, of the digital to analog converter block of the present invention.

Referring to the front end of playback DAC 514 in FIG. 9, the 16-bit digital audio signal 806 is first interpolated, then quantized and noise-shaped. The playback DAC 514 receives as input, the 16-bit digital signal 806 at a sampling rate $f_s$ and produces at the output of interpolator block 800 (FIG. 8) a 1-bit signal 840 up-sampled to 64 times the sample rate for the 16-bit input signal 806 (64 times oversampling). Interpolation is performed in three stages in interpolator block 800, since one stage would require too complex a filter. The complexity of the circuitry is minimized by performing the 64×up-sampling interpolation in three stages, with interpolation up-sampling factors of 2 in Interp.1 blocks 810 and 812, 2 in Interp.2 block 814, and 16 in Interp.3 block 816. The noise shaper 802 is operated at the rate of 64×$f_s$.

Figure 10A:
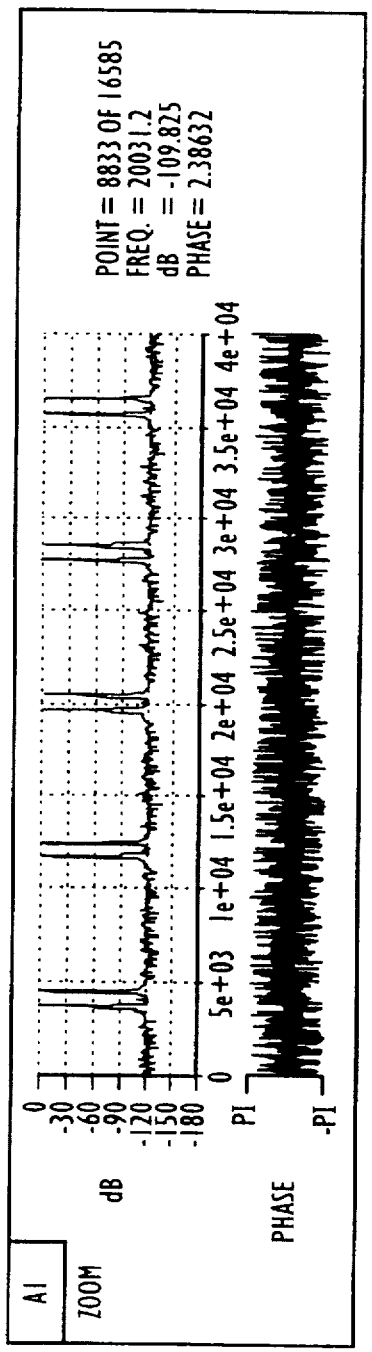
FIGS. 10a–10f are graphs showing output spectra of various stages of the DAC block.
Figure 10B:
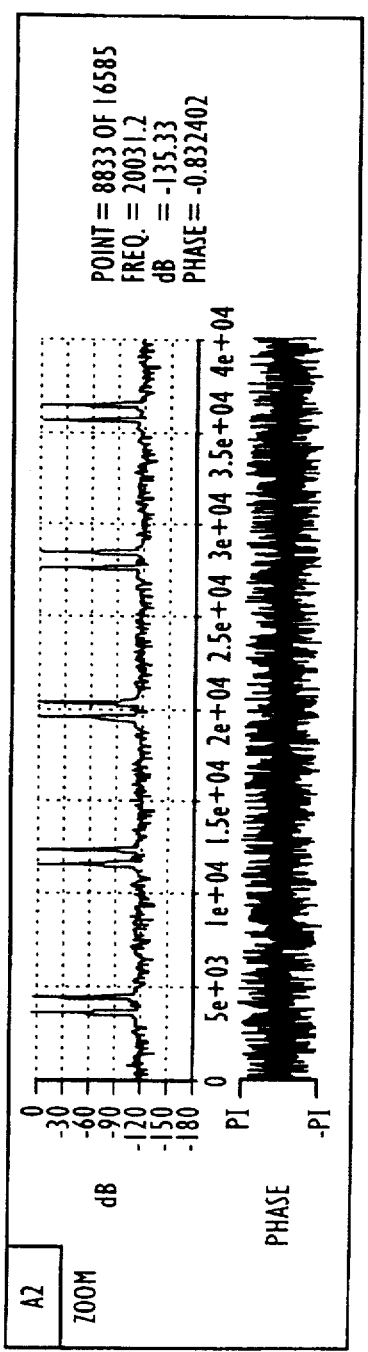
Figure 10C:
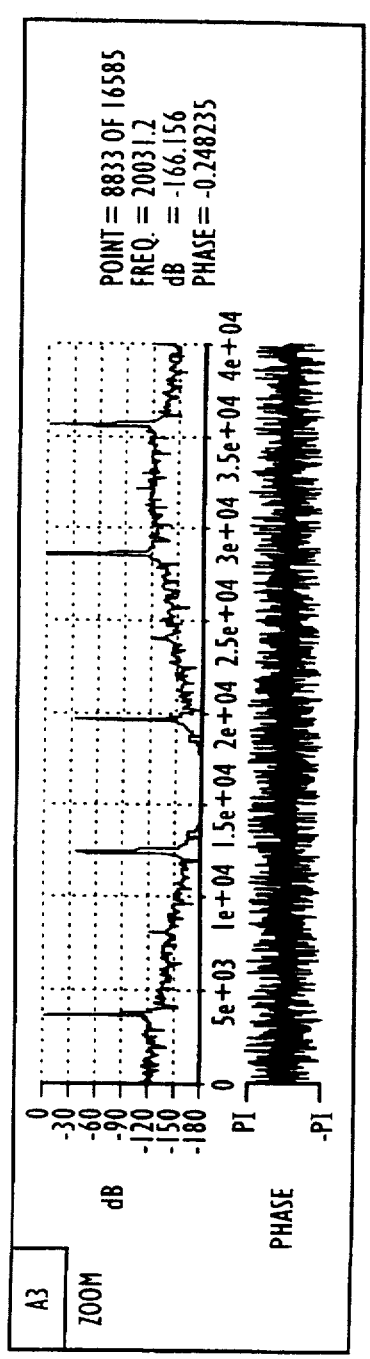

A typical input spectrum to Interp.1 block 810, 812 contains components of frequencies up to $f_s/2$, and their undesired images centered about integer multiples of $f_s$. See FIG. 10a for a typical input spectrum. To carry out the first interpolation in Interp.1 block 810, to $f_s'=2 \times f_s$, an FIR filter is preferably employed which has a passband extending to about 0.40 $f_s$ and has a stopband beginning at about 0.60 $f_s$. Preferably, the passband extends to about 0.45 $f_s$ and the stopband begins at about 0.55 $f_s$. The stopband attenuation of the filter is preferably greater than 100 dB, and the passband ripple is about +/−0.1 dB. This ensures that images of frequencies lower than 0.45 $f_s$, will be attenuated by at least 100 dB. Higher frequencies, however, will fall inside the filter's transition band together with their image, which will be attenuated less. The useful bandwidth is therefore about 3.6 KHz at $f_s=8$ KHz, or 19.8 KHz at $f_s=44.1$ KHz. The spectrum of the output of Interp.1 blocks 810, 812, for the input shown in FIG. 10a, is shown in FIG. 10b. The impulse response coefficients used in Interp.1 blocks 810, 812 are given in Table C13. The quantity of, and values associated with, these coefficients will be different if the passband or the stopband changes.

filter is used in this stage, which provides approximately 30 dB of image attenuation. The spectrum of the output of the second interpolator stage 814 is shown in FIG. 10c.

Figure 10D:
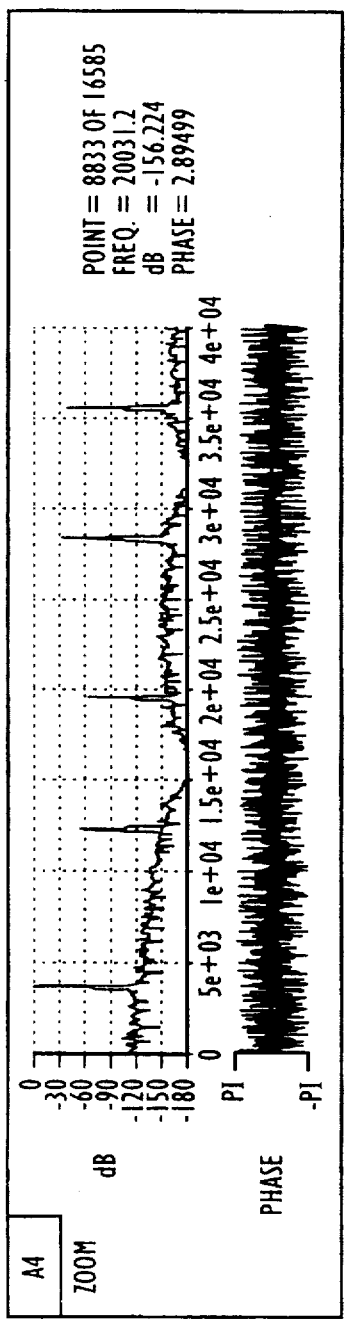

The third interpolation stage, Interp.3 block 816, changes the sampling rate further, by a factor of 16, to $f_s''=64\,f_s$. A $sinc^2$ interpolator, with a differential delay of two, is used. This interpolator serves the following purposes: it attenuates the images around 4 $f_s$ enough for the images to not exceed the noise levels introduced by the next block, i.e., noise shaper 802, and it also introduces a zero at 2 $f_s$, which together with interpolator stage 2 814, provides enough attenuation for images around 2 $f_s$. The spectrum for the output of the third stage 816 is shown in FIG. 10d.

Figure 10E:
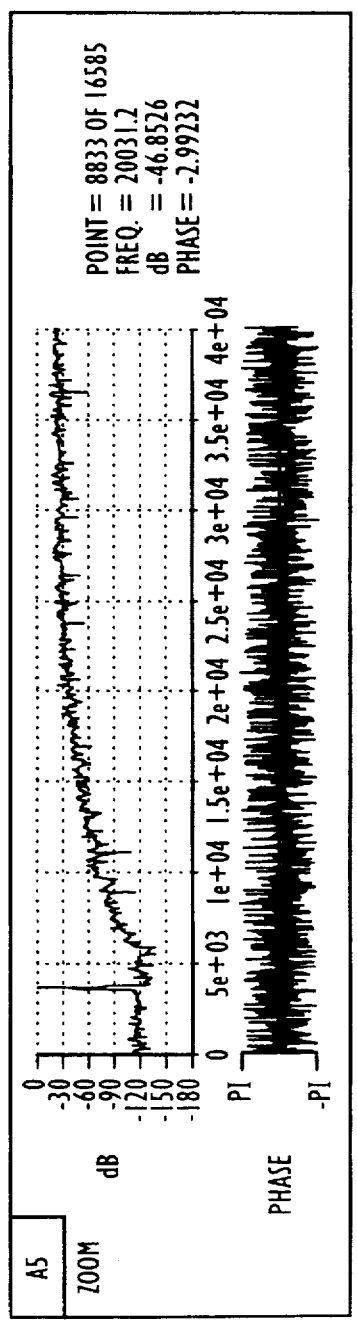

The final block in the front end of playback DAC, and the last stage of the interpolation filter, is a fifth order noise shaper 802 (FIG. 9). Noise shaper 802 converts the up-sampled multi-bit output 840 from the third interpolator stage 816 to a 1-bit signal 842. It shapes the noise according to a Chebyshev (equiripple) high-pass transfer function. The spectrum for the noise shaper 802 output appears in FIG. 10e. The operation of noise shaper block 802 is described herein.

Figure 10F:
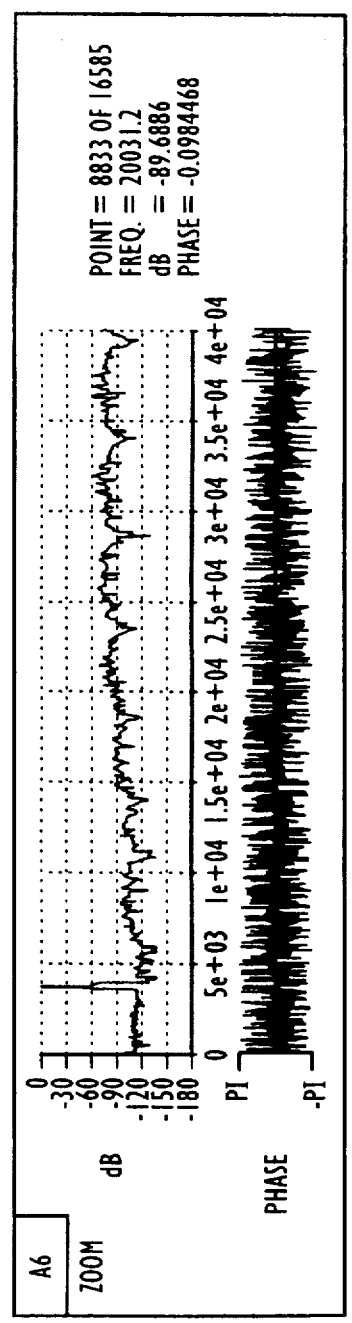
Figure 11:
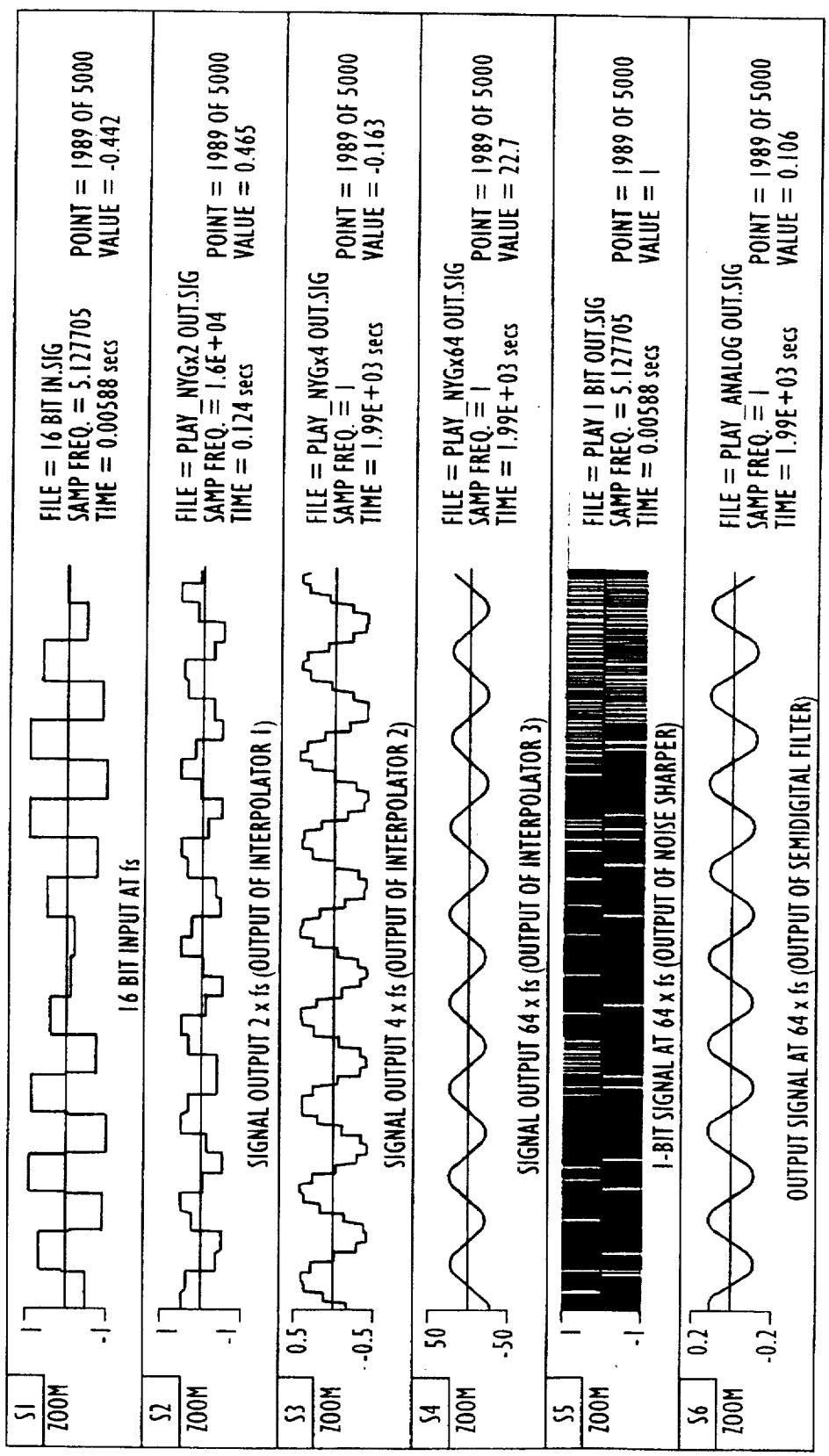
FIG. 11 shows six graphs representing time domain outputs of various stages of the DAC block.

The 1-bit signal from noise shaper 802 is then filtered with a semi-digital FIR filter 804 (FIG. 8). Semi-digital FIR filter 804 compensates for the attenuation caused by noise shaper 802, and also achieves a relatively flat noise floor extending to about 20 KHz when $f_s=8$ KHz. Noise shaper 802 has less than unity gain. The spectrum of the semi-digital FIR filter 804 analog output signal is shown in FIG. 10f. Time domain examples of a digital signal being processed by interpolator 800, noise shaper 802 and semi-digital FIR filter 804 are given in FIG. 11.

B. The Interpolator Processing Blocks (810, 812, 814 and 816).

A more detailed discussion of the processing blocks of the interpolator 800 follows.

TABLE C13

| 79 = no. of coefficients | | | |
|---|---|---|---|
| −1.750595981443146E-004 | −7.216534818457747E-003 | 1.955957938423135E-001 | 4.549103547838218E-003 |
| −5.739375461292618E-004 | 1.007676639535953E-003 | −6.226688012834663E-002 | 8.001874012051711E-003 |
| −5.153327657662000E-004 | 1.070997987748563E-002 | −1.91491393082353E-001 | −2.543307395855730E-003 |
| 8.216425148181775E-004 | −1.215334421266815E-002 | 9.780230912060471E-003 | −6.569909029193999E-003 |
| 2.422337249812696E-003 | −1.523525338456651E-002 | 7.790085682315272E-002 | 1.100983711228035E-003 |
| 1.735941907565683E-003 | 1.315138172619167E-002 | 5.627230811495017E-003 | 5.257362295505428E-003 |
| −1.142240053456121E-003 | 2.111058181205655E-002 | −5.441745673466367E-002 | −5.730365042081015E-005 |
| −1.986208128696001E-003 | −1.365370199884487E-002 | −1.125437480414670E-002 | −4.016836900623256E-003 |
| 1.151106002853597E-003 | −2.884850034250726E-002 | 3.935790420884279E-002 | −5.479374575604021E-004 |
| 3.091899813486715E-003 | 1.328095684947460E-002 | 1.328095684947460E-002 | 3.091899813486715E-003 |
| −5.479374575604021E-004 | 3.935790420884279E-002 | −2.884850034250726E-002 | 1.151106002853597E-003 |
| −4.016836900623256E-003 | −1.125437480414670E-002 | −1.365370199884487E-002 | −1.986208128696001E-003 |
| −5.730366042081015E-005 | −5.441745673466367E-002 | 2.111058181205655E-002 | −1.142240053456121E-003 |
| 5.257362295505428E-003 | 5.627230811495017E-003 | 1.315138172619167E-002 | 1.735941907565683E-003 |
| 1.100983711228035E-003 | 7.790085682315272E-002 | −1.523525338456651E-002 | 2.422337249812696E-003 |
| −6.569909029193999E-003 | 9.780230912060471E-003 | −1.215334421265815E-002 | 8.215425148181775E-004 |
| −2.543307395855730E-003 | −1.191491393082353E-001 | 1.070997987748563E-002 | −5.153327657662000E-004 |
| 8.001874012051711E-003 | −6.226688012834663E-002 | 1.087676639535953%-002 | −5.739375461292618E-004 |
| 4.549103547838218E-003 | 1.955957938423135E-001 | −7.216534818457747E-003 | −1.750595981443146E-004 |
| −9.457345733680010E-003 | 3.487257625348548E-001 | −9.457345733680010E-003 | |

This interpolative filtering is performed digitally, to avoid filtering in the analog domain when operating at the lowest rate, which would require a complex, or sharp transition, analog filter. Without such an analog filter, the images would appear at the output. The analog filter would have to have variable cutoff to accomodate changes in the sampling rate, which is not an acceptable solution.

The second interpolation stage, performed by Interp.2 block 814, changes the sampling rate to $f_s''=4\,f_s$. A $sinc^5$ 1. Interpolator 1.

Interp.1 stage, blocks 810, 812, is a symmetric (linear phase) FIR filter with 2N−1 taps (N distinct coefficients), with N equal to 40 in the preferred embodiment. The interpolation factor in this block is two. It is designed to have an attenuation of about 100 dB or more in the stopband, and approximately +/−0.1 dB or less ripple in the passband. The passband response also compensates for the rolloff introduced by the $sinc^5$ Interp. 2 stage 814, $sinc^2$ Interp.3 stage 816 and the semi-digital FIR filter 804 used in the playback DAC 514 D/A conversion process, as well as the gain variation introduced by the noise shaper 802.

The FIR filter in this Interp.1 stage 810, 812 includes passband compensation achieved by combining into one function all the frequency variations introduced by subsequent stages.

Referring to FIG. 9, when used as interpolator, the FIR filter acts on the input sequence of a digital values, 16-bit input signal 806, whereby every other data sample is equal to zero (for interpolation by 2). This means one odd output sample signal 832 is computed using only odd coefficients in Interp.1 phase 2 block 812, and the next even output sample signal 834 is computed using only even coefficients in Interp.1 phase 1 block 810, but on the same set of 16-bit input signals 806. This leads to a polyphase (in this case, 2-phase) implementation shown as Interp.1 810 and 812 in FIG. 9, in which two sub-filters execute in parallel, and the filter outputs 832 and 834 are interleaved by known methods to create the Interp.1 signal output 836 which is then provided to Interp.2 block 814.

In the time domain, the even and odd output signals 834, 832 from the two phases of Interp.1 810, 812 are:

$$y_1(n) = \sum_{k=0}^{\frac{N-1}{2}} h_{2k}x(n-k)$$

for even output signal 834, phase 1 (even coefficients), and for odd output signal 832, phase 2 (odd coefficients).

$$y_2(n) = \sum_{k=0}^{\frac{N-1}{2}-1} h_{2k+1}x(n-k)$$

All delays are at the input sampling rate.

The Interp.1 blocks 810, 812 filter has phase linearity, which means the impulse response is symmetric with respect to the midpoint, with the symmetry condition given as:

$$h_k = h_{N-1-k} \quad k = 0, \ldots N-1 \quad (N \text{ odd})$$

Figure 12:
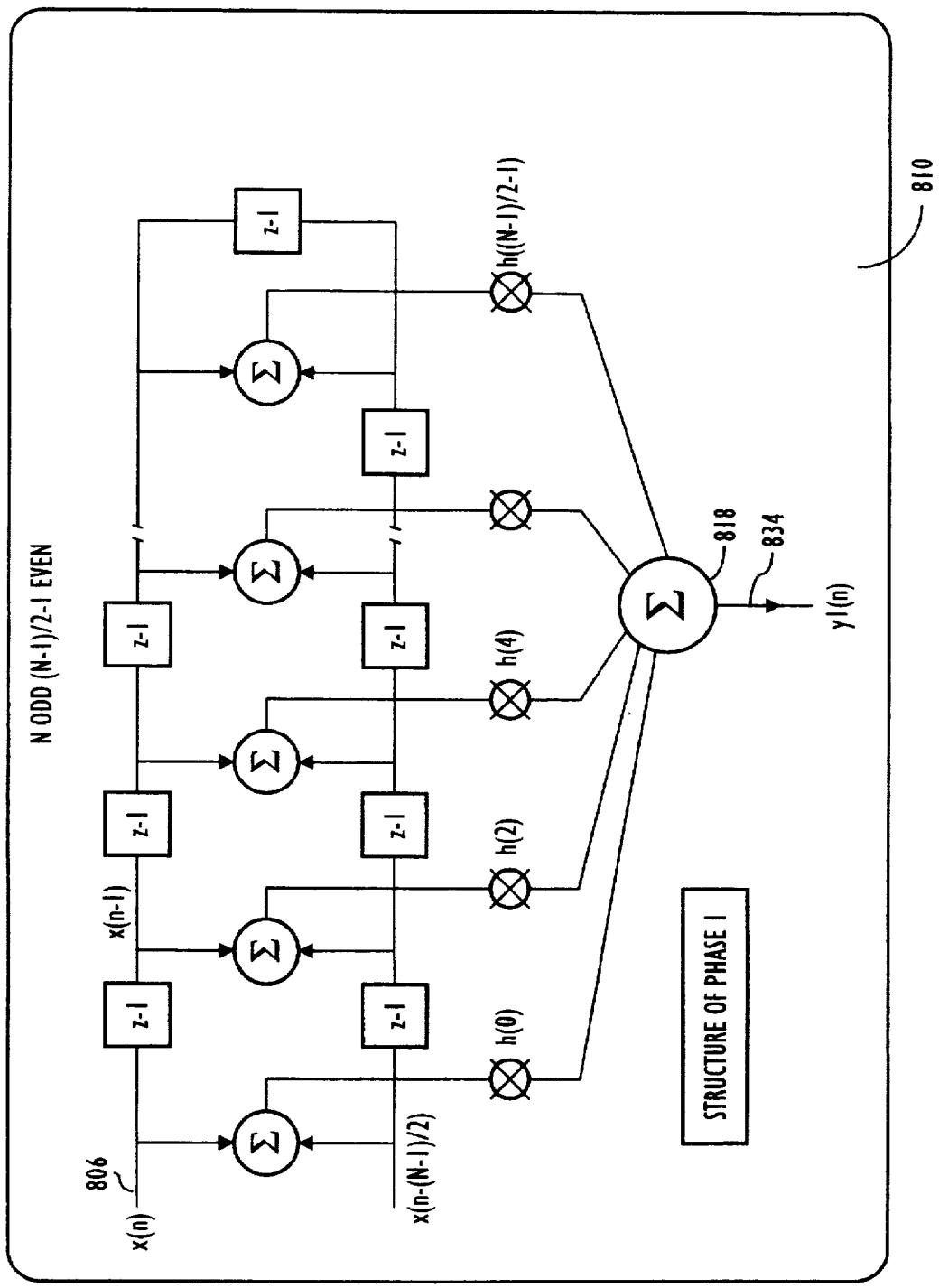
FIG. 12 is a schematic representation of the Interp.1 block, phase 1 of FIG. 9.
Figure 13:
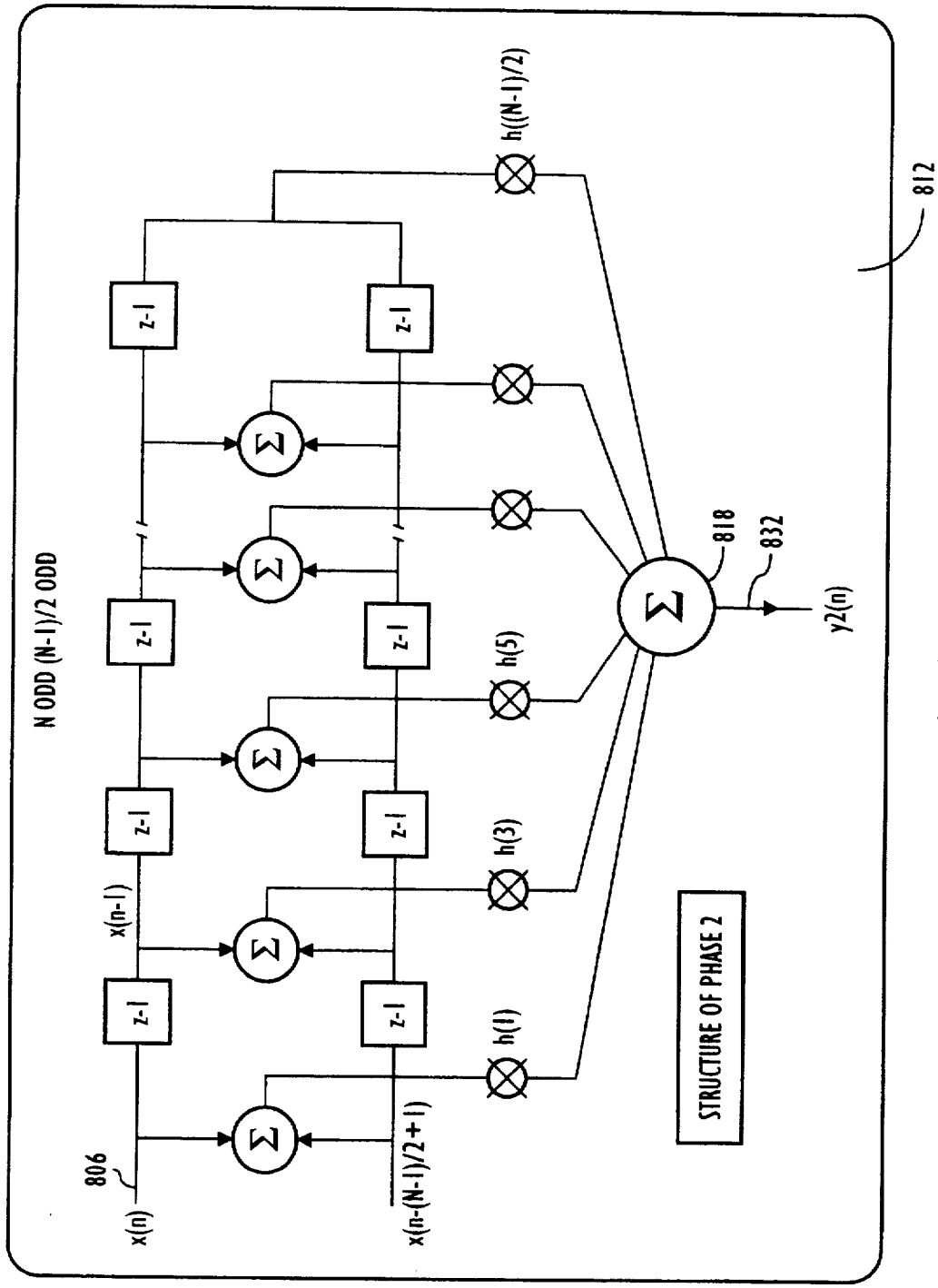
FIG. 13 is a schematic representation of the Interp.1 block, phase 2 of FIG. 9.

This is reflected in the structure of the filters 810 and 812, shown in FIGS. 12 and 13, respectively.

Typically, the impulse response contains coefficients which are very small. For large stopband attenuations, these coefficients are very important. To preserve the precision, the coefficients are scaled so the magnitude of each is between one-half and one. Then, in the summation circuit 818 (FIGS. 12, 13), the partial products associated with the smallest coefficients are added first, scaled, and then added to the products associated with the next higher-valued coefficient, and so on. This means the sums cannot be performed in an arbitrary order (e.g., in the same order as the taps are updated), unless the word width is further increased to preserve the precision.

2. Interpolator 2.

The second interpolator stage 814, Interp.2, is a sinc$^5$ interpolator filter. The interpolation factor in this block is two. Due to the attenuation that will be provided by the semi-digital filter 804, a high attenuation around $2 \times f_s$, is not needed, and a relatively simple structure is used. The transfer function of the filter for Interp.2 stage 814 is:

$$H_2(Z) = \left( \frac{1}{2} \ \frac{1-z^{-2}}{1-z^{-1}} \right)^5 = \frac{1}{32}(1+z^{-1})^5$$

expanding to, $$H_2(z) = \frac{1}{32}(1 + 5z^{-1} + 10z^{-2} + 10z^{-3} + 5z^{-4} + z^{-5})$$

Thus, the Interp.2 filter 814 has only integer coefficients. The passband rolloff has to be compensated in Interp.1 blocks 810, 812.

Since the Interp.2 filter 814 interpolates by two, it operates on a sequence in which every other sample is zero, as illustrated below:

| 1 | 5 | 10 | 10 | 5 | 1 |
|---|---|---|---|---|---|
| $x_N$ | 0 | $x_{n-1}$ | 0 | $x_{n-2}$ | 0 |
| 0 | $x_n$ | 0 | $x_{n-1}$ | 0 | $x_{n-2}$ |

Figure 14:
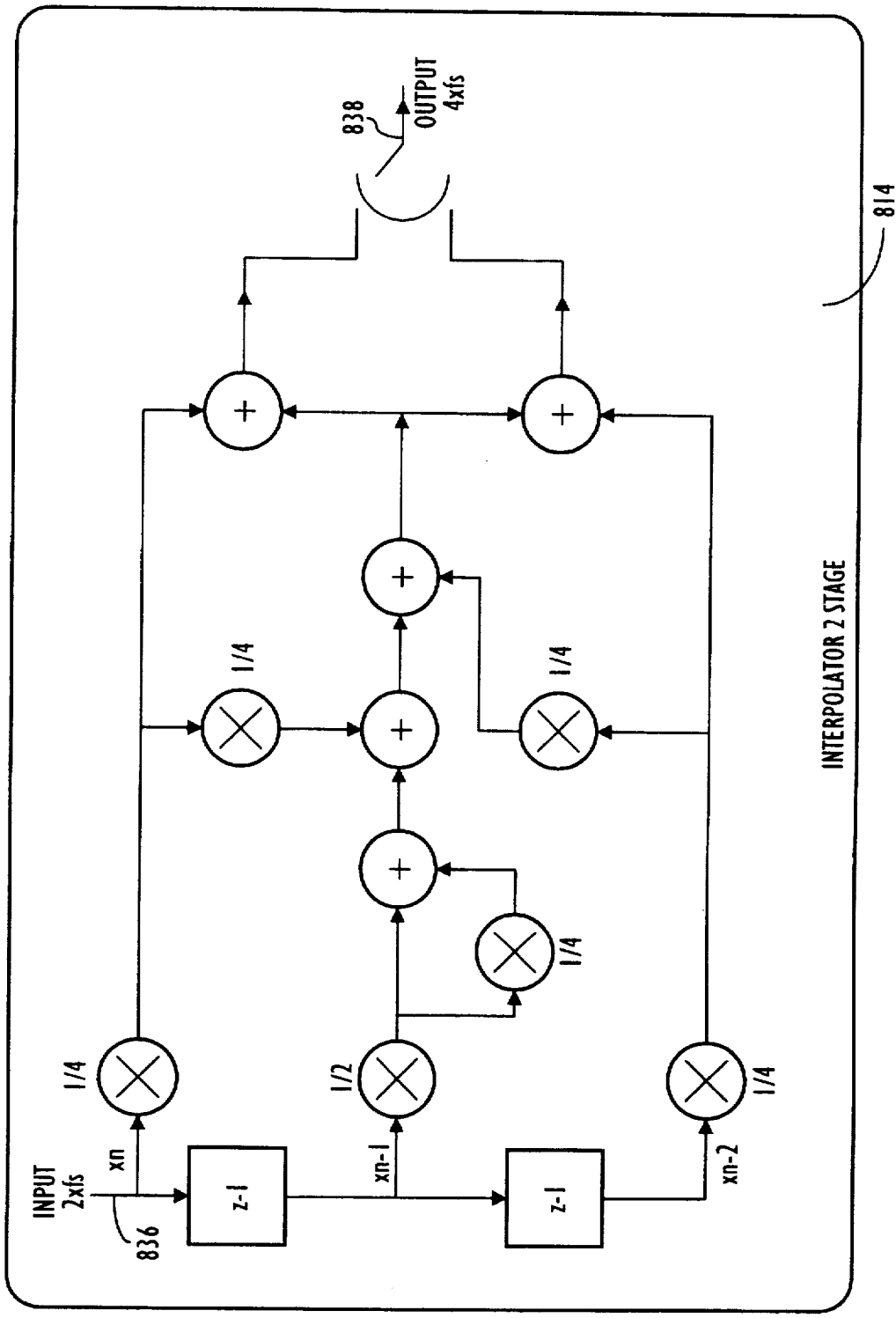
FIG. 14 is a schematic representation of the Interp.2 block of FIG. 9.

This leads to a two-phase implementation as shown in FIG. 14, similar to Interp.1 810, 812 blocks, where:

$$H_{2a}(z) = \frac{1 + 10z^{-1} + 5z^{-2}}{32} = \frac{1 + 10z^{-1} + z^{-2}}{32} + \frac{4z^{-2}}{32}$$

$$H_{2b}(z) = \frac{5 + 10z^{-1} + z^{-2}}{32} = \frac{1 + 10z^{-1} + z^{-2}}{32} + \frac{4}{32}$$

Figure 15:
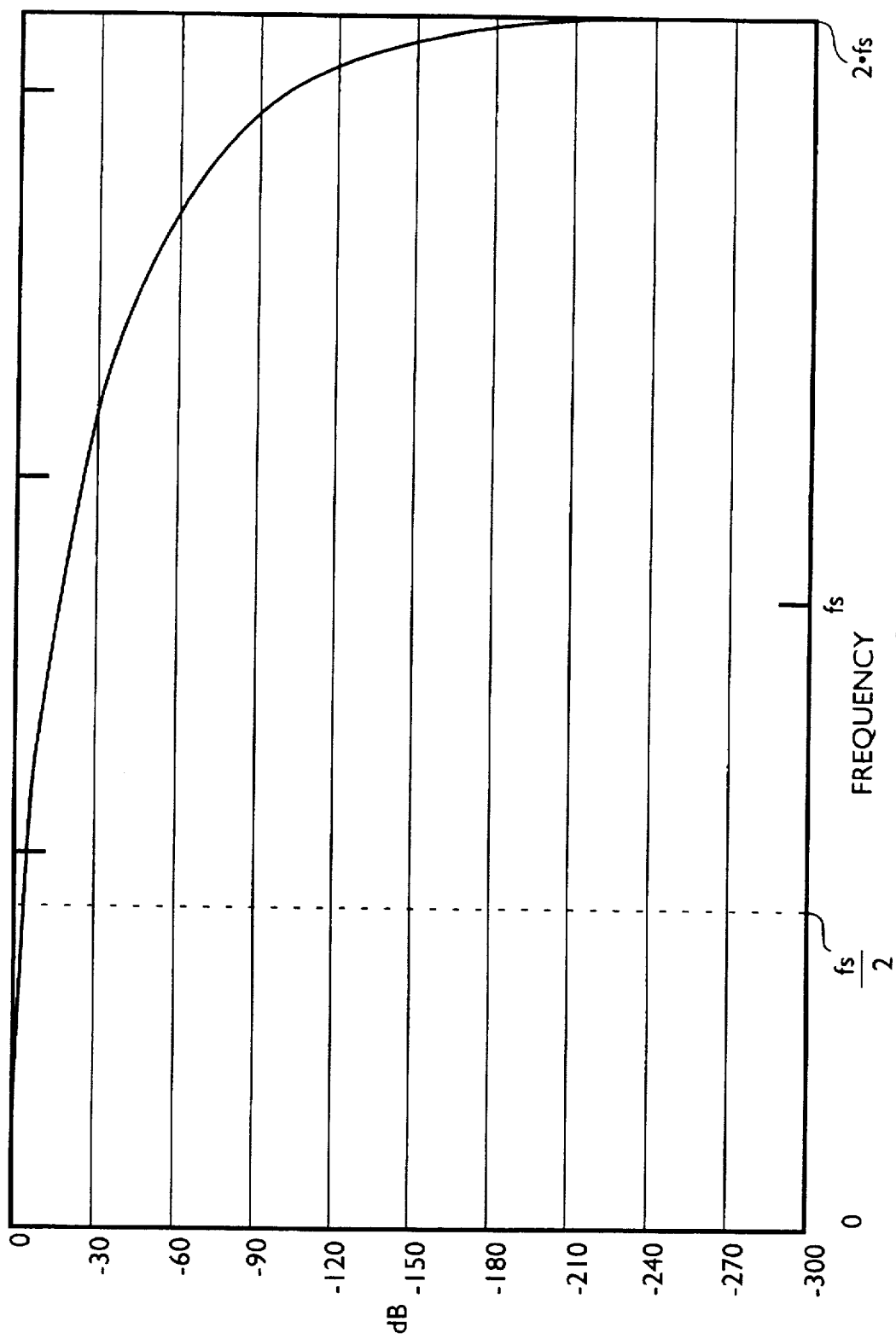
FIG. 15 is a graph of the frequency response of the Interp.2 block of FIG. 9.
Figure 16:
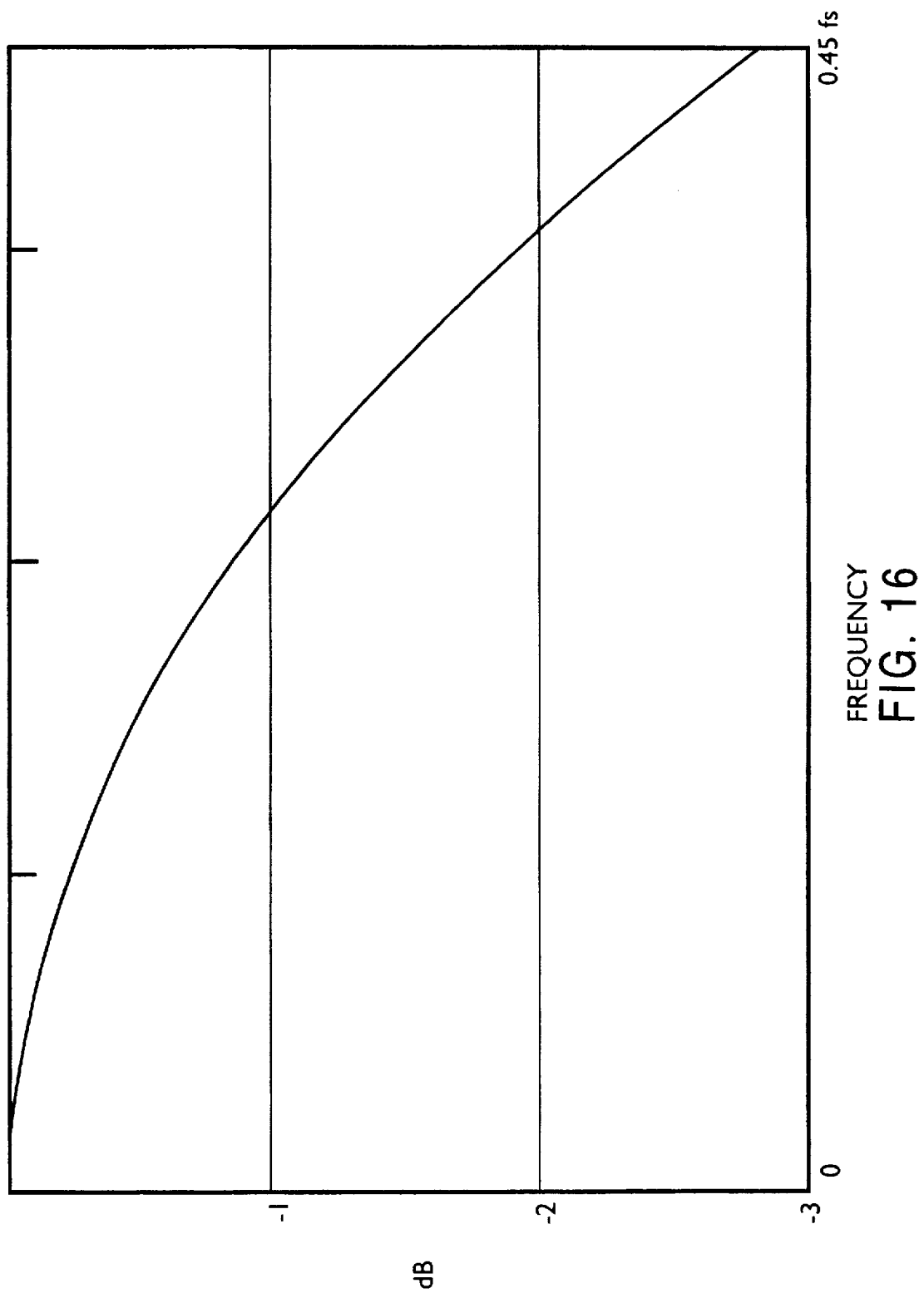
FIG. 16 is a graph representing the in-band roll-off of the Interp.2 block of FIG. 9.

In $H_2a$ and $H_2b$, the delays occur at the input sampling rate $f_s$. The common term in the transfer functions in both phases of Interp.2 filter 814 results in some hardware savings. FIG. 14 shows an embodiment of the Interp.2 814 filter. A scaling factor of 2 has been applied throughout. The frequency response, normalized to DC, is shown in FIGS. 15 and 16.

3. Interpolator 3.

The transfer function of Interp.3 block 816 is:

$$H_3(z) = \left[ \frac{1-z^{-32}}{1-z^{-1}} \right]^2$$

Figure 17:
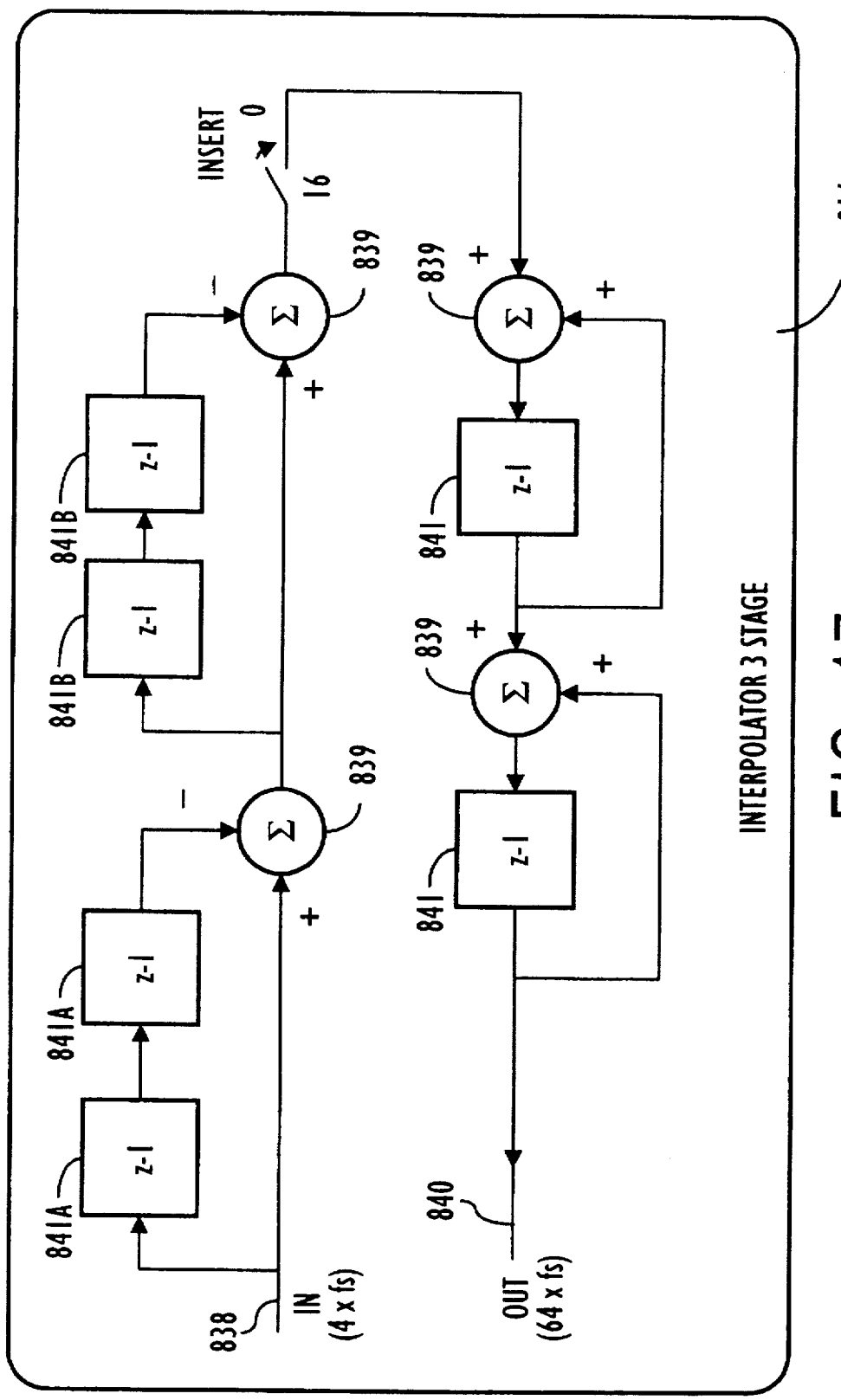
FIG. 17 is a schematic representation of an embodiment of the Interp.3 block of FIG. 9.

The interpolation factor in this block is 16. The differential delay is 2. The order is 2. One embodiment of the implementation of the transfer function is given in FIG. 17. The differentiators 839 run at a lower rate, while the integrators 841 run at a higher rate.

The differentiators 841 having 2 delays can be factored into a differentiator with one delay and a 2-sample accumulator, where:

| $1 - z^{-2}$ | = | $(1 + z^{-1})$ | · | $(1 - z^{-1})$ |
|---|---|---|---|---|
| | | 2-sample accumulator | | simple differentiator |

Figure 18:
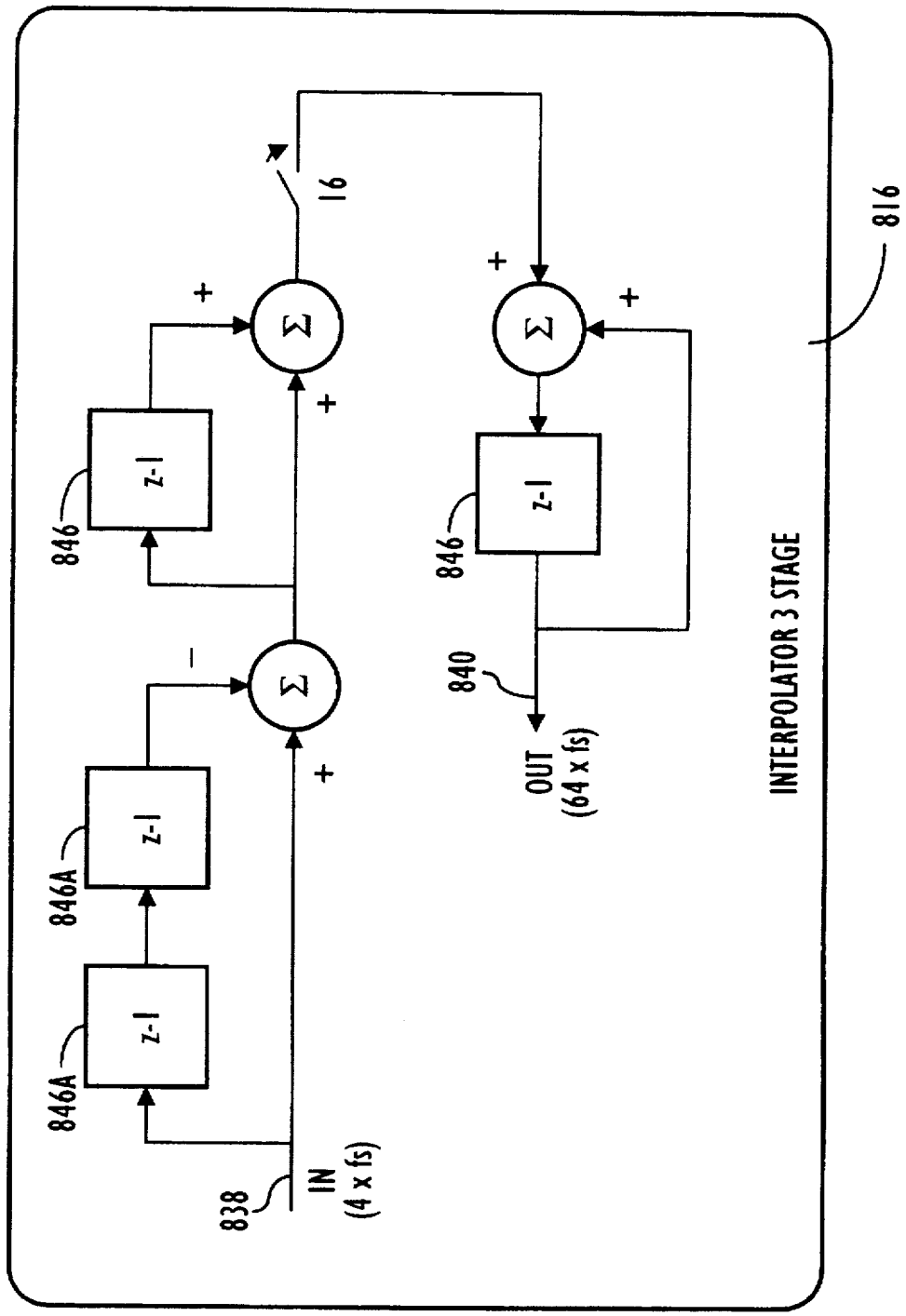
FIG. 18 is a schematic representation of another embodiment of the Interp.3 block of FIG. 9.
Figure 19A:
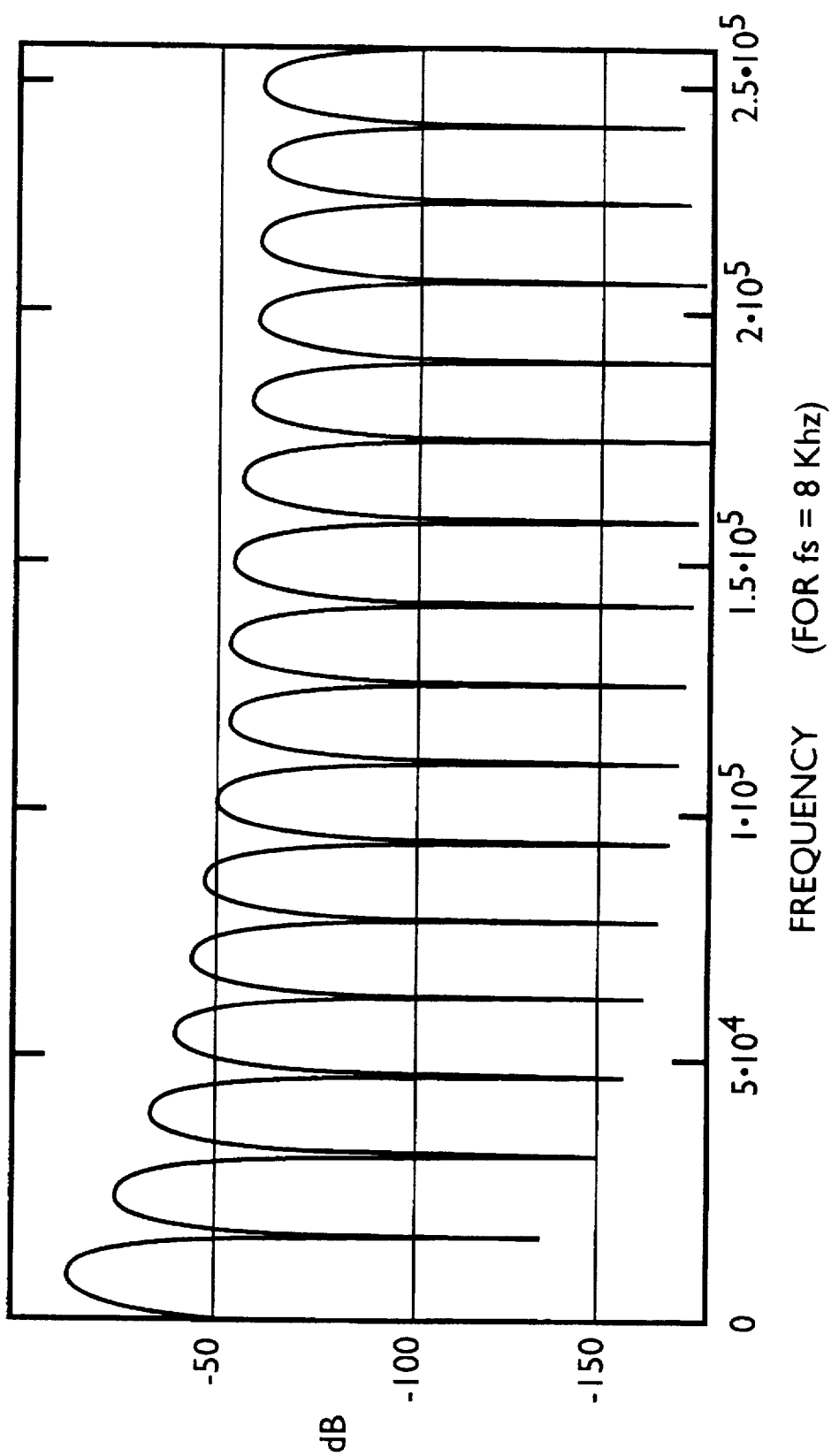
FIG. 19a is a graph of the frequency response of the Interp.3 block of FIG. 9.
Figure 19B:
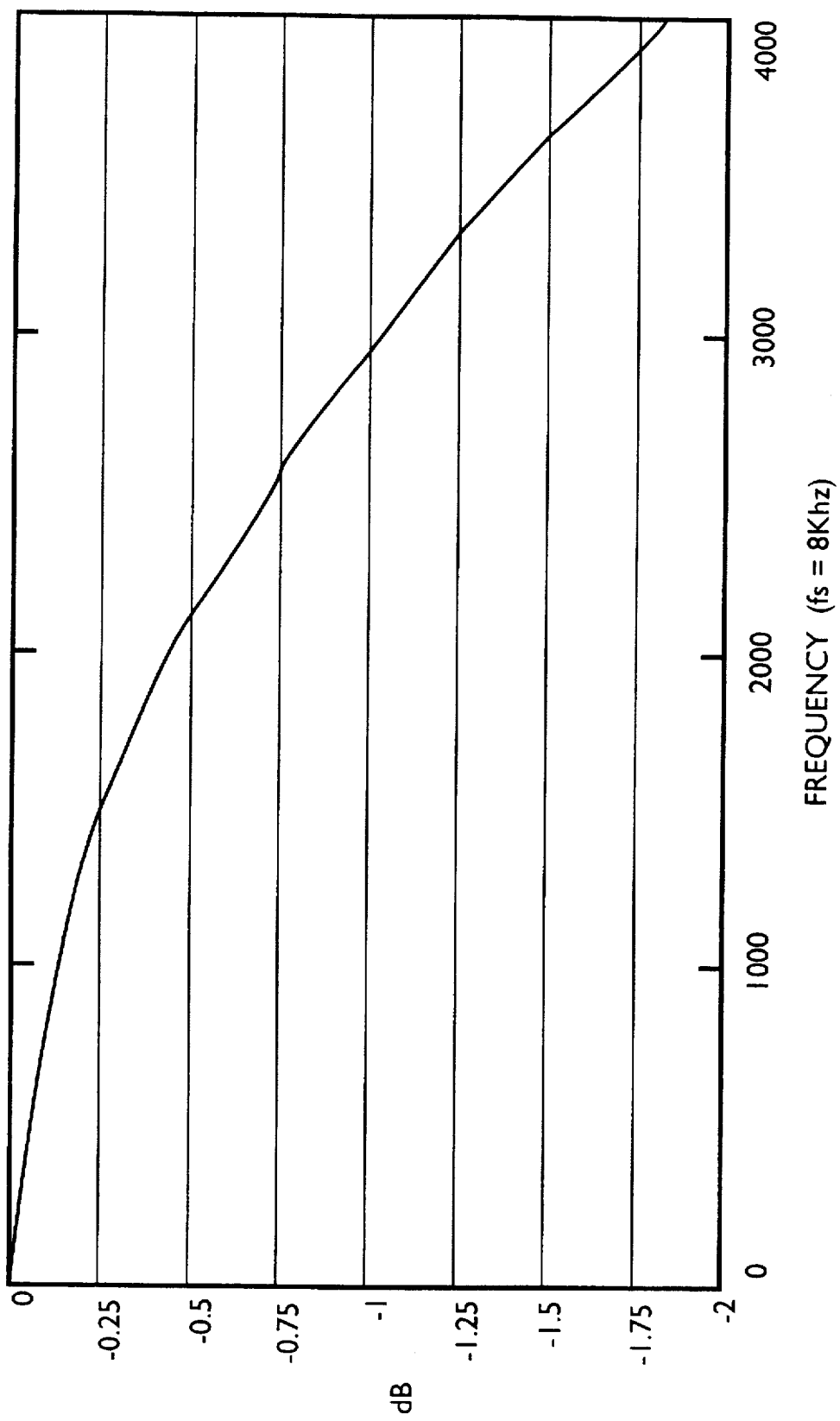
FIG. 19b is a graph of the passband roll-off of the Interp.3 block of FIG. 9.

Another embodiment for Interp.3 block 816 is shown in FIG. 18. Each signal sample is used 16 times by the integrator 846, which runs at the highest rate. A zero is introduced a 4 $f_s$. The double delay blocks 841A,B in FIG. 17 and 846A in FIG. 18 operate to introduce an additional zero at 2 $f_s$, which together with interpolator 2 sinc$^5$ filter 814, provides enough image attenuation and is more economical than using a sinc$^6$ filter for interpolator 2 filter 814. The frequency response of interpolator 3 filter 816, normalized to DC, is shown in FIGS. 19a and 19b.

C. Noise Shaper.

Figure 20:
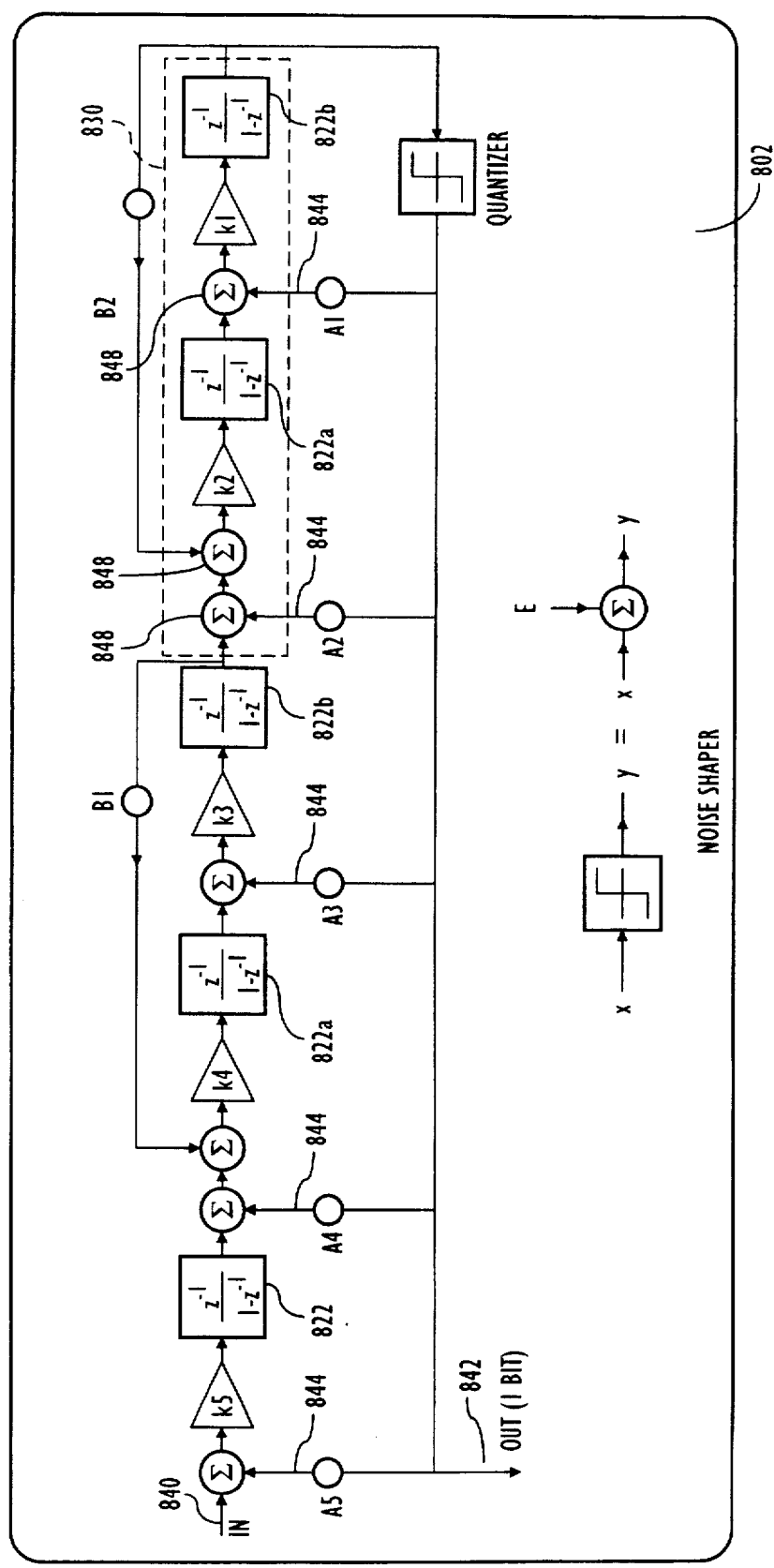
FIG. 20 is a schematic representation of the noise shaper block of FIG. 9.

The final stage of the interpolator, noise shaper block 802 (FIGS. 8, 9), takes the multi-bit signal output from the third interpolator stage, interpolator 3 block 816 (FIG. 9), and converts it to a 1-bit signal while shaping the quantization noise according to a high-pass function. The block diagram implementation for the shaper 802, which is a preferably fifth order shaper, is shown in FIG. 20. The 1-bit output signal 842 is also input to integrators 822. Integrator 822 inputs must have suitable scaling factors, k1–5, to make the loop stable for a predetermined range of input amplitudes, as determined by the remainder of the digital path shown in FIG. 20. The simple additive noise model shown in FIG. 20 is used to represent the quantizer.

Two transfer functions are defined for this circuit: a signal Transfer Function (STF) Y/X, where X is the digital audio input signal 840 (FIG. 9), and a noise Transfer Function (NTF) Y/E, where E is the quantization noise (modeled as additive, white, uniformly distributed noise). Once the NTF is fixed, the STF is also determined. Since the system is not a FIR filter, the response is no longer strictly phase-linear. The phase variation in the passband, however, is very small, on the order of about 0.05 degrees, and the magnitude variation can easily be compensated in Interp.1 810, 812 block.

Figure 21:
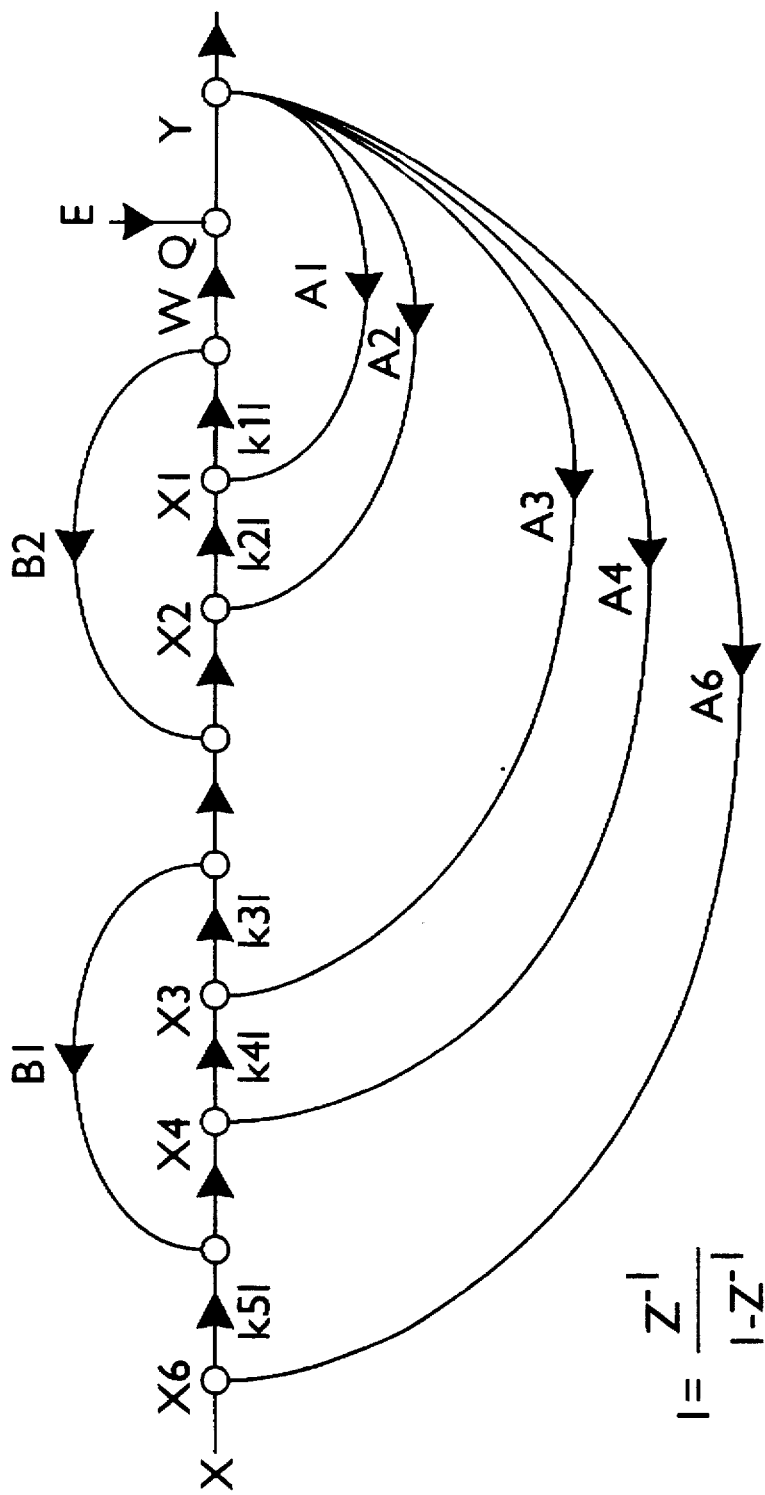
FIG. 21 is a signal flow graph (SFG) of the noise shaper block in FIG. 9.

A signal flow graph (SFG) for noise shaper block 802 is shown in FIG. 21. The transfer functions are developed as follows:

Forward Path Gains:

The cumulative gains of all possible direct paths from input to output:

For X:
$T_1 = \kappa_1\kappa_2\kappa_3\kappa_4\kappa_5 \cdot I^5$

For E:
$T_1 = 1$

Loop Gains:

The gains of all closed loops.

$G_1 = A_1 k_1 I = A_1 K_1 \cdot I$ $G_2 = A_2 k_1 k_2 I^2 = A_2 K_2 \cdot I^2$ $G_3 = A_3 k_1 k_2 k_3 I^3 = A_3 K_3 \cdot I^3$ $G_4 = A_4 k_1 k_2 k_3 k_4 I^4 = A_4 K_4 \cdot I^4$ $G_5 = A_5 k_1 k_2 k_3 k_4 k_5 I^5 = A_5 K_5 \cdot I^5$ $L_1 = I^2 \cdot B_1 k_3 k_4 = B_1 \left( \dfrac{K_4}{K_2} \right) \cdot I^2$ $L_2 = I^2 \cdot B_2 k_1 k_2 = B_2 K_2 \cdot I^2$ Non-touching Loops:

The products of the gains of sets of loops without any common nodes are calculated. First, pairs of non-touching loops have to be identified. Then, triplets are found, then sets of 4, etc. In the preferred embodiment, only pairs of non-touching loops exist.

$L_1, G_1$
$L_1, G_2$
$L_1, L_2$

Determinant:

This is defined in terms of the loop gains as Δ=1−Σ loop gains+Σ gains of pairs of NTL−Σ gains of triplets of NTL+ . . .

NTL=non-touching loops

In the preferred embodiment, there are no triplets of non-touching loops, so $\Delta = 1 - \sum_{i=1}^{5} G_i - \sum_{i=1}^{2} L_i + L_1(G_1 + G_2) + L_1 L_2$ Sub-determinants:

$\Delta_k$=Δsetting to zero gains of loops touching forward path k

For X:
All loops are touched by T1, so
$\Delta_1 = 1$

For E:
$\Delta_1 = \Delta$ for $T_1 = 1 - L_1 - L_2 + L_1 L_2$

The transfer functions can then be constructed for X and E using Mason's rule, where $$TF = \dfrac{1}{\Delta} \sum_k T_k \Delta_k$$

The transfer functions have the form:

$H_E(z) \equiv \dfrac{Y(z)}{E(z)} =$ $\dfrac{1}{D} \left\{ (1-z^{-1})^5 - \left( B_1 \dfrac{K_4}{K_2} + B_2 K_2 \right) z^{-2}(1-z^{-1})^3 + \right.$ $\left. (B_1 B_2 K_4) z^{-4}(1-z^{-1}) \right\} = \dfrac{1}{D} \{(1-z^{-1})^5 -$ $2C_1 z^{-2}(1-z^{-1})^3 + C_2 z^{-4}(1-z^{-1})\}$ for noise, and $H_X(z) \equiv H_{NSS}(z) = \dfrac{Y(z)}{X(z)} = \dfrac{1}{D}$ for the signal, where $D = (1-z^{-1})^5 + \sum_{k=1}^{5} W_k \cdot z^{-k}(1-z^{-1})^{5-k}$ Where, referring to FIG. 20, $W_1 = -A_1 K_1$ $W_2 = A_2 K_2 - B_1 \left( \dfrac{K_4}{K_2} \right) - B_2 K_2$ $W_3 = -A_3 K_3 + A_1 B_1 \left( \dfrac{K_1 K_4}{K_2} \right)$ $W_4 = -A_4 K_4 + A_2 B_1 K_4 + B_1 B_2 K_4$ $W_5 = -A_5 K_5$ The coefficients are chosen to match a Chebyshev function, which yields equiripple quantization noise in the passband and a flat stopband. The values for Ai and the Bi are obtained from the Ci and Wi in the above equations by matching the noise TF to the desired shaping function.

Preferably, a function is chosen for the NTF which has zeros equally spaced inside the noise stopband (i.e., the signal band), and a flat high-frequency response. For the preferred embodiment, the stopband edge, the stopband attenuation and the filter order must be determined. Since the stopband attenuation is preferably at least 90 dB and the stopband edge is about 6 KHz for an input sampling rate of 8 KHz, or equivalently, about 36 KHz at the maximum sampling rate of 48 KHz, the filter order preferred is five. That is, the noise stop band for noise shaper 802 extends to at least 0.70 $f_s$, and preferably to about 0.75 $f_s$ which is about 0.25 $f_s$ past the signal band. This allows the design requirements for the semi-digital filter to be less stringent.

First, the continuous time zeros and poles are obtained, where the zeros are given by:

$sz_m := j \cdot \omega_r \cdot \cos\left[ (2 \cdot m + 1) \dfrac{\pi}{2 \cdot N} \right]$ and the poles by:

$$sp_m := j \cdot \omega_r \cdot \left[ \cosh\left(\frac{a\sinh(\epsilon 1)}{N}\right) \cdot \cos\left[(2 \cdot m + 1) \cdot \frac{\pi}{2 \cdot N}\right] + j \cdot \sinh\left(\frac{a\sinh(\epsilon 1)}{N}\right) \cdot \sin\left[(2 \cdot m + 1) \cdot \frac{\pi}{2 \cdot N}\right] \right]$$

where N=5, m ranges from 0 to 4, $\omega_r$=stopband edge= $2\pi.36000$, and $\epsilon 1$ is related to the attenuation G given in dB by:

$$\epsilon 1 := \sqrt{10^{\frac{G}{10}} - 1}$$

Figure 22:
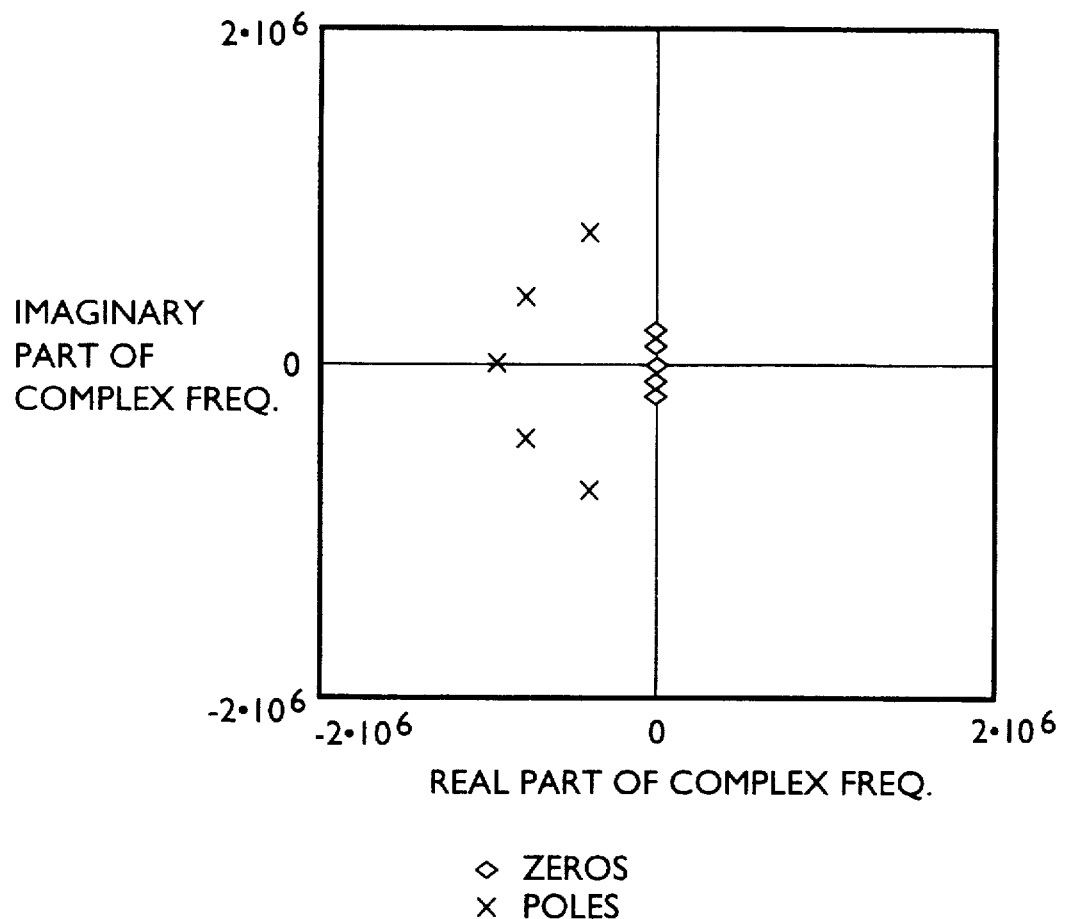
FIG. 22 is a plot of the poles and zeros in the s plane for the noise shaper block of FIG. 9.
Figure 23:
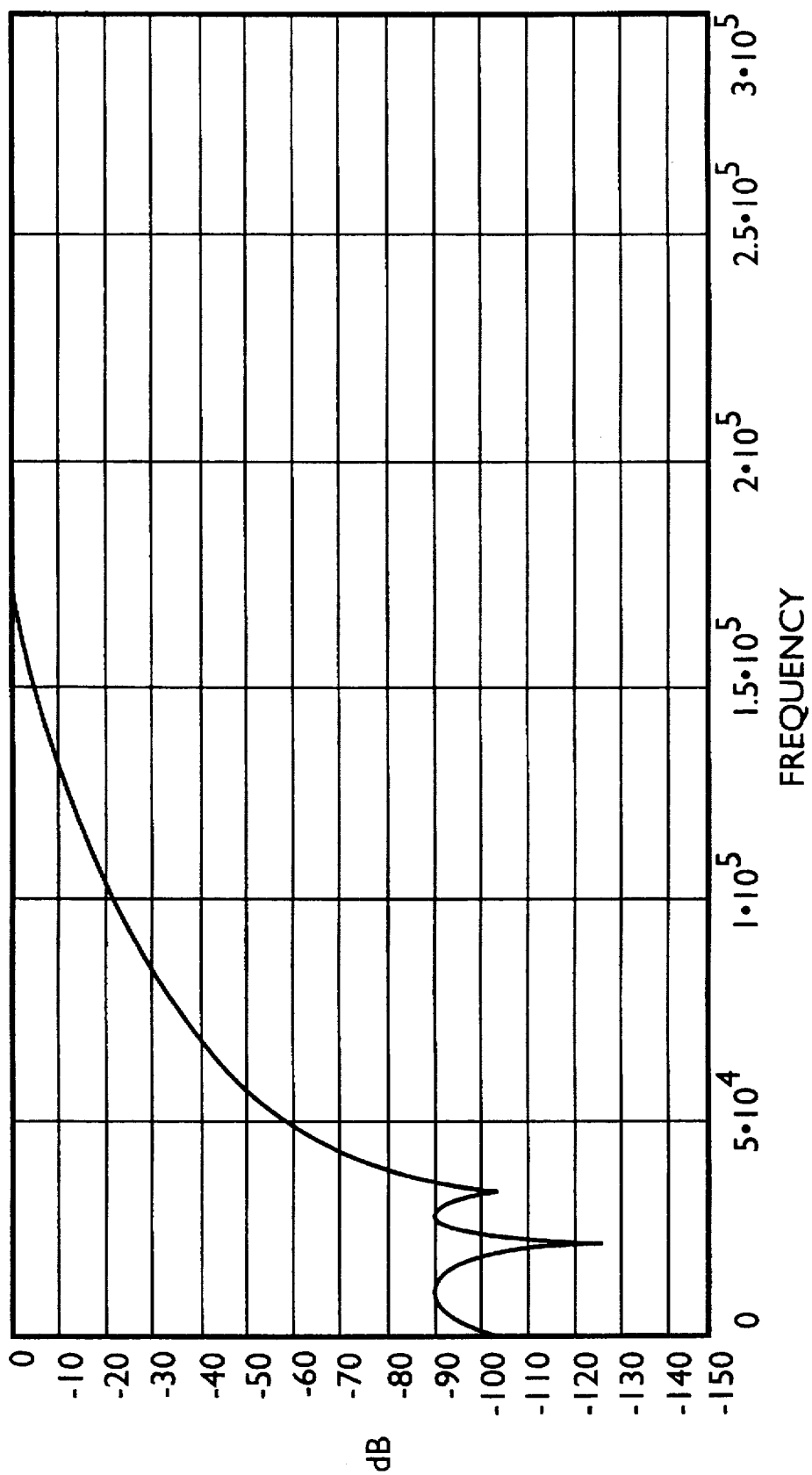
FIG. 23 is a plot of the noise transfer function magnitude of the noise shaper block of FIG. 9.

The pole-zero diagram in the s-plane is shown in FIG. 22. A plot of the frequency response out to 300 KHz is shown in FIG. 23. Next, the discrete zeros and poles are obtained using the bilinear transformation:

$$zz_k := \frac{1 + \frac{T}{2} \cdot sz_k}{\left(1 - \frac{T}{2} \cdot sz_k\right)}$$

$$zp_k := \frac{1 + \frac{T}{2} \cdot sp_k}{\left(1 - \frac{T}{2} \cdot sp_k\right)}$$

where $T=1/f_s$, and $f_s=64\times48$ KHz=3.072 MHz. This is the highest sampling rate at which the noise shaper 802 will operate, and corresponds to an oversampling factor of 64 times the highest sampling rate for the input signal. It should be understood, however, that the noise shaper will be operated at other (lower) sampling rates.

Solving these equations yields:

$$zz = \begin{bmatrix} 0.9975109 - j0.06994157 \\ 0.99906389 - j0.04325901 \\ 1 \\ 0.99906389 + j0.04325901 \\ 0.9975109 + j0.06994157 \end{bmatrix}$$

$$zp = \begin{bmatrix} 0.8584977 - j0.2857872 \\ 0.749702598 - j0.154122604 \\ 0.715349592 \\ 0.749702596 + j0.154122604 \\ 0.8584977 + j0.2857872 \end{bmatrix}$$

Figure 24:
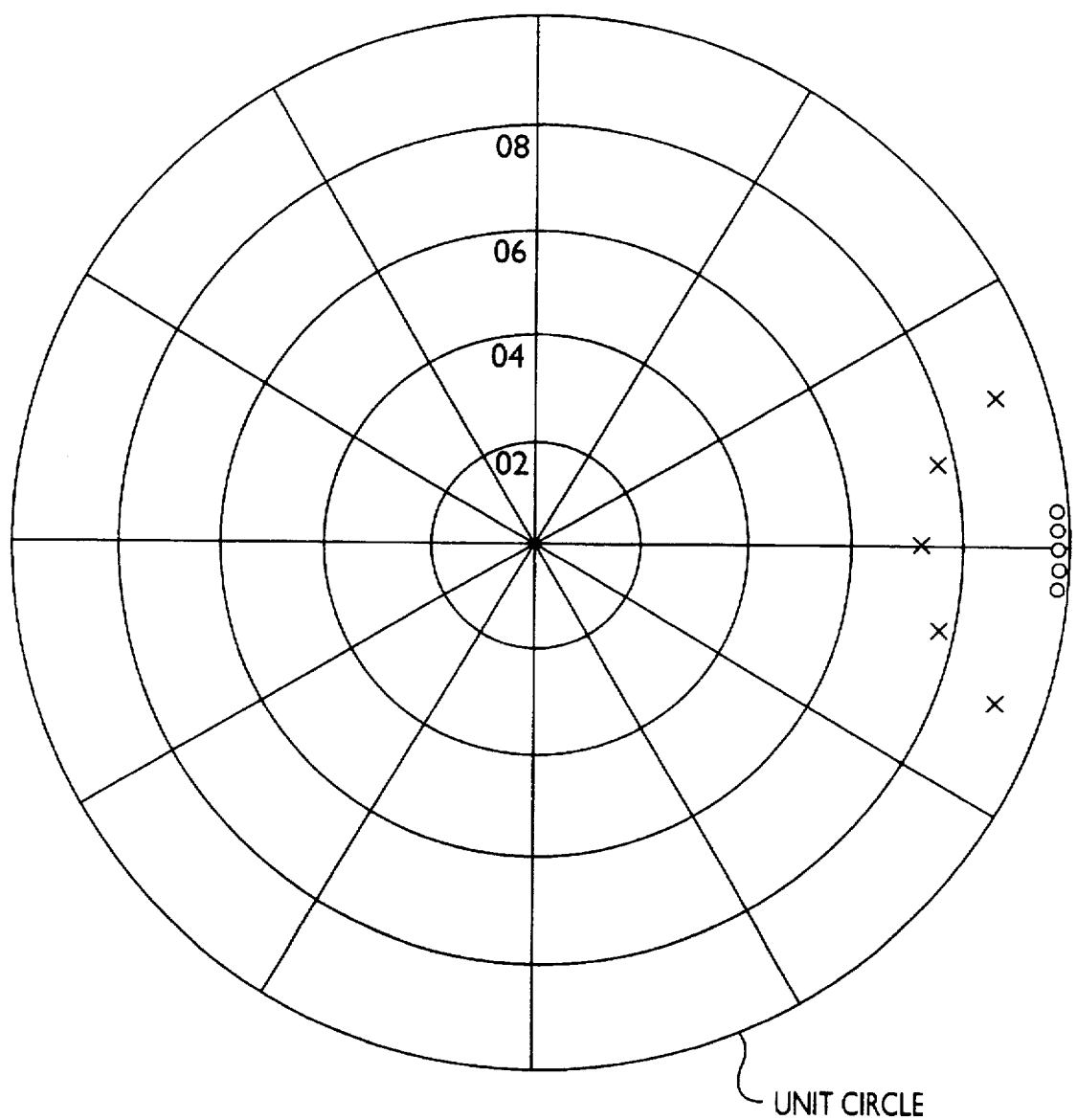
FIG. 24 is a plot of the poles and zeros in the z plane of the noise shaper block of FIG. 9.

FIG. 24 gives the pole-zero diagram in the z-plane for noise shaper 802.

$$K := \frac{\left[\prod_{k=0}^{N-1} (-1 - zz_k)\right]}{\left[\prod_{k=0}^{N-1} (-1 - zp_k)\right]}; \quad K = 1.707272441$$

Figure 25:
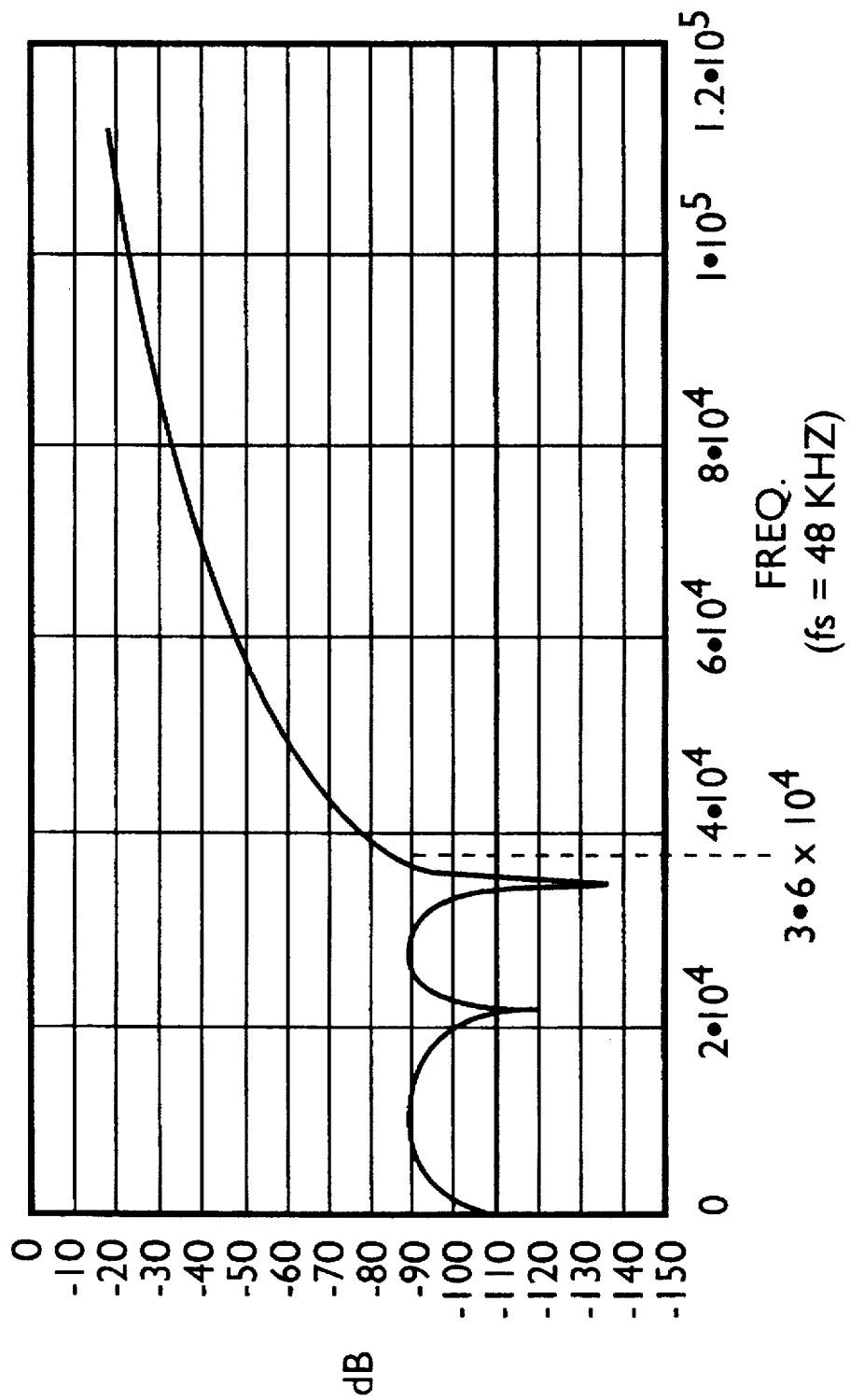
FIG. 25 is a graph of the noise transfer function of the noise shaper filter of FIG. 9.

K is the gain of the NTF at $f=f_s/2$ (or $z=-1$) and is an important parameter for stability. The preferred frequency response of the discrete filter for noise shaper 802 is shown in FIG. 25.

The numerator in the transfer function of the selected structure must be matched to the discrete filter. The nature of the zeros that can be realized with it are found by equating the numerator of the noise NTF to zero, producing:

$$(z-1)\cdot[(z-1)^4 - 2C_1(z-1)^2 + C_2] = 0$$

One root of this equation is $z1=1$; the others are obtained from $$(z-1)^4 - 2C_1(z-1)^2 + C_2 = 0$$

C1, C2 are not independent because they are related to B1, B2 as specified by the NTF equation, previously described. The solution yields the other 4 roots as follows:

$$z_{2,3} = 1 \pm \sqrt{B_1 \frac{K_4}{K_2}} \qquad z_{4,5} = 1 \pm \sqrt{B_2 K_2}$$

The structure shown in FIGS. 20 and 21 allows one zero at DC ($z=1$) and two pairs of complex zeros, both of which have real parts equal to 1. This means they cannot be on the unit circle. However, if their angles are small enough, they will still provide enough attenuation. To actually be able to have zeros on the unit circle, more feedback loops (i.e., more coefficients) must be used.

Figure 26:
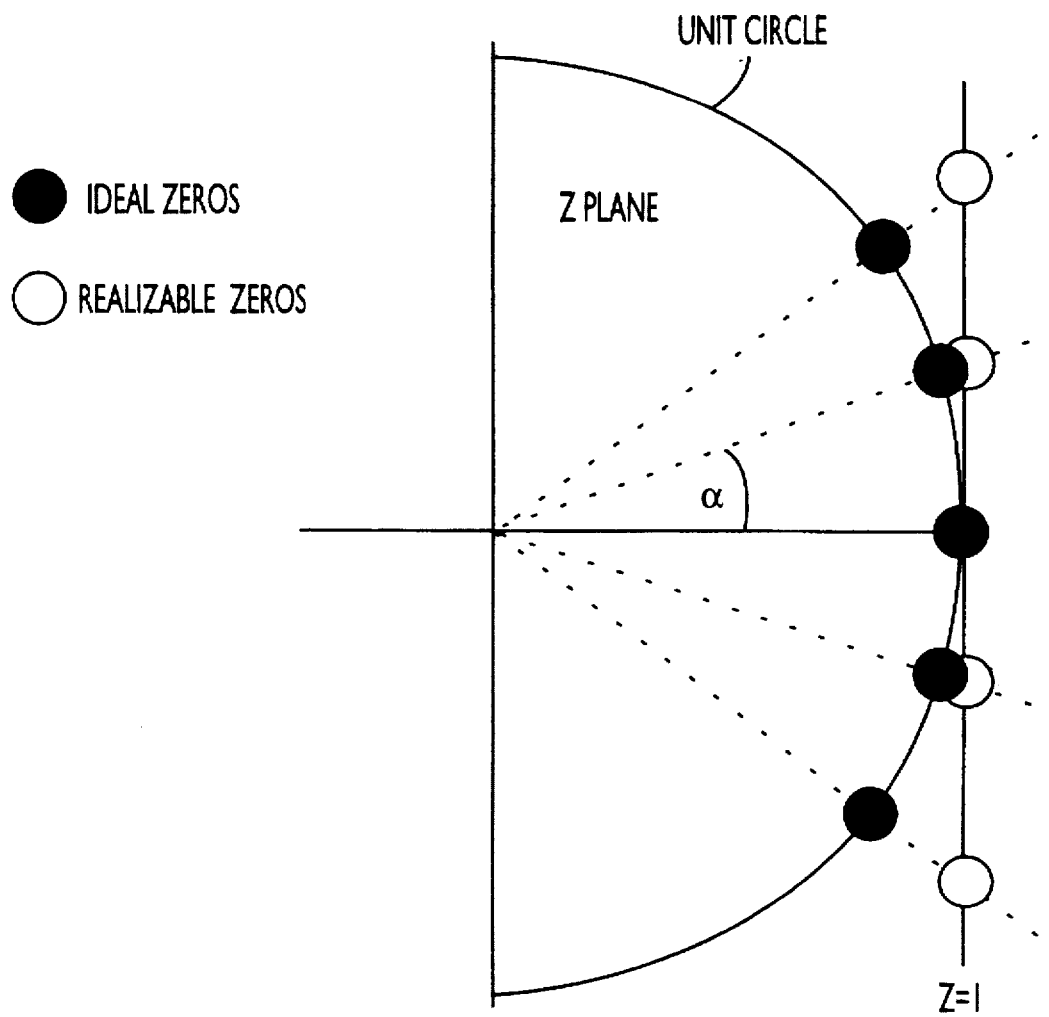
FIG. 26 is a plot of the ideal and realizable zeros of the noise filter block of FIG. 9.

B1, B2 are selected so that preferably the zeros have the same angles as those required by the ideal transfer function. This is shown in FIG. 26, where the angles are exaggerated.

B1, B2 are then selected to be negative, in which case the angle, $\alpha$, of the respective zero is:

$$\alpha_{2,3} = \tan^{-1}\left(\sqrt{B_1 \frac{K_4}{K_2}}\right)$$

$$\alpha_{4,5} = \tan^{-1}(\sqrt{B_2 K_2})$$

The values of B1, B2 also depend on the values of K2 and K4. In general, the scaling coefficients k, shown in FIG. 20 as $k_1-k_5$, should be adjusted so noise shaper 802 is stable for the desired range of amplitudes for the input signals. Preferably, this is accomplished with the following criteria in mind:

The scaling coefficients, k, are equal for the 2nd and 4th integrators 822a (FIG. 20) and also for the third and fifth integrators 822b. This permits re-utilization of one hardware block 830 containing two integrators 822 and associated adders 848 without having to change scaling coefficients, k. Hardware block 830 is enclosed inside the dotted line in FIG. 20.

The scaling coefficients, k, are only negative powers of two, so only hardwired shifts are used, without multiplication.

The scaling coefficients, k, equalize the signal range at the integrator 822 outputs so the required word width is uniform throughout the structure.

The scaling coefficients, k, set the stability range to be compatible with the desired input signal levels.

The scaling coefficients obtained for an input signal range of +/−0.25 dB preferably, are:

$k_1=0.25$ $k_2=0.5$ $k_3=0.25$ $k_4=0.5$ $k_5=0.125$

The feedback coefficient values B1 and B2, for positioning the zeros, are obtained using these scaling factors and preferably are:

B1=−0.039326867 (quantized to $\frac{1}{32}(1+\frac{1}{4})=0.0390625$)

B2=−0.0149988 (quantized to $\frac{1}{64}(1-\frac{1}{32})=0.01513671875$)

The coefficients for denominator D in the NTF equation, $H_E(z)$, above, are obtained by matching the terms in equal powers of z in the equation:

$$D = (1-z^{-1})^5 + \sum_{k=1}^{5} W_k \cdot z^{-k} \cdot (1-z^{-1})^{5-k}$$

with the denominator D of the discrete filter to obtain the Wi values, shown above, and then, working through the equations given, together with the values of B1 and B2. In this embodiment, for FIG. 20, a unique solution exists. The preferred feedback coefficients $A_1$–$A_5$, for positioning the poles, are:

$A_1$=−4.273

$A_2$=−4.3682518

$A_3$=−5.2473373413

$A_4$=−1.7628879547

$A_5$=−1.28061104

These feedback coefficients can be quantized to 10 bits, before the STF begins to be affected inside the signal band, where:

$A_1$=−4.265625

$A_2$=−4.359375

$A_3$=−5.234375

$A_4$=−1.75

$A_5$=−1.265625

Figure 27:
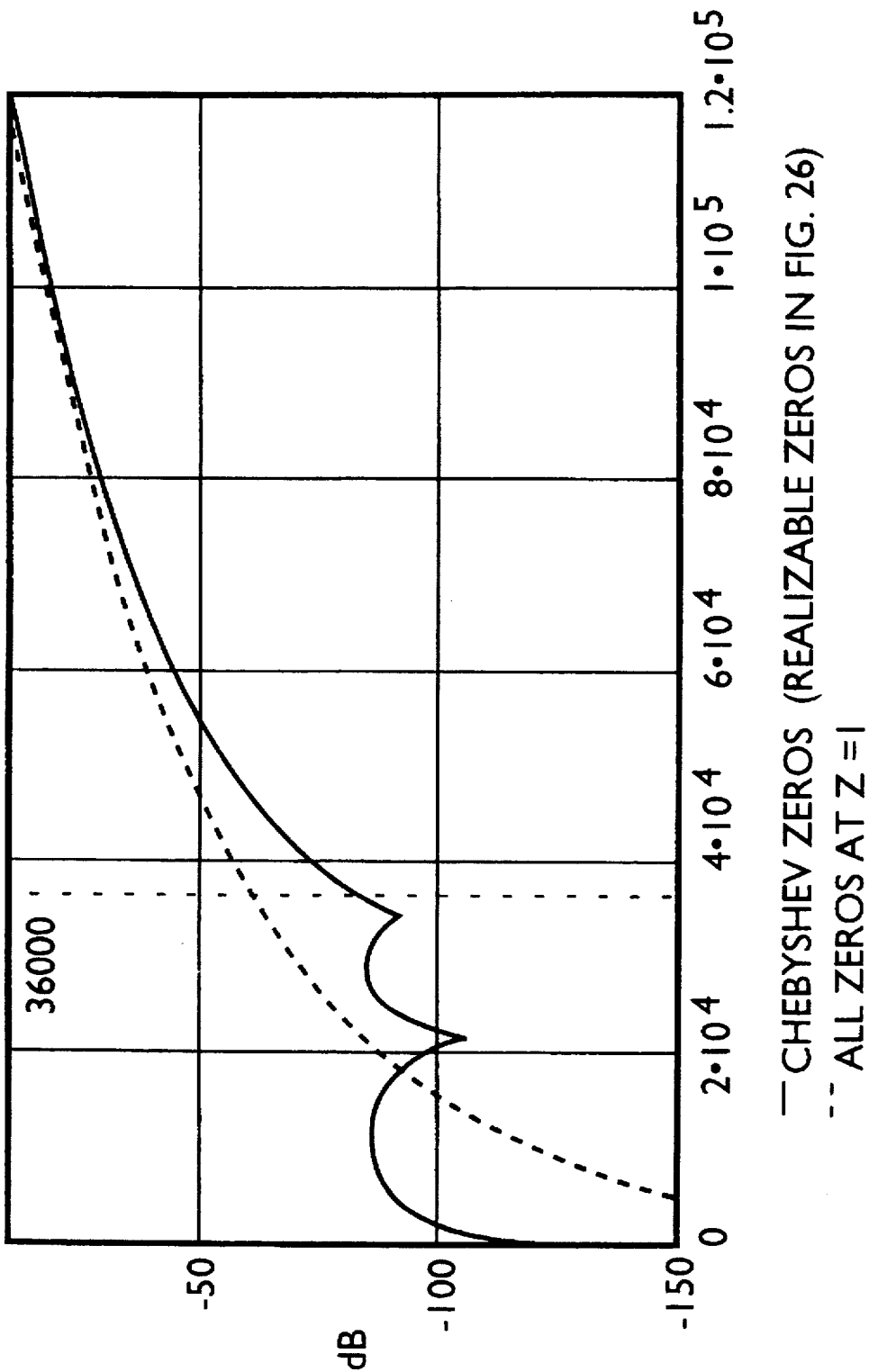
FIG. 27 is a plot comparing two embodiments of noise transfer functions for the noise shaper block of FIG. 9.

The actual NTF magnitude is compared in FIG. 27 with the magnitude of a NTF obtained placing all the zeros at DC (z=1). It can be seen that the noise power in the signal band is about 16.3 dB less in the selected structure, using Chebyshev zeros, than it is in the simpler one with all zeros at DC.

1. Signal Transfer Function (STF) For Noise Shaper.

Figure 28:
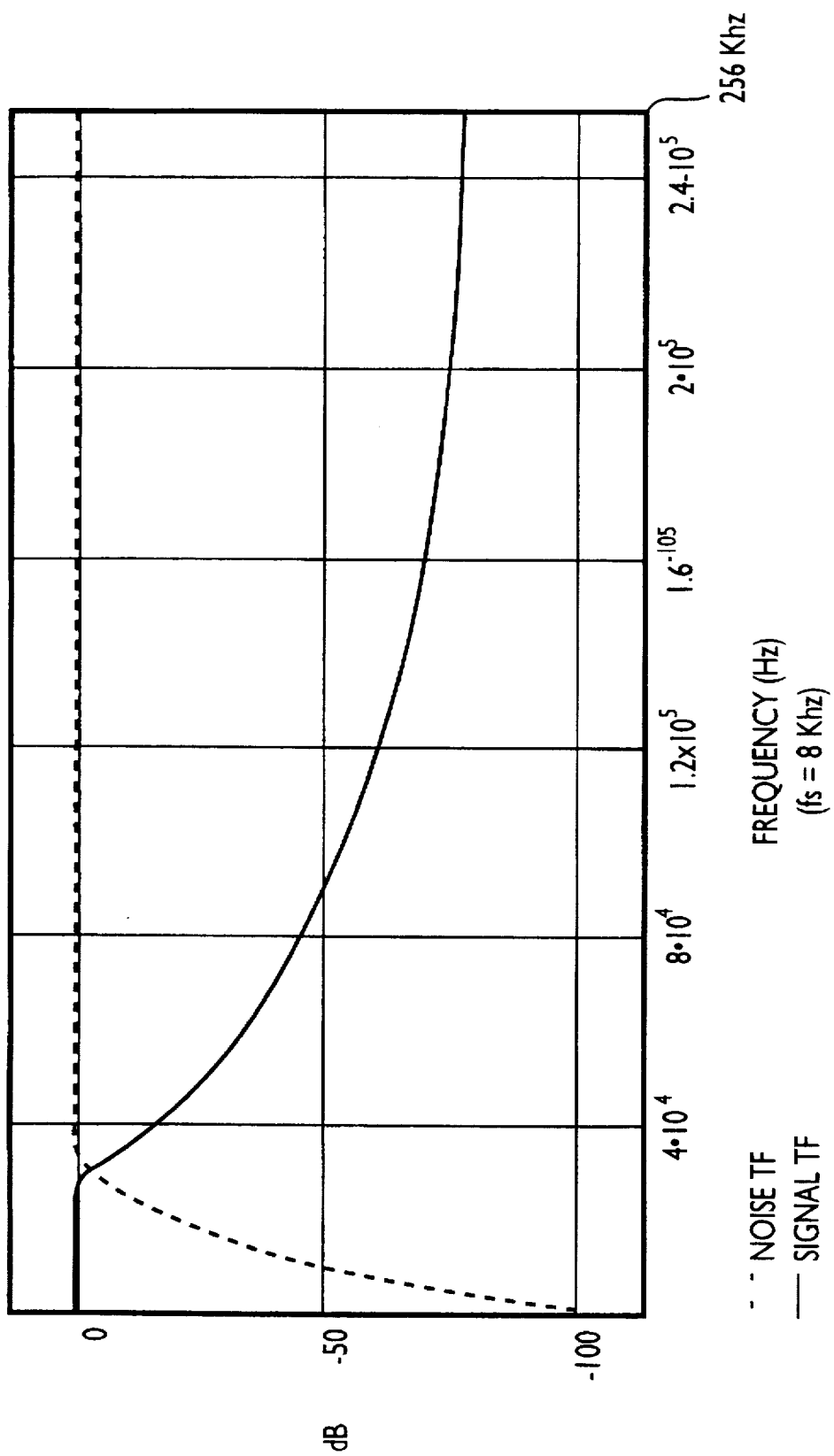
FIG. 28 is a plot of the noise and signal transfer functions of the noise shaper block of FIG. 9.
Figure 29:
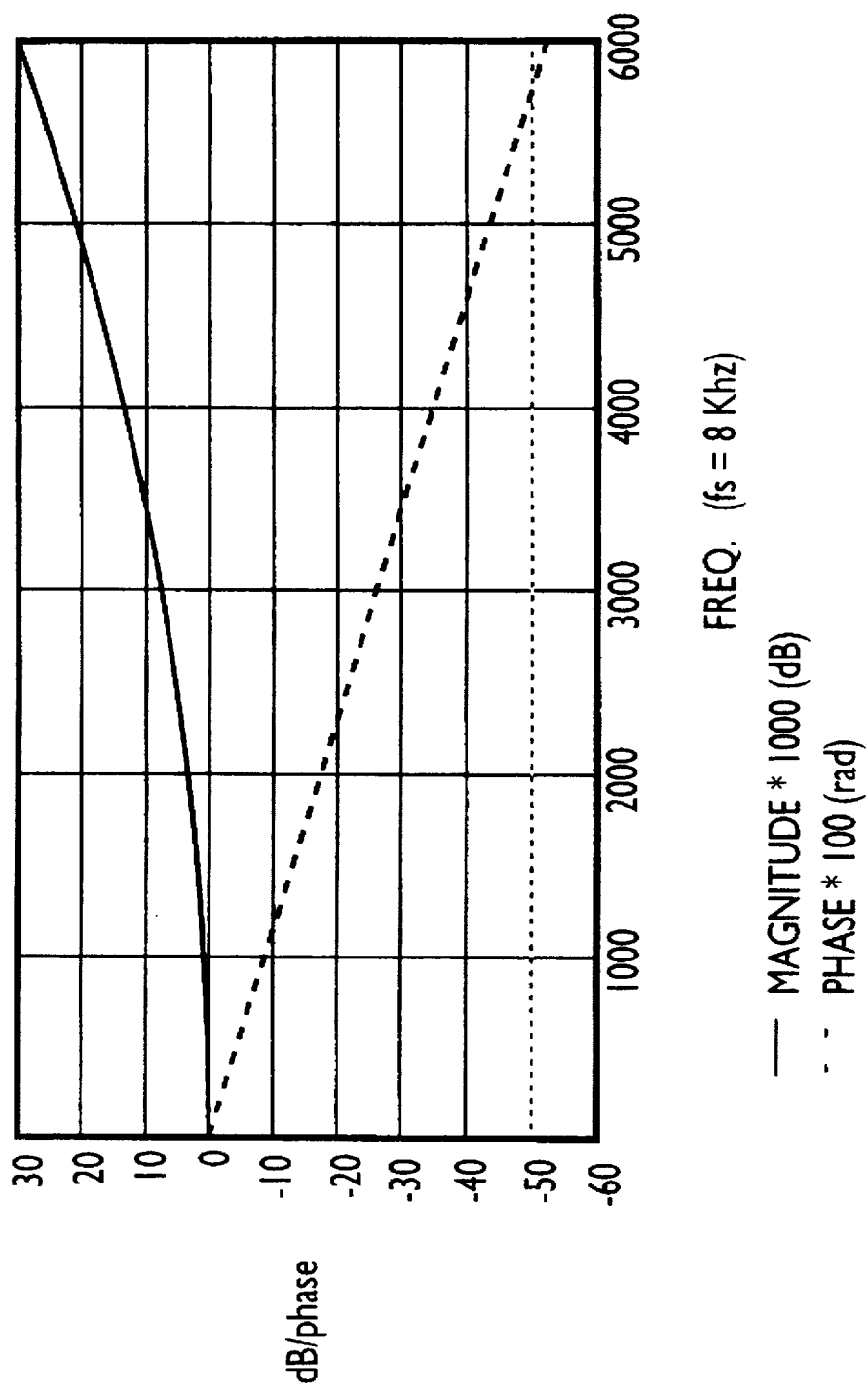
FIG. 29 is a plot of the signal transfer function magnitude and phase in the passband of the noise shaper block of FIG. 9.
Figure 30:
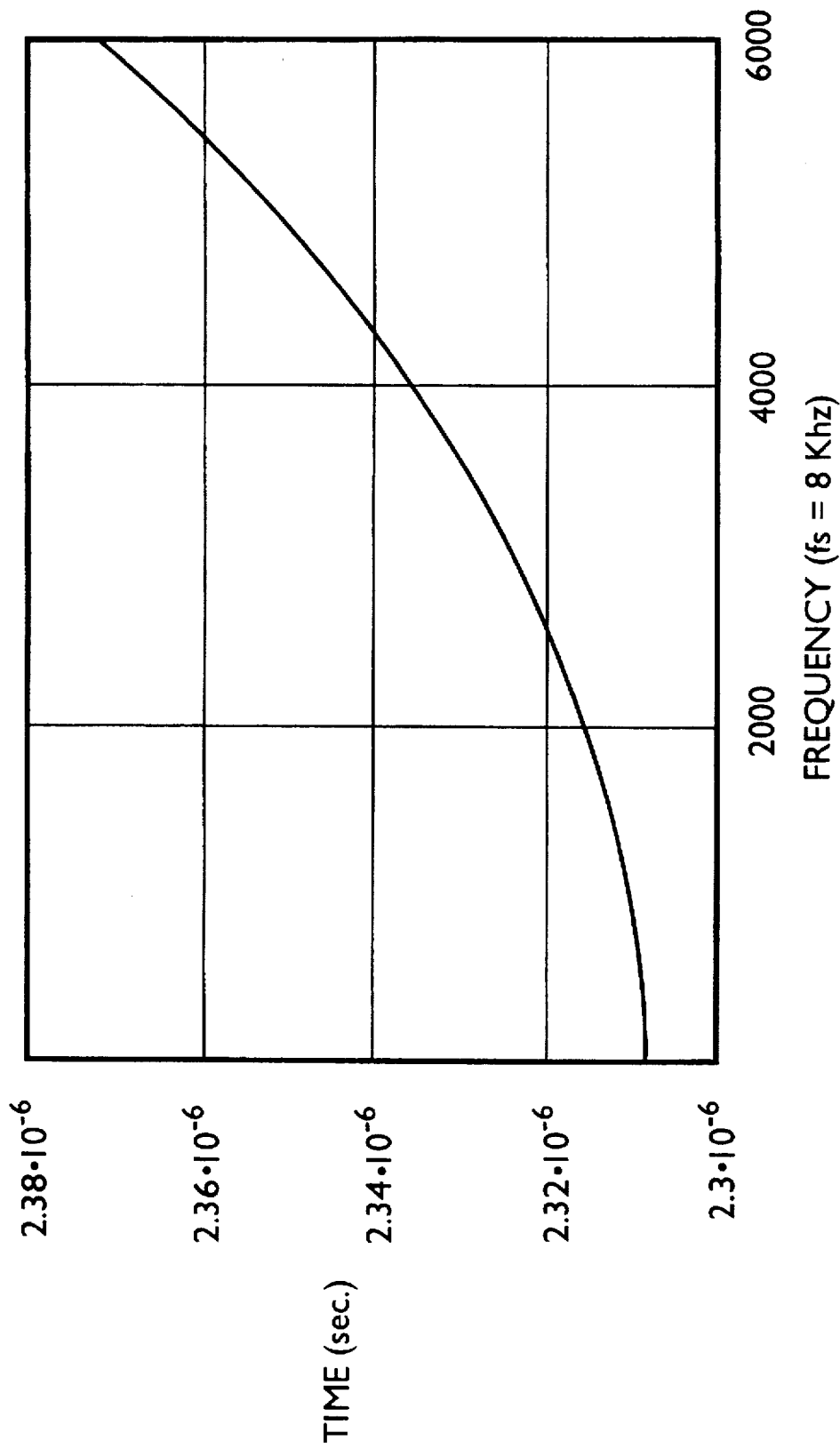
FIG. 30 is a graph of the group delay (sec.) of the noise shaper block of FIG. 9.

Once the feedback coefficients, A; B; shown in FIG. 20 have been determined, the STF for noise shaper 802 is fixed. If the oversampling ratio is large enough, the STF will have little effect inside the signal band. Otherwise, the poles can be tweaked to some extent, but this is not desirable, because stability may be compromised. A better embodiment is to compensate for any distortion in the first interpolation filter Interp.1 blocks 810, 812. The magnitude of the STF and the NTF is shown in FIG. 28 over the entire frequency range. The preferred STF response in the passband appears in more detail in FIG. 29. The group delay inside the passband is shown in FIG. 30.

The passband tilt is significant enough to violate the preferred +/−0.1 dB ripple requirement for the entire playback path, and must be compensated. With regard to group delay distortion, however, it is still acceptable.

The difference between maximum and minimum group delay values is about 21.95 ns. The phase deviation from linear at 3.6 KHz with $f_s$=8 KHz is equal to:

$$\Delta\Phi = 360° \frac{\left(-\frac{\partial\theta}{\partial\omega}\big|_{\omega=0} \cdot \omega_b - [\theta(\omega_b) - \theta(0)]\right)}{2\pi}$$

$$= 360° \frac{(-gd|0| \cdot \omega_b - \theta(\omega_b))}{2\pi}$$

$$\approx 0.06°$$

2. Noise Transfer Function (NTF) for Noise Shaper.

The linearized analysis employed to obtain the transfer functions discussed above cannot predict the effects of signal level on stability when the quantizer is overloaded and the additive noise model fails. However, it is known that stability is directly related to the maximum value of NTF. A value close to 2 is the limit of stable operation. In the preferred embodiment, the maximum value for the NTF is obtained for $f=f_s/2$ (z=−1), where the parameters of the NTF are interrelated:

For a fixed stopband width, higher noise attenuations result in higher values of noise gain K at $f=f_s/2$.

For a fixed noise attenuation, higher stopband widths also result in higher values of noise gain.

Figure 31:
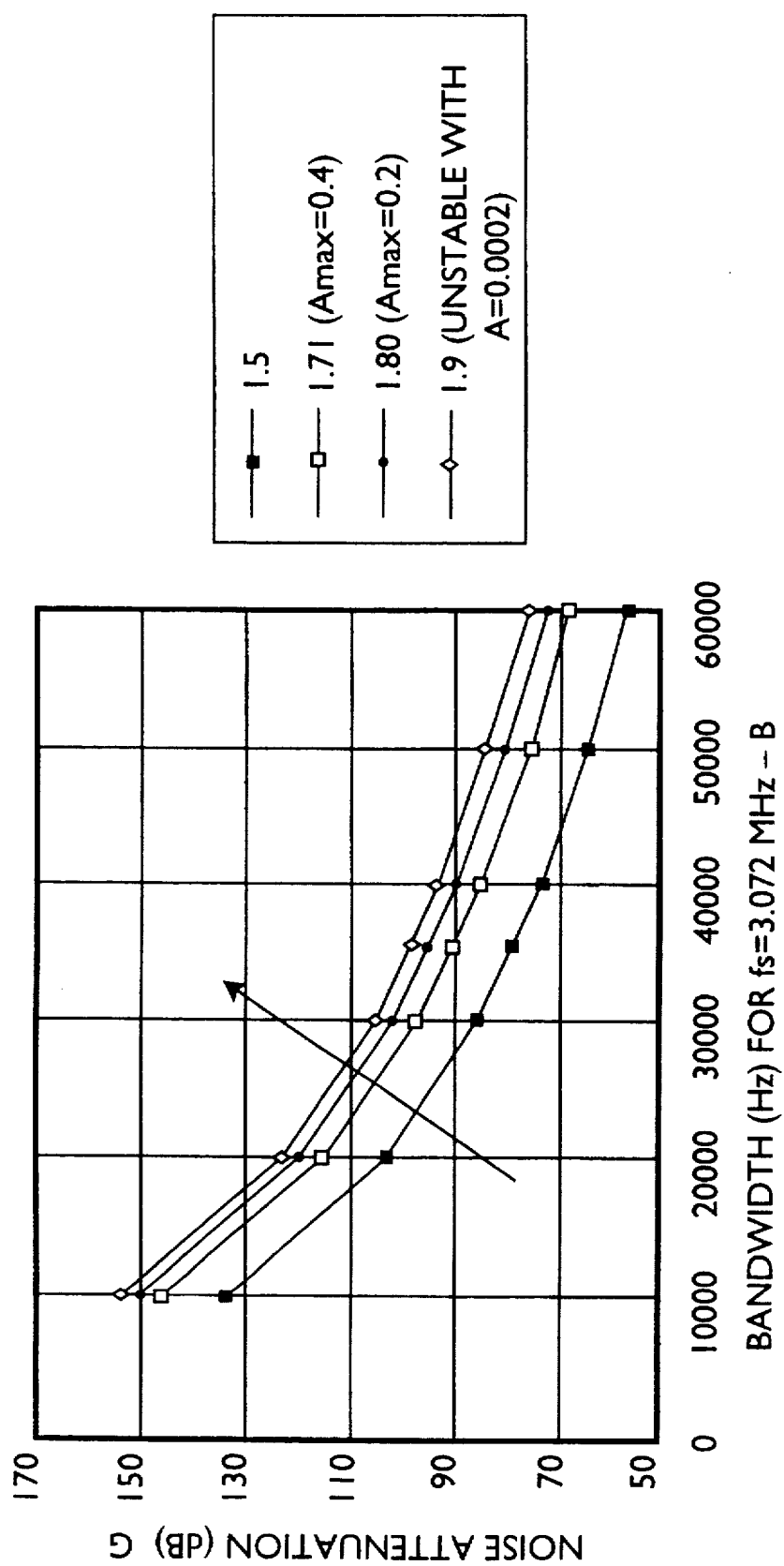
FIG. 31 is a graph of the constant attenuation/gain contours of various embodiments of the noise shaper block of FIG. 9.

A fixed value of noise gain K at $f_s/2$ can be obtained for any value of noise attenuation G provided the bandwidth is correct, or vice versa. A plot of constant noise gain contours is shown in FIG. 31.

In the preferred embodiment, a noise gain of 1.7 is used which results in stability and near maximum input amplitude, $A_{max}$. A noise gain, K=1.85 and higher appears to be unstable. This indicates that the transition from stability (K=1.7) to instability (K=1.85) is rather abrupt. The maximum input amplitude, $A_{max}$, that the circuit can tolerate before going unstable is directly related to the noise gain value. For example, all loop configurations that followed the contour for K=1.8 have a value of $A_{max}$=0.2, while those that fall on the K=1.71 contour have a value $A_{max}$=0.4. The arrow in FIG. 31 shows the direction from stability to instability in the G-B space. $A_{max}$ does not increase indefinitely as K decreases. It actually peaks around K=1.71. This is determined in part by the values of the integrator gains (FIG. 32).

Figure 32:
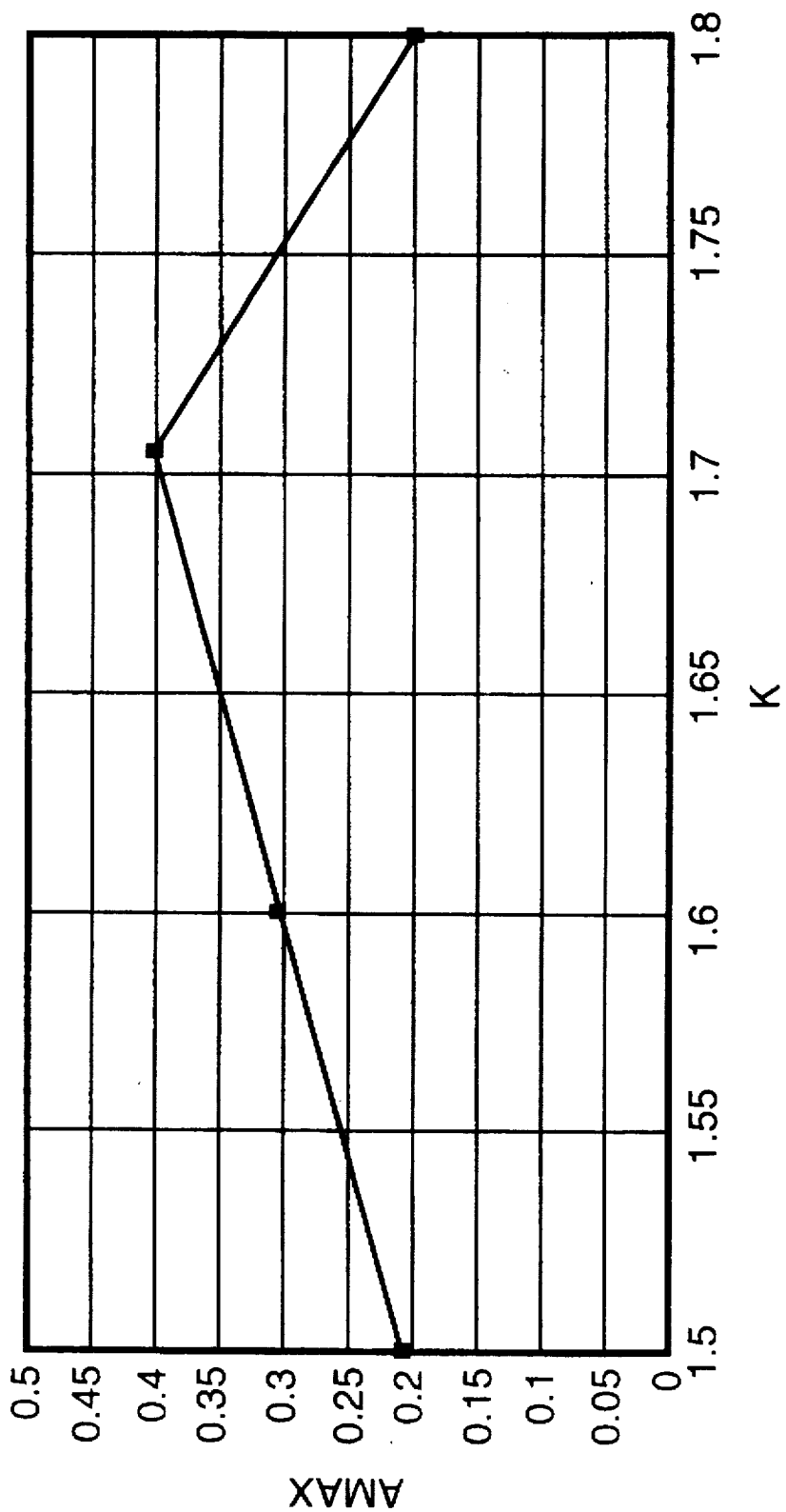
FIG. 32 plots $A_{max}$ (maximum input amplitude) versus noise gain k for an embodiment of the noise shaper block of FIG. 9.
Figure 33:
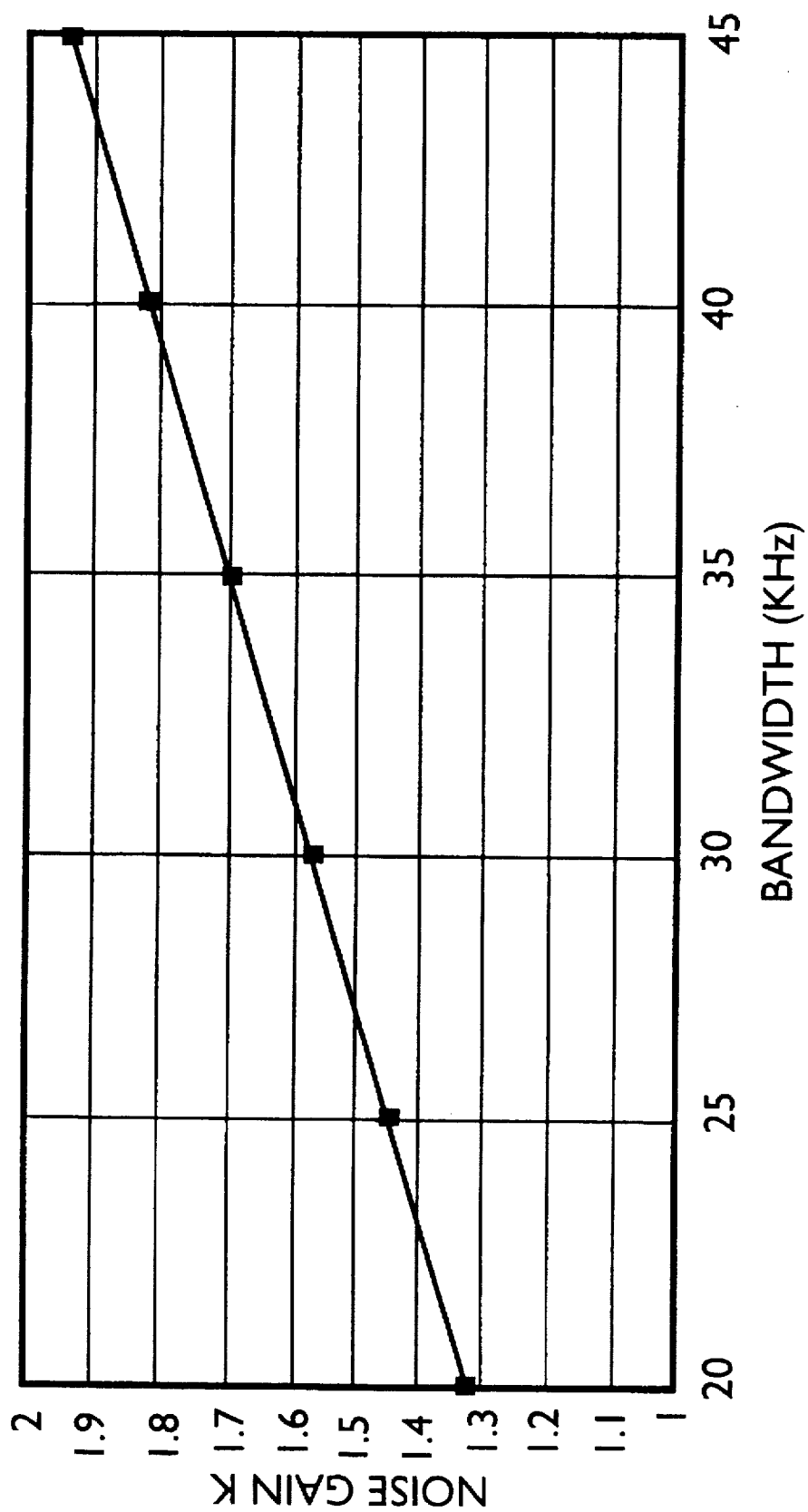
FIG. 33 is a graph of the noise gain k versus band width for G=−90 dB for a preferred embodiment of the noise shaper block of FIG. 9.

If the bandwidth remains constant and the noise attenuation G is varied, $A_{max}$ vs. K is shown in FIG. 32 for a bandwidth of 20 KHz. If the noise attenuation G remains constant and the bandwidth varies, a plot as in FIG. 33 results. This was obtained for G=90 dB. The stability limit of K=1.8 is reached with about 40 KHz bandwidth.

For a bandwidth at about 36 KHz, the noise gain value K, is about 1.707 which also coincides with the peak $A_{max}$=0.4. To ensure stable operation, the maximum amplitude into the loop is preferably kept at about 0.25.

D. Playback Semi-Digital Filter (SDF).

Figure 34:
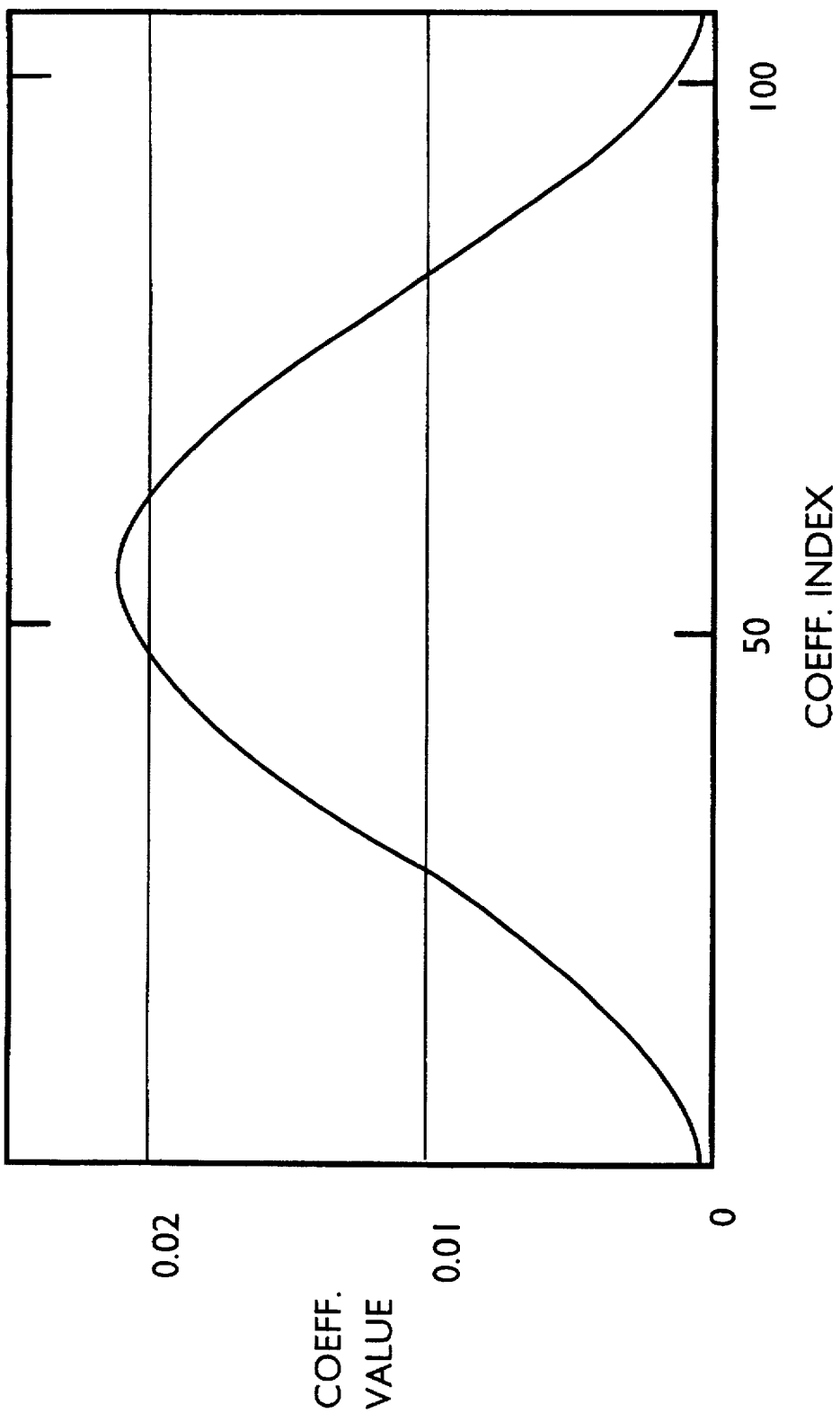
FIG. 34 is a graph showing the impulse response of the D/A semi-digital FIR filter.
Figure 35:
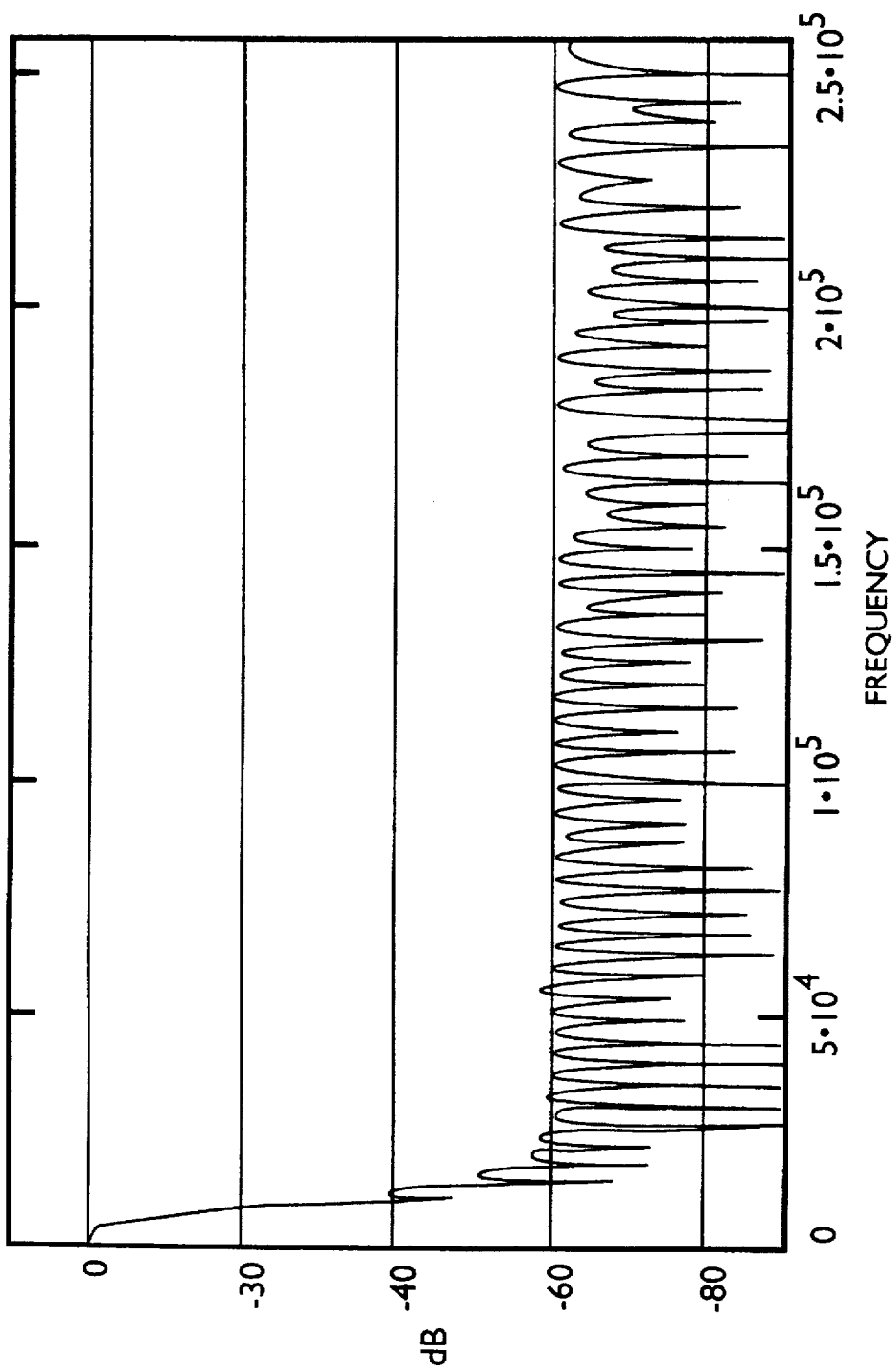
FIG. 35 is a graph showing the frequency response of the D/A semi-digital FIR filter.

The semi-digital FIR filter 804, the last stage of CODEC playback DAC 514, filters the 1-bit signal 842 at 64 times the frequency of the sample rate for the 16-bit input signal 806 which is input to the Interpolator filter block 800 (FIG. 8), and converts the 1-bit signal 842 to an analog signal output signal 808. Semi-digital FIR filter 804 coefficients are preferably positive and preferably have a ratio of maximum value to minimum value of less than 40. FIG. 34 shows the impulse response and FIG. 35 shows the frequency response of this semi-digital filter 804. Semi-digital FIR filter 804 performs the functions of: 1) converting the 1-bit digital signal to an analog signal; and 2) filtering out high frequency noise created by noise shaper 802. Semi-digital FIR filter 804 combines the D/A converter function with the analog low pass filter function in such a way that the high frequency noise is removed without adding substantial distortion at lower frequencies.

Figure 36:
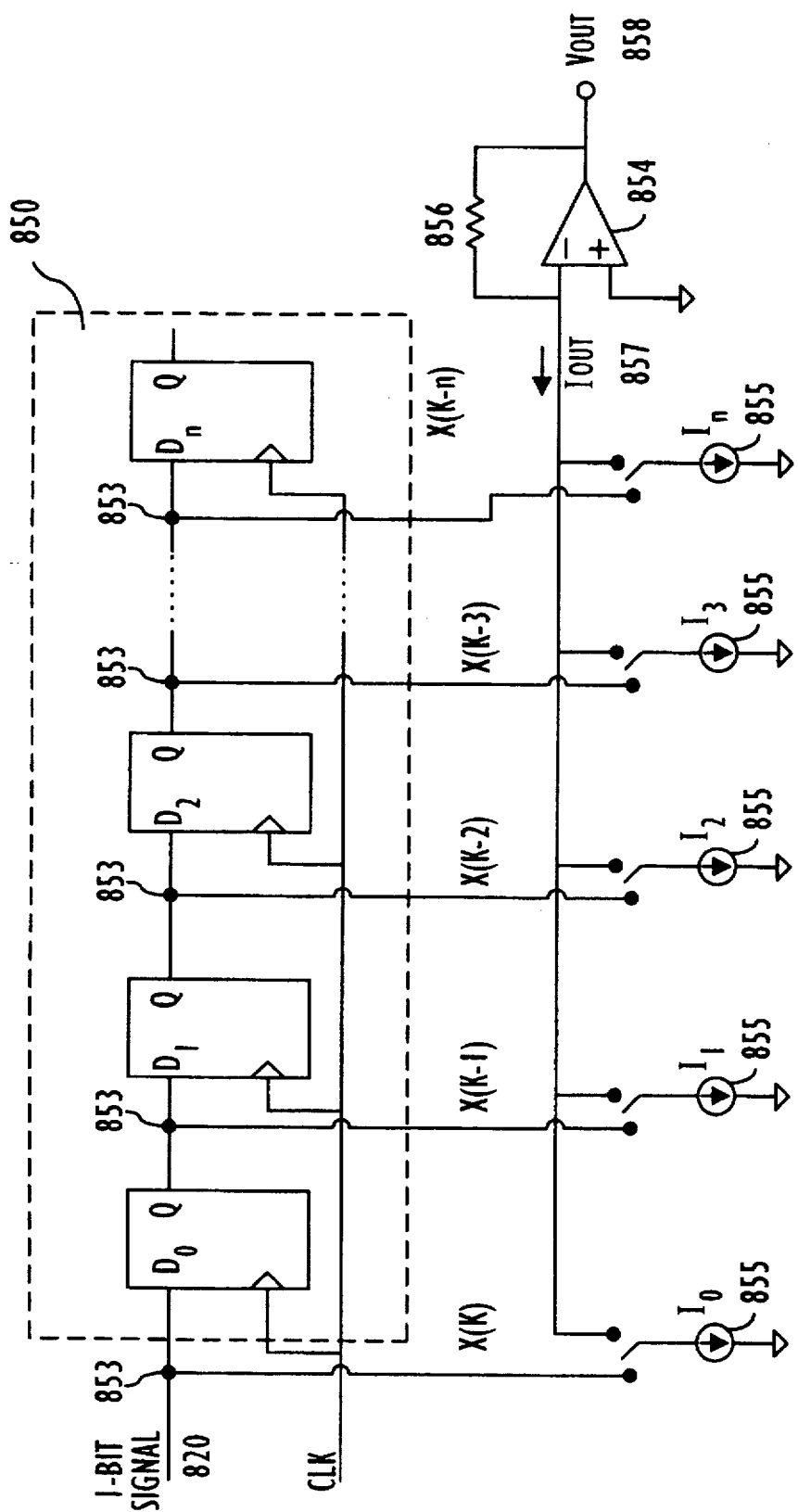
FIG. 36 schematicaly illustrates one embodiment of the D/A conversion circuit of the present invention.

Semi-digital FIR filter 804 includes a shift register 850 (FIG. 36, 37). Data taps 853 are present at the input to each successive flip-flop 852 in shift register 850. The logic state of each data tap 853 is used to control the switching of a current sink 855 which is connected to the respective data tap 853. The value of the respective current sink 855 represents a coefficient used to produce the desired impulse response for the filter. All current sinks 855 are summed together and converted to a voltage by means of an op amp 854 and resistor 856.

Shift register 850, which preferably is a 107 bit long shift register, forms a digital delay line whereby each flip flop 852 represents one unit of delay. Thus, if the input to shift register 850 is termed x(k), then the first data tap 853 would be termed x(k−1) since it has the same value as x(k) does, but is delayed by a single clock period. Likewise the next data tap 853 would be termed x(k−2) and so on. As mentioned before, each data tap 853 controls an individual current sink 855. Thus, the total current, IOUT 857, is equal to the scaled sum of each of the current sources 855. This can be represented with the following equation:

$$IOUT(k)=I0*(k)+I1*x(k-1)+I2*x(k-2)+ \ldots +IN*x(k-N)$$

The op amp 854 and resistor 856 convert the current IOUT 857 into a voltage output signal, VOUT 858. This can be represented by the following equation:

$$VOUT=(K)=R*I0*x(k)+R*I1*x(k-1)+R*I2*x(k-2)+ \ldots +R*IN*x(k-N)$$

The coefficients for semi-digital FIR filter 804 are determined by values of each of the individual currents. The value of each of the coefficients represented by the current sinks 855 is not a function of the 1-bit signal 842, which helps maintain the linearity of the structure.

Figure 37:
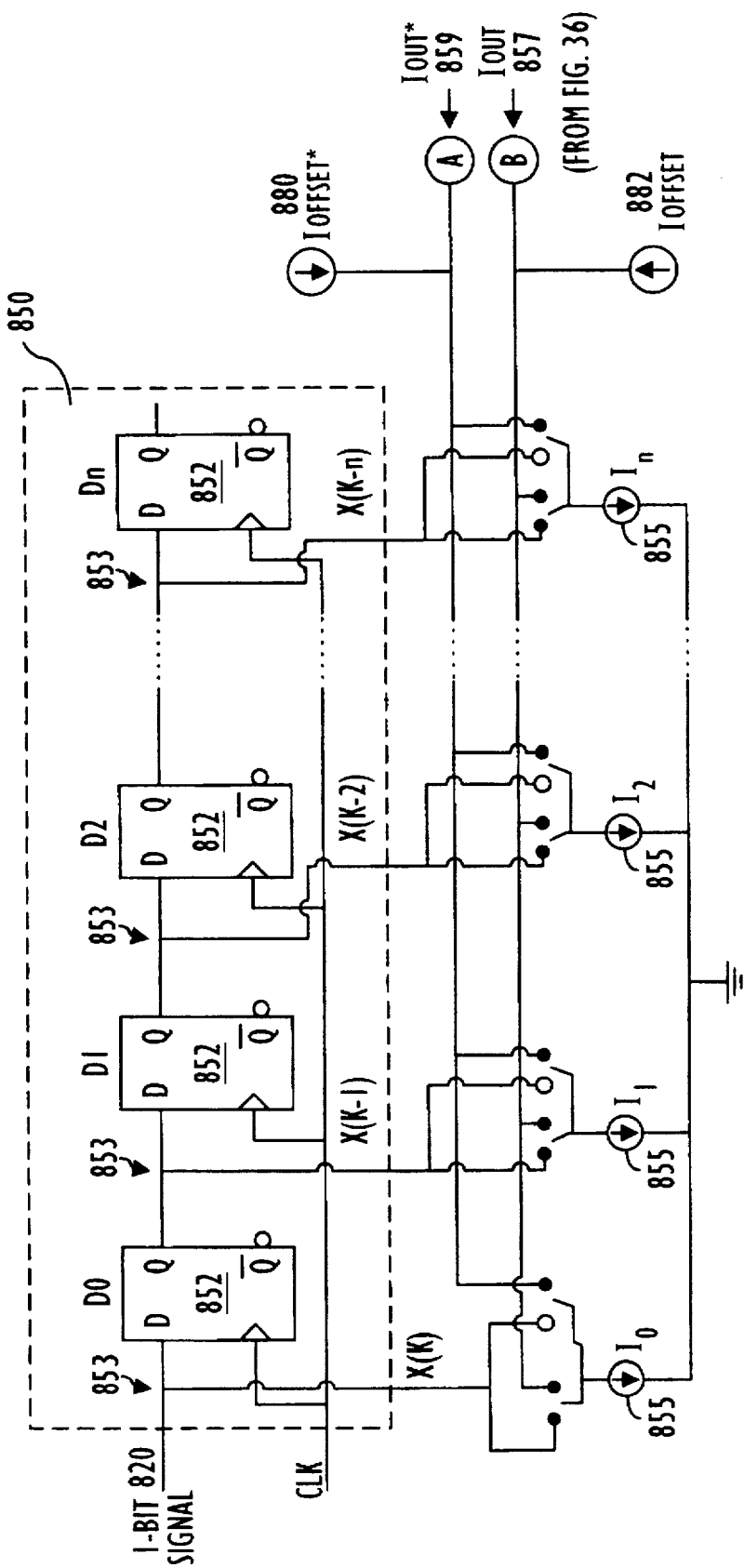
FIGS. 37 and 38 schematically illustrate another embodiment showing the differential D/A conversion circuit of the present invention.
Figure 38:
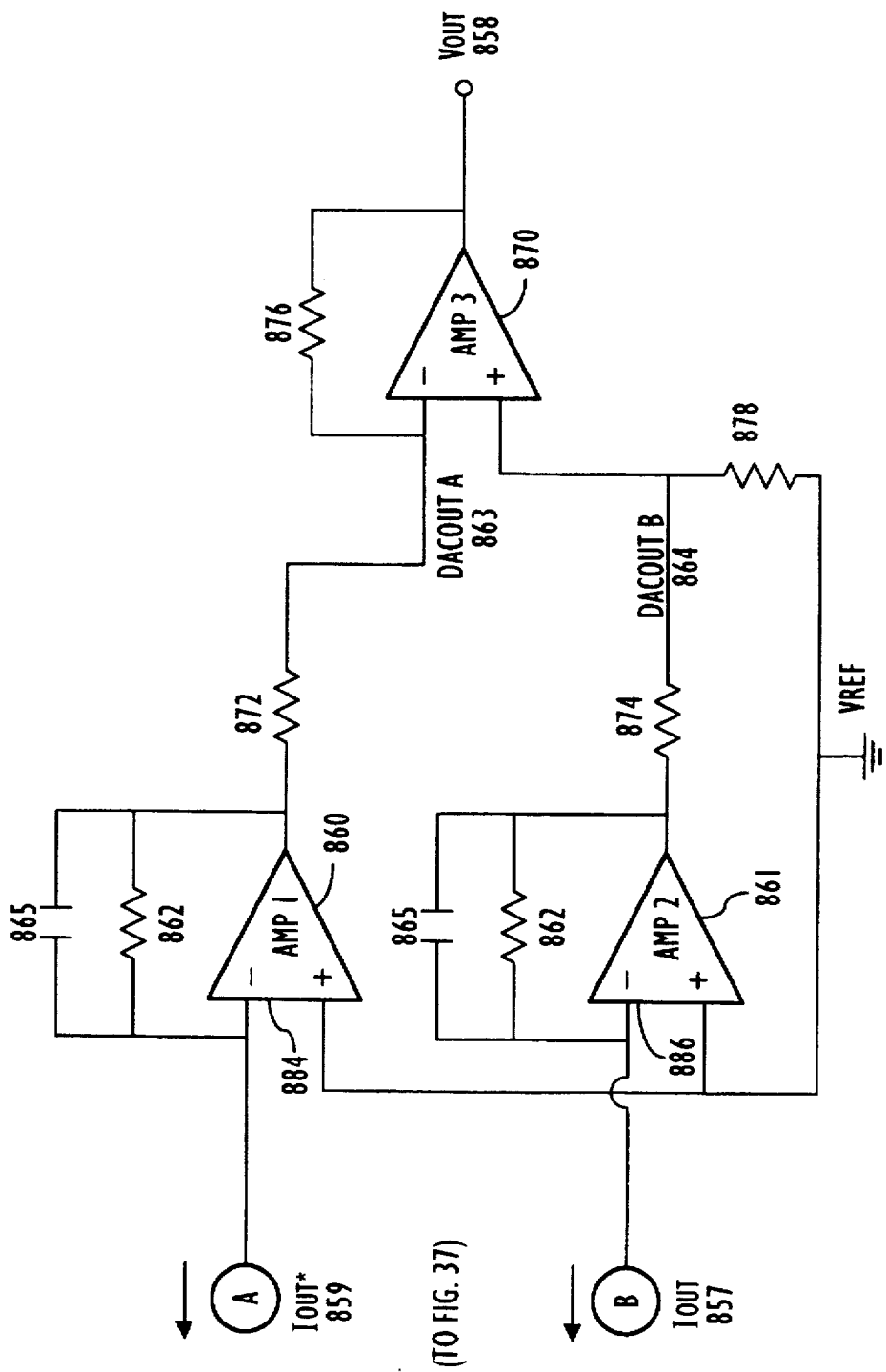

In another embodiment shown in FIGS. 37 and 38, two differential currents, IOUT 857 and IOUT* 859, are used. The 1-bit signal 842 output from noise shaper 802 can take on only 2 values: logic 1 and logic 0. For each bit in the shift register 850, if a logic 1 exists, the current sink 855 associated with the bit is connected to the IOUT line. If a logic 0 exists, the current sink 855 associated the bit is connected to the IOUT* line. The following is an example of a semi-digital filter having two taps. In this example there are four possibilities, as shown in table C14.

TABLE C14

| x (k) | x (k − 1) | IOUT | IOUT* |
|---|---|---|---|
| 0 | 0 | 0 | I0 + I1 |
| 0 | 1 | I1 | I0 |
| 1 | 0 | I0 | I1 |
| 1 | 1 | I0 + I1 | 0 |

There are two things to note about the table C14. First, since there are only current sinks available and since the data taps can only take on the values of 0 or 1, currents IOUT 857 and IOUT* 859 can only take on positive values, or zero. Thus, semi-digital FIR filter 804 has a built-in DC offset which must be removed. In the preceding example, IOUT 857 and IOUT* 859 take on values from 0 to I0+I1. Thus an inherent DC offset exists in IOUT 857 and IOUT* 859 which in this two bit example has a value of (I0+I1)/2. This DC offset in this example can be effectively removed by subtracting a fixed amount of current (I0+I1)/2, from the IOUT 857 and IOUT* 859 lines. Once this DC offset is removed, the net effective IOUT 857 and IOUT* 859 currents are as described in table C15.

TABLE C15

| x (k) | x (k − 1) | IOUT | IOUT* |
|---|---|---|---|
| 0 | 0 | −(I0 + I1)/2 | (I0 + I1)/2 |
| 0 | 1 | (I1 − I0)/2 | −(I1 − I0)/2 |
| 1 | 0 | −(I1 − I0)/2 | (I1 − I0)/2 |
| 1 | 1 | (I0 + I1)/2 | −(I0 + I1)/2 |

Referring to FIGS. 37 and 38, two offset current sources, 880 and 882 are used to achieve reduction of the inherent DC offset. Current source IOFFSET* 880 is connected to the current summing node 884 of amp1 860. Current source IOFFSET 882 is connected to the current summing node 886 of amp2 861. The value of current sources IOFFSET* 880 and IOFFSET 882 is (I0+I1+ . . . +IN)/2.

For each shift register data tap combination, IOUT* 859 has the same magnitude and opposite sign as IOUT 857. As a differential structure, even ordered distortion product terms and common mode noise are reduced. The differential currents are then converted to voltages by a pair of op amps, op amp1 860 and op amp2 861, each with resistive feedback 862 and capacitor 865 as shown in FIG. 38, which results in voltage signals DACOUTA 863 and DACOUTB 864. High frequencies are removed by capacitor 865 which is in parallel with each of the resistors 862 associated with amp1 860 and amp2 861. The differential voltage DACOUTA-DACOUTB is converted to a single ended voltage output signal VOUT 858 by a conventional differential-to-single-ended converter circuit which includes resistors 872, 874, 876 and 878 and op amp3 870. The positive input to op amp3 870 is connected through resistor 878 to a reference voltage, VREF, which is preferably ground, but may be a mid-range voltage between VCC and ground.

E. Architecture for the CODEC Record ADC.

The CODEC record ADC 516 (FIG. 39) functions to preserve a high signal to distortion ratio (STD) compatible with CD quality (higher than 90 dB) audio while reducing the sampling rate of the incoming analog signal from a value of 64×$f_s$, to $f_s$, where $f_s$ is the output sampling rate. The record ADC 516 performs a decimation on the oversampled audio signal such that decimation filter block 902 down-samples the 64× over-sampled signal by 64. The decimation process, explained below, is performed in three stages within decimation filter block 902, by factors of 16, 2 and 2, respectively, to minimize decimation circuit complexity.

Figure 39:
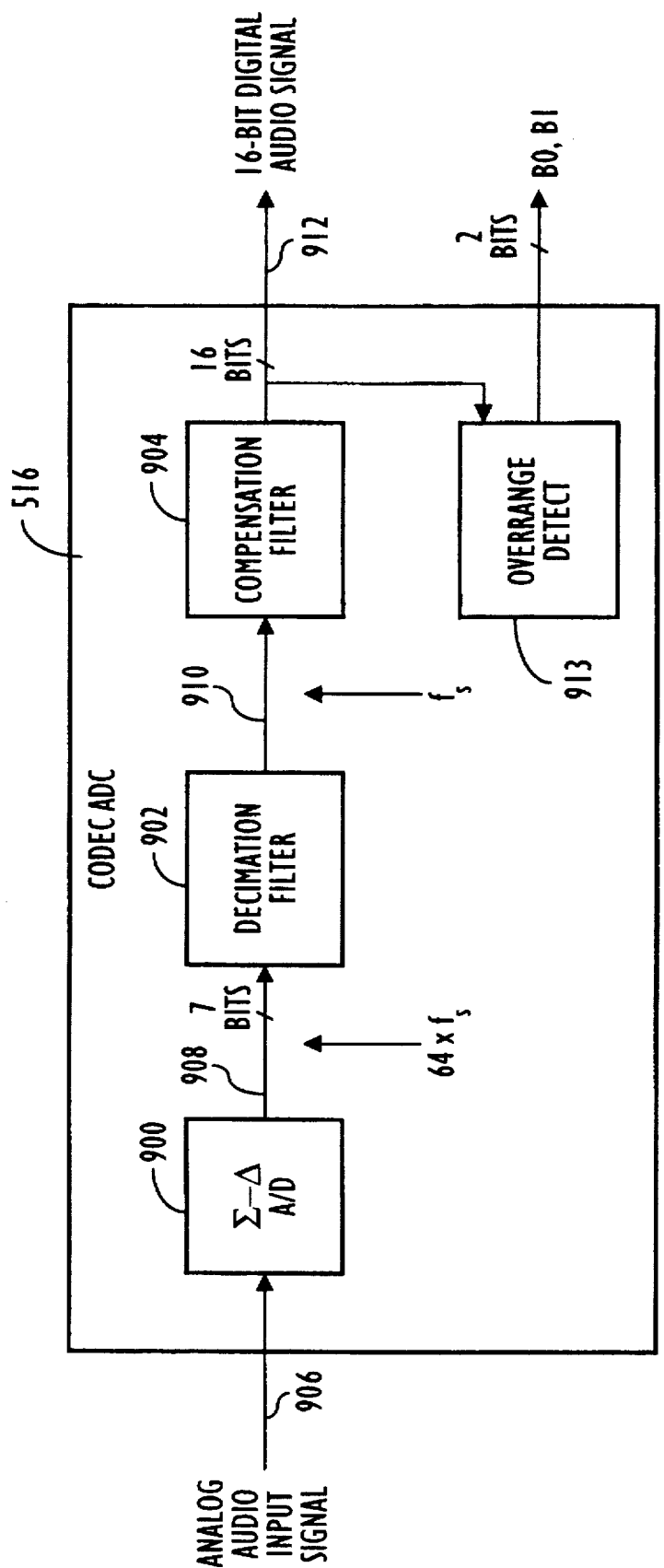
FIG. 39 is a block diagram of the CODEC ADC of the present invention.
Figure 40:
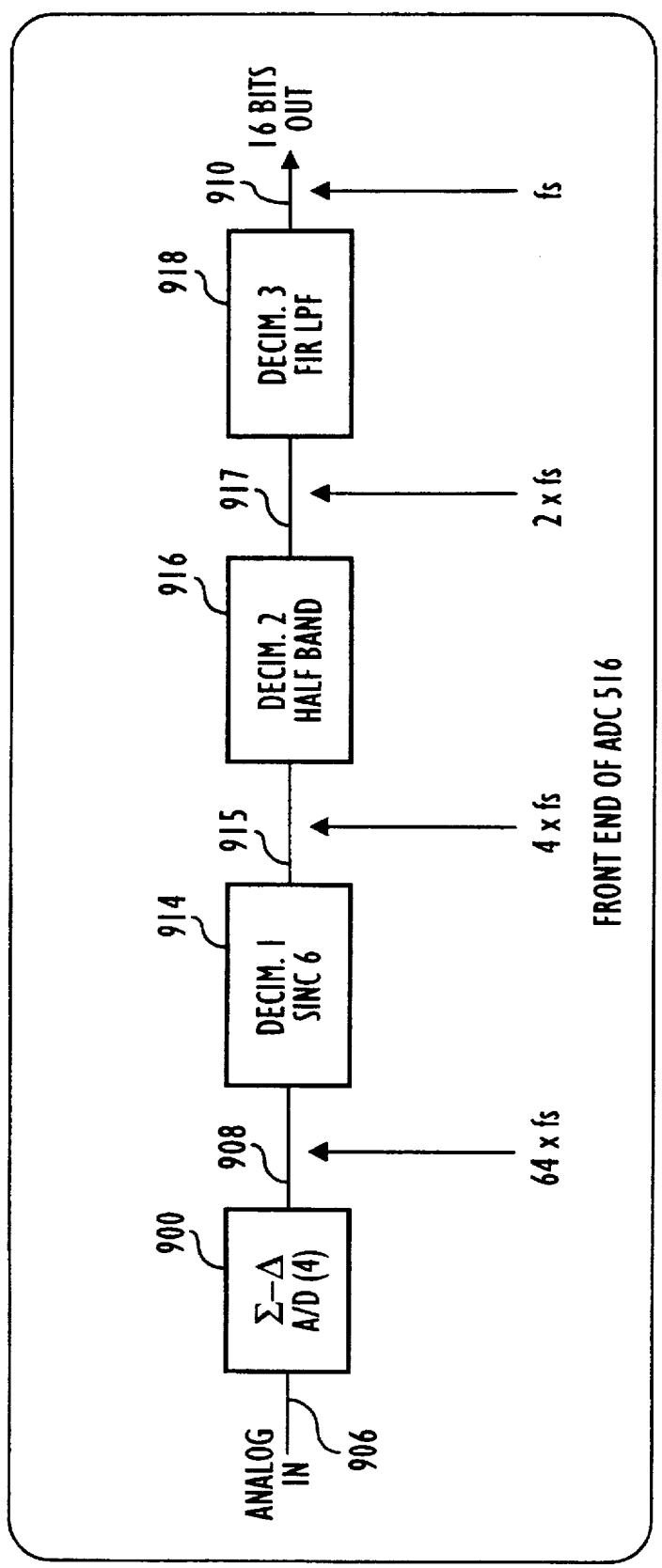
FIG. 40 is a block diagram of the digital portion of the CODEC ADC.

Referring to FIGS. 39 and 40, the record ADC 516 receives as input an analog audio signal 906, which is converted by a fourth order Σ-Δ A A/D 900 into a 7-bit signal 908 at a sampling rate of 64× $f_s$ (64× oversampling). The decimation filter block 902 receives this 7-bit input signal 908 and produces a 16-bit output signal 910 at a sampling rate $f_s$.

The spectrum of the sampled analog input signal 906 contains components of frequencies up to $f_s/2$ and their images centered about integer multiples of 64×$f_s$, where the input signal 908 is assumed to be band-limited (high frequencies filtered out) by an anti-aliasing filter of adequate attenuation located in the record path before the Σ-Δ A/D 900 (not shown). The anti-aliasing filter may be user installed or may be in Mixer 606, or elsewhere prior to the Σ-Δ A/D 900.

Figure 41:
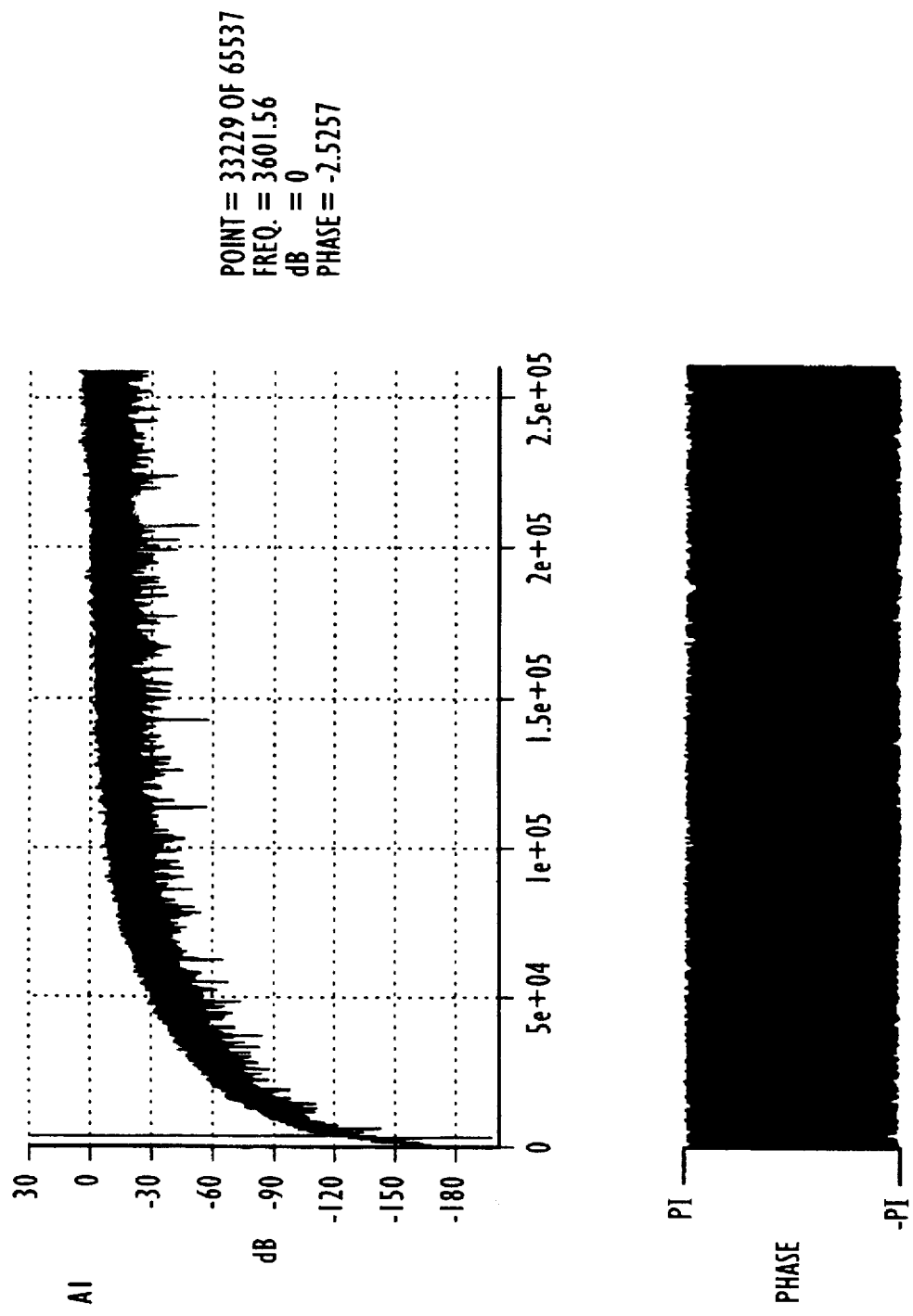
FIG. 41 is a graph illustrating the sigma-delta modulator output spectrum for the ADC of the present invention.
Figure 42:
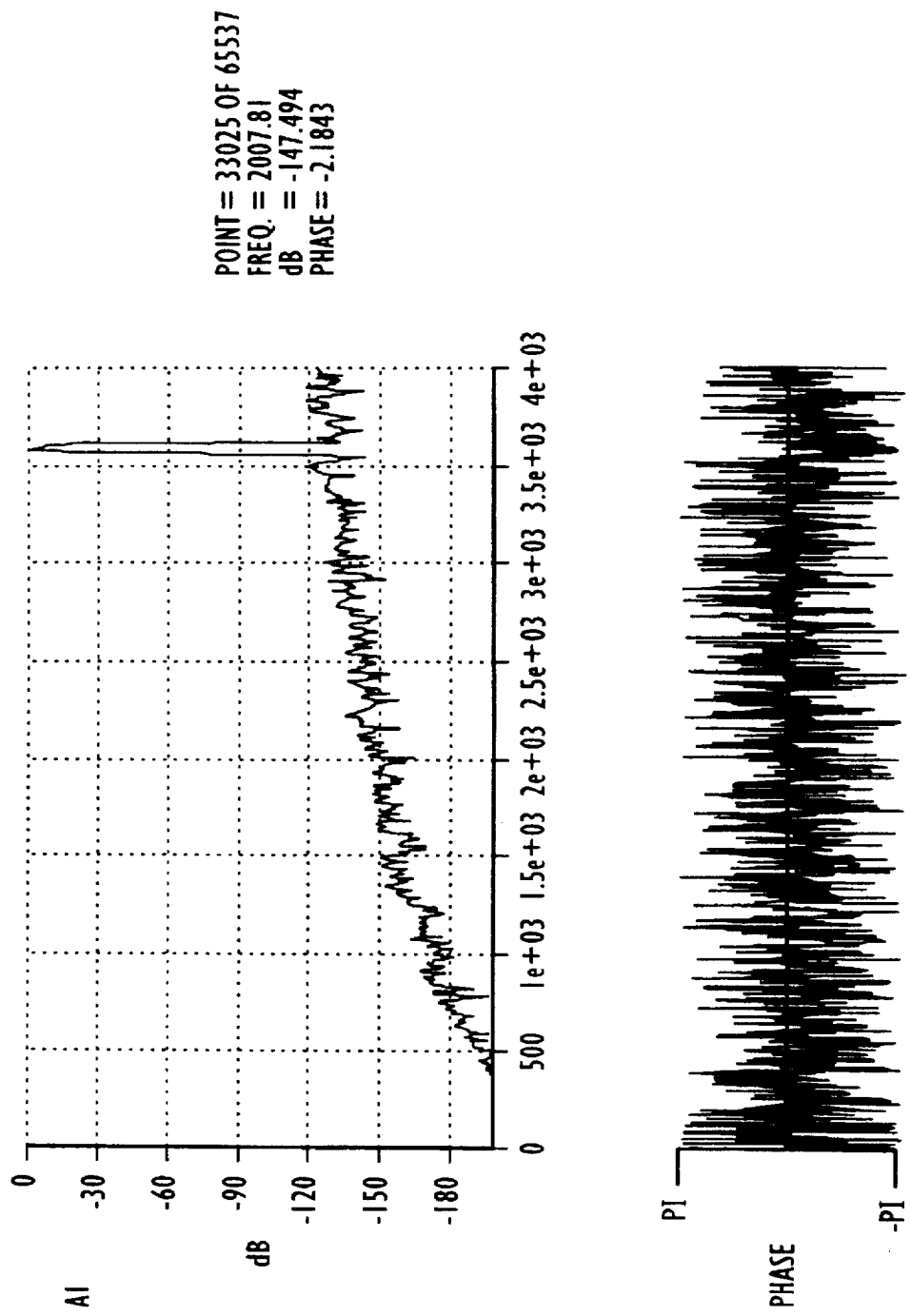
FIG. 42 is a graph illustrating the sigma-delta modulator output spectrum, in more detail.
Figure 43:
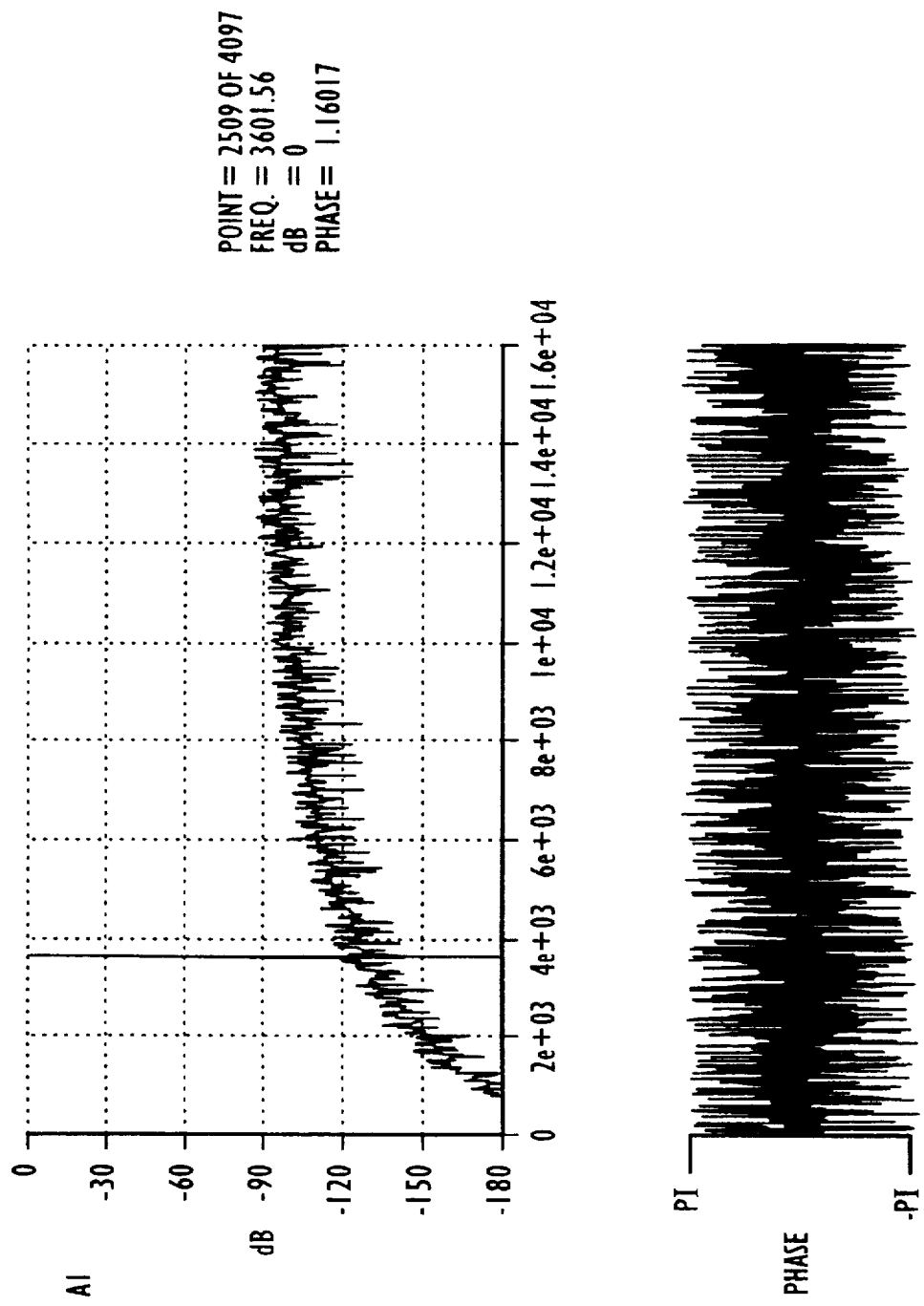
FIG. 43 is a graph illustrating the output spectrum of the sinc6 Decim.1 filter output.

The record ADC 516 output spectrum is shown in FIG. 41 out to 64× $f_s/2$, and a detail of the passband (in this case, 4 KHz) appears in FIG. 42. To carry out the first decimation in Decim.1 914 to $f_s'=4×f_s$ (a decimation factor of 16), a sinc$^6$ filter is employed. The spectrum of the output of Decim.1 914 is shown in FIG. 43.

Figure 44:
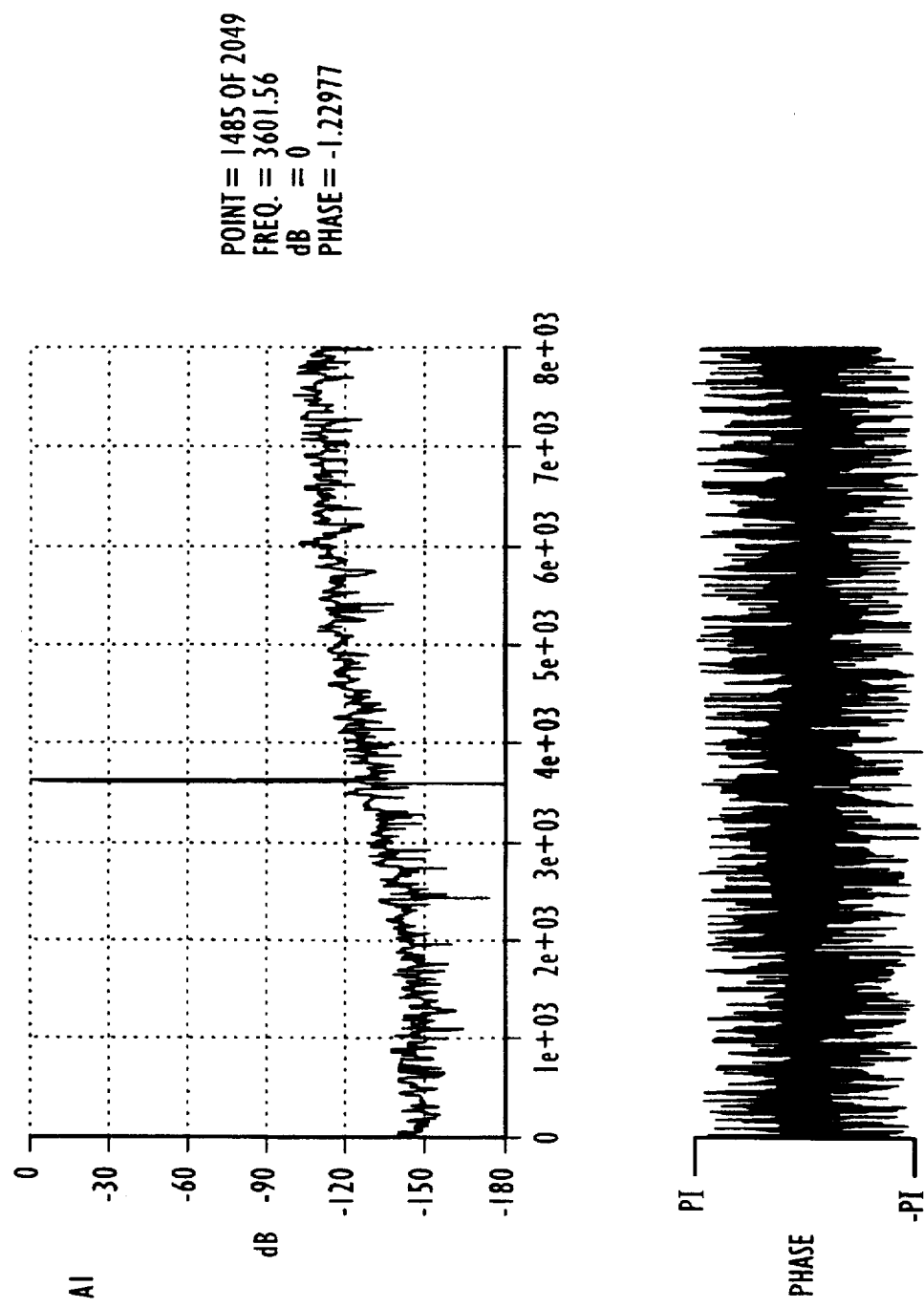
FIG. 44 is a graph illustrating the output spectrum of the half-band Decim.2 filter output.
Figure 45:
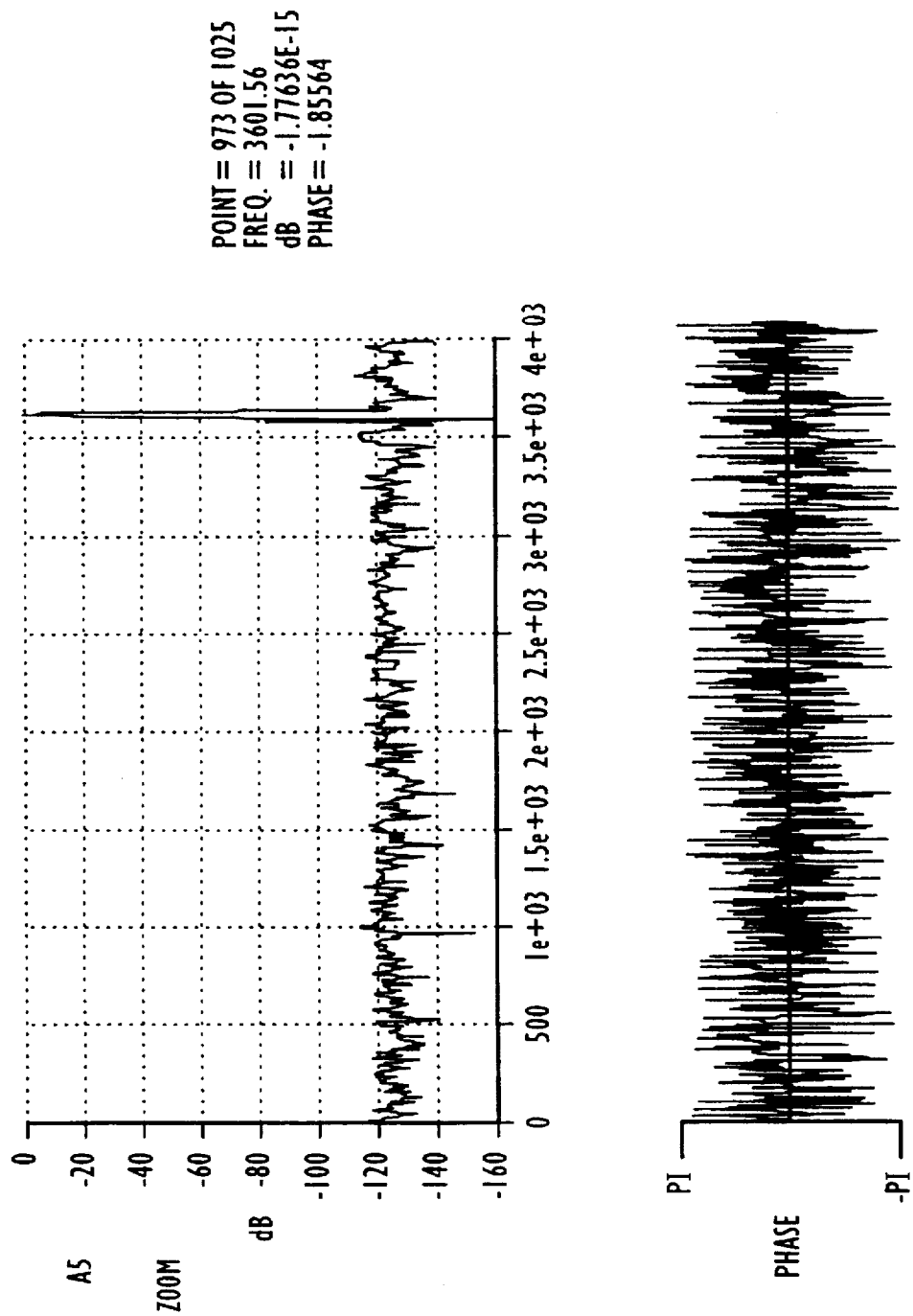
FIG. 45 is a graph illustrating the output spectrum of the 16-bit Decim.3 filter output.

The next decimation stage, Decim.2 916, changes the sampling rate from $f_s'=4$ $f_s$, to $f_s''=½f_s'=2$ $f_s$. A half-band filter is used, with stopband attenuation of about 100 dB. The spectrum of the output is shown in FIG. 44.

The last decimation stage Decim.3 918, is a linear phase filter which changes the sampling rate by a factor of 2, to $f_s'''=f_s$. This stage consists of an equiripple FIR filter, with a passband extending to about 0.45 $f_s$ and a stopband beginning at about 0.55 $f_s$. The stopband attenuation of the Decim.3 filter 918 is greater than or equal to about 100 dB, and the passband ripple is less than +/−0.1 dB. This guarantees that aliasing will not occur at frequencies lower than 0.45 $f_s$.

53

F. Additional Description of the Processing Blocks.

1. Decim.1 Stage.

Figure 46:
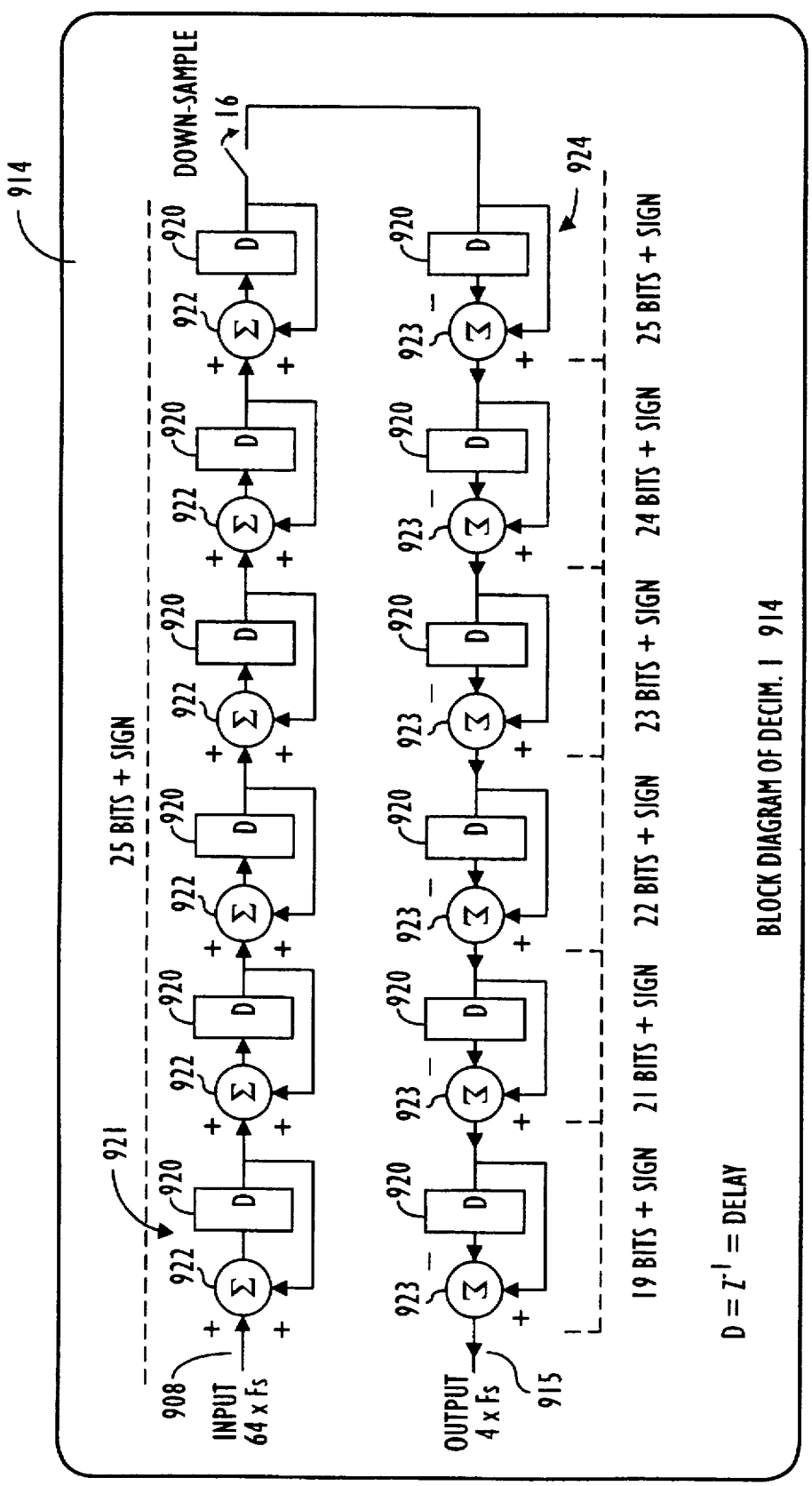
FIG. 46 is a block diagram of the Decim.1 filter.

This decimator is a $\text{sinc}^6$ integrator-comb filter, implemented as shown in FIG. 46.

The registers 920 shown in FIG. 46 all have the same MSB weight, which depends on the word length of the input signal 908, the decimation factor (16) and the order of the decimator (6). This embodiment is chosen so Decim.1 914 can correctly represent all possible input signal levels at the output signal 915, where saturation will be performed to a value approximating the full scale analog input. Truncation of LSB's can be performed using known methods. The bit lengths shown preserve about 120 dB STD. If the registers 920 are implemented as a RAM, not shown, then all will have the same length.

Each integrator 921 includes a summing node 922 and a delay block 920. The integrators 921 operate at the high rate $64 \times f_s$. Each differentiator 924 includes a difference node 923 and a delay block 920. The differentiators 924 operate at the lower rate of $4 \times f_s$, operating on one out of every 16 samples generated by the integrators 921. The transfer function performed by this block is:

$$H_1(z) = \left[ \frac{1}{16} \frac{(1-z^{16})}{(1-z^{-1})} \right]^6$$

Figure 47:
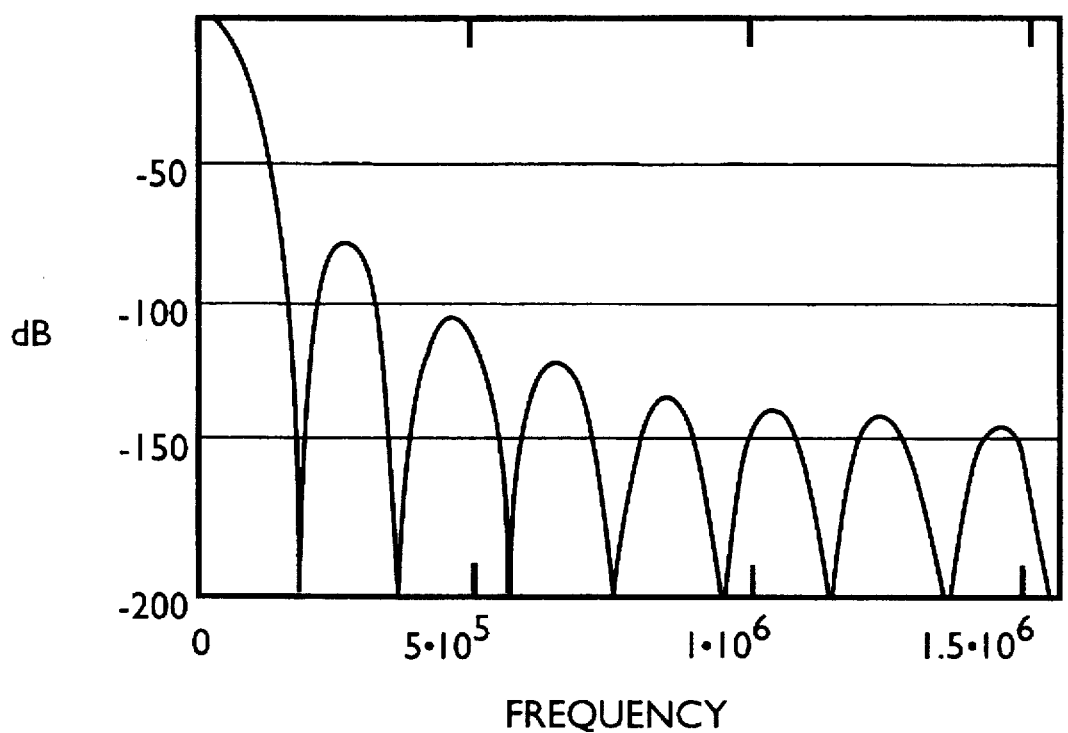
FIG. 47 graphically illustrates the frequency response of the Decim.1 filter.

The frequency response is shown in FIG. 47.

Figure 48:
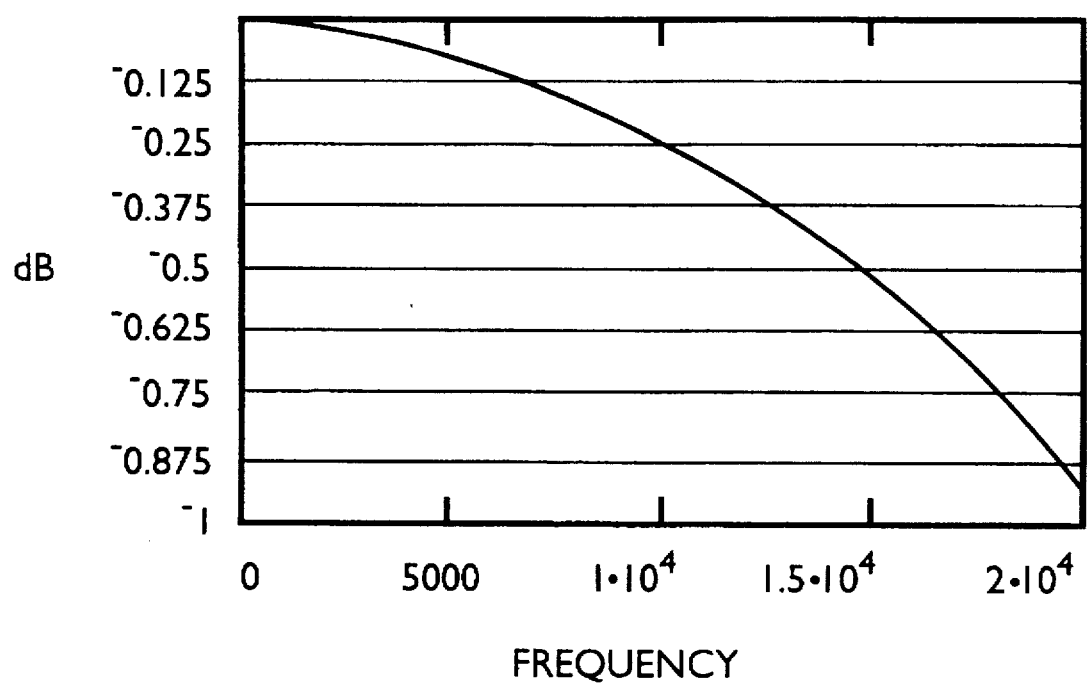
FIG. 48 graphically illustrates a detailed frequency response inside the passband of the Decim.1 filter.

The response is not flat in the passband. A detail of the rolloff is shown in FIG. 48.

2. Decim.2 Stage.

The second decimator, Decim.2 916, is a half-band linear phase FIR filter. This filter has a stopband of equal size as the passband, and equal ripple in the passband and the stopband. Since the stopband ripple is very low to obtain an attenuation of about 100 dB or more, the filter is essentially flat in the passband. A special property of this filter is that every other coefficient in its impulse response is equal to zero, except the middle coefficient, which is equal to 1.

When configured as a decimate by two filter, Decim.2 916 can be embodied in two basic forms. The first is a modified "direct" form, which results in the structure shown in FIG. 49. The second is a transposed form obtained reversing the signal flow graph of the first, and is shown in FIG. 50. Referring to FIG. 50, C1–C5 are the coefficients and the coefficient for xnm1 is equal to one. Each multiplier 925 multiplies the same input signal sample by a respective filter coefficient C1–C5. Delay blocks 926 and summing nodes 927, 928 are connected as shown in FIG. 50. The output of each multiplier 925 for coefficients C2–C5 is provided to a summing node 927 and to a summing node 928. The output of multiplier 925 for coefficient C1 is provided to a delay block 926 and to a summing node 928, as shown.

Figure 49:
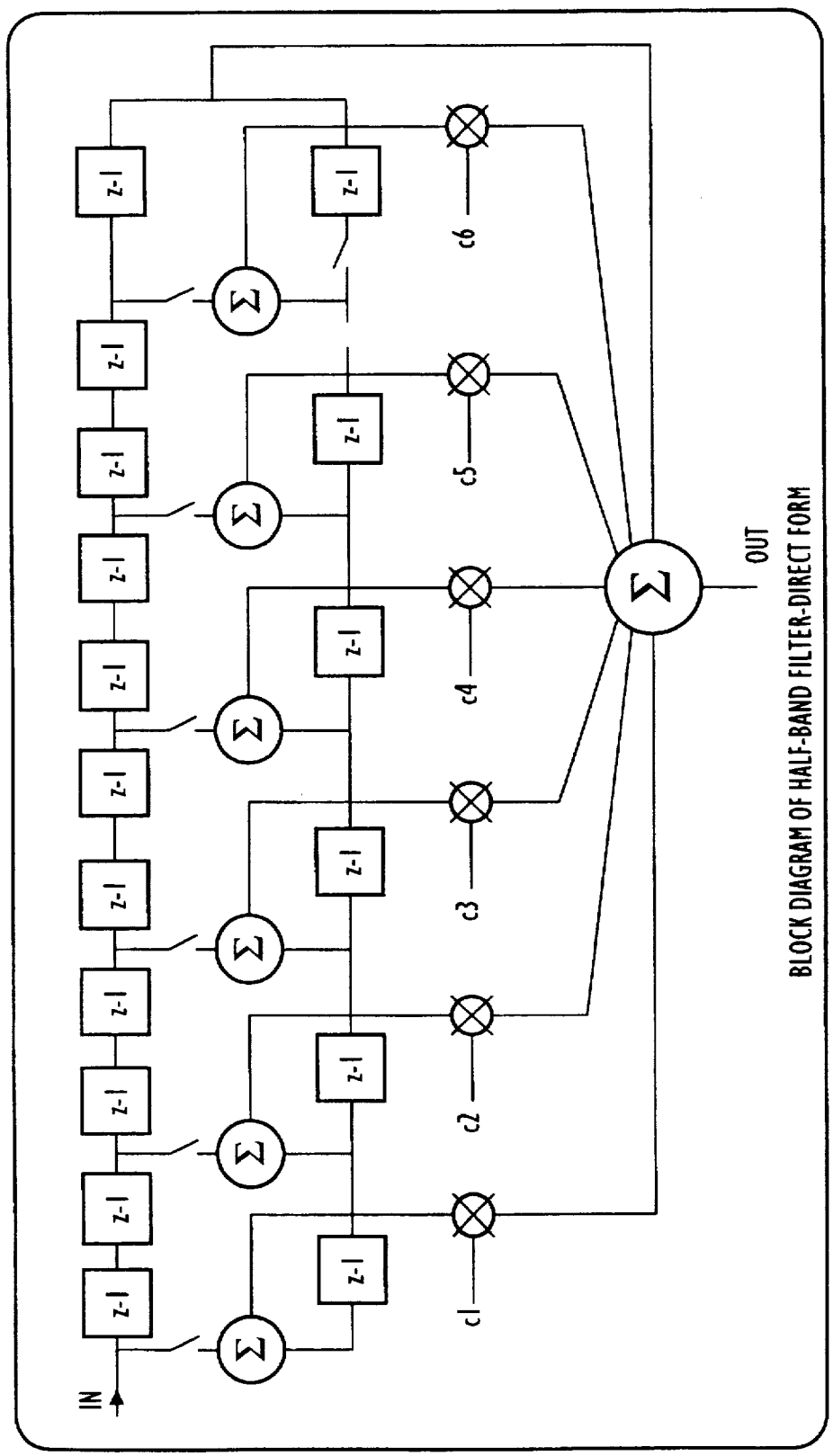
FIG. 49 is a block diagram of the half-band Decim.2 filter-direct form.
Figure 50:
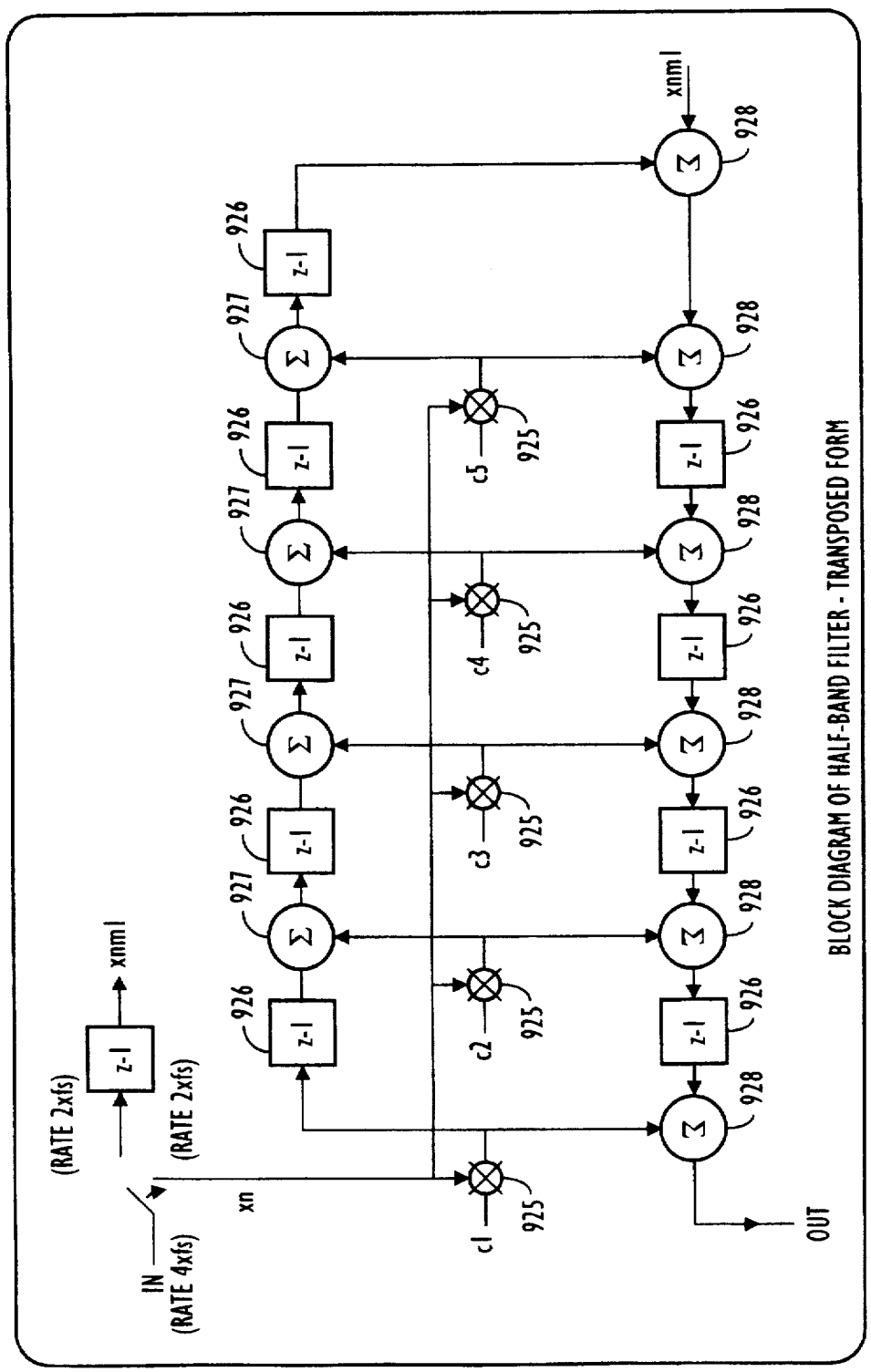
FIG. 50 is a block diagram of the half-band Decim.2 filter-transposed form.

The transposed structure in FIG. 50 has several advantages over the direct one of FIG. 49, whereby:

A minimum number of delays

All processing performed at the lower rate

Figure 51:
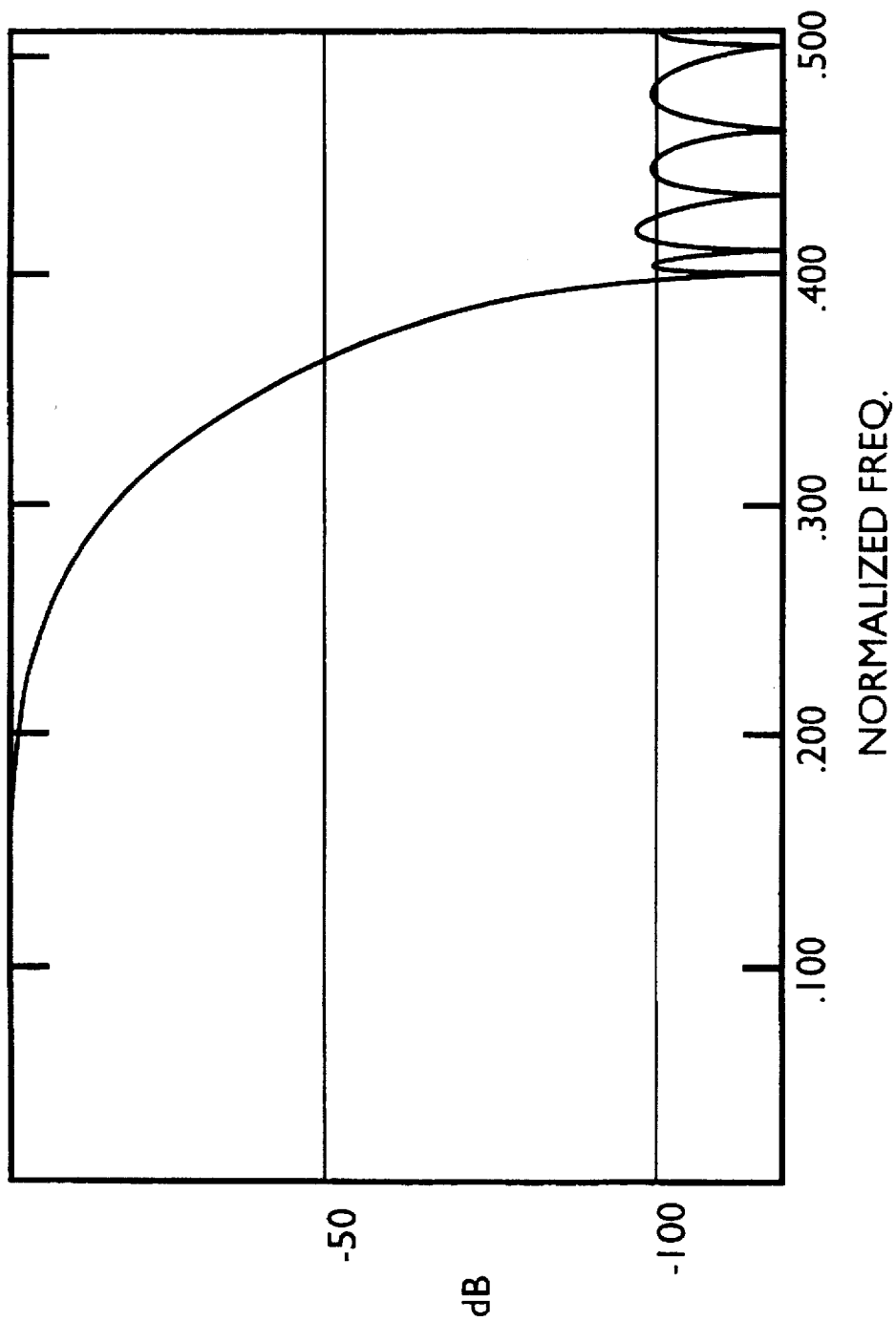
FIG. 51 graphically illustrates the frequency response of the Decim.2 filter.
Figure 52:
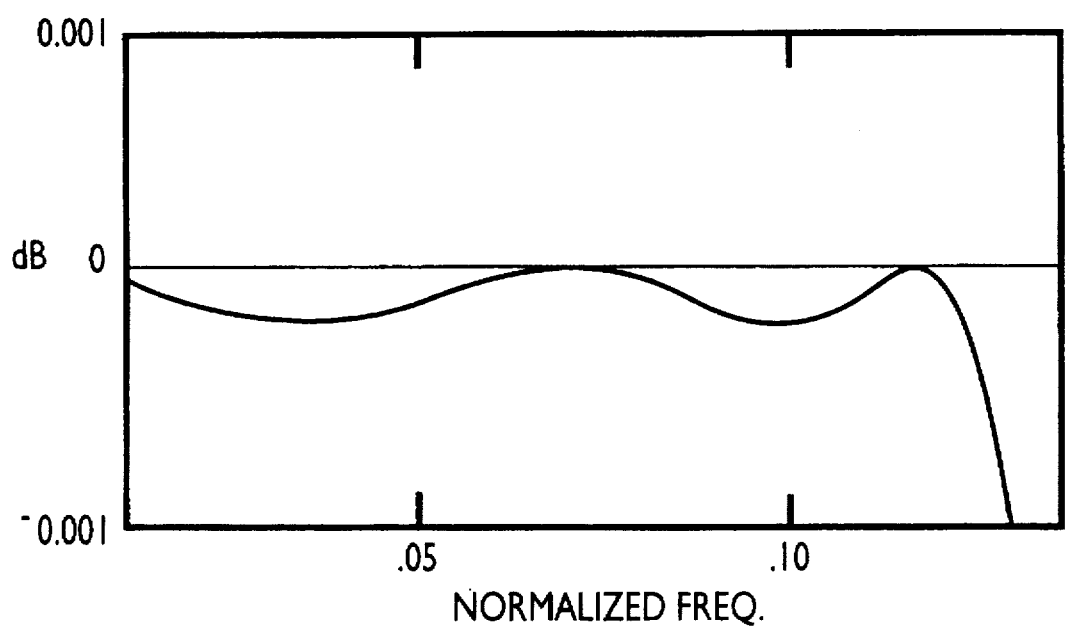
FIG. 52 is a detailed frequency response graph in the passband of the Decim.2 filter.

The frequency response performed by the Decim.2 916 filter is shown in FIGS. 51 and 52. Coefficients for Decim.2 filter 916 are as follows:

54

3. Decim.3 Stage.

Figure 54:
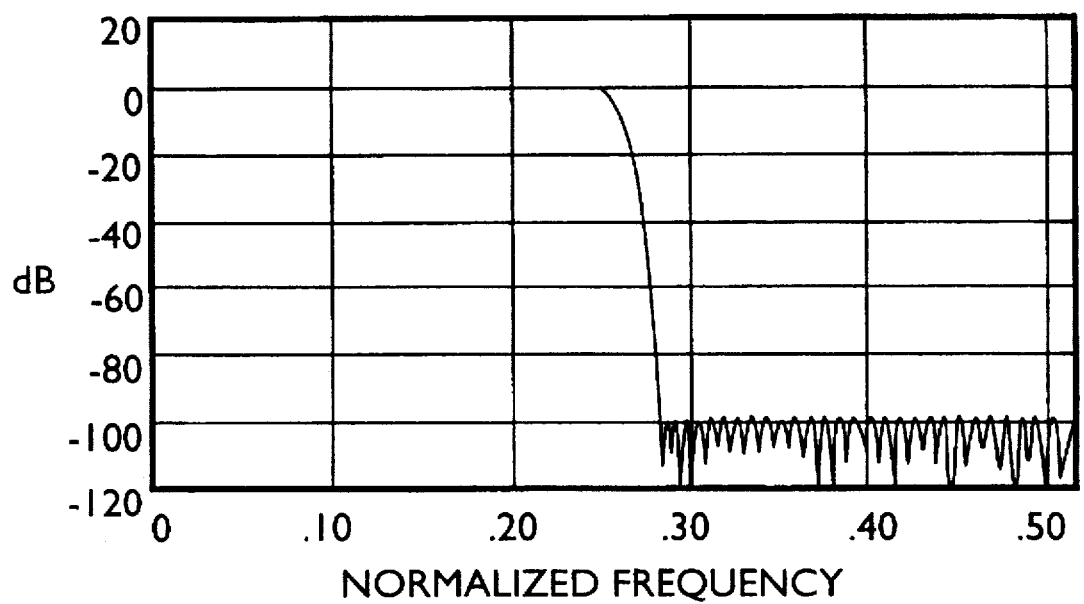
FIG. 54 graphically illustrates the frequency response of the Decim.3 filter.
Figure 55:
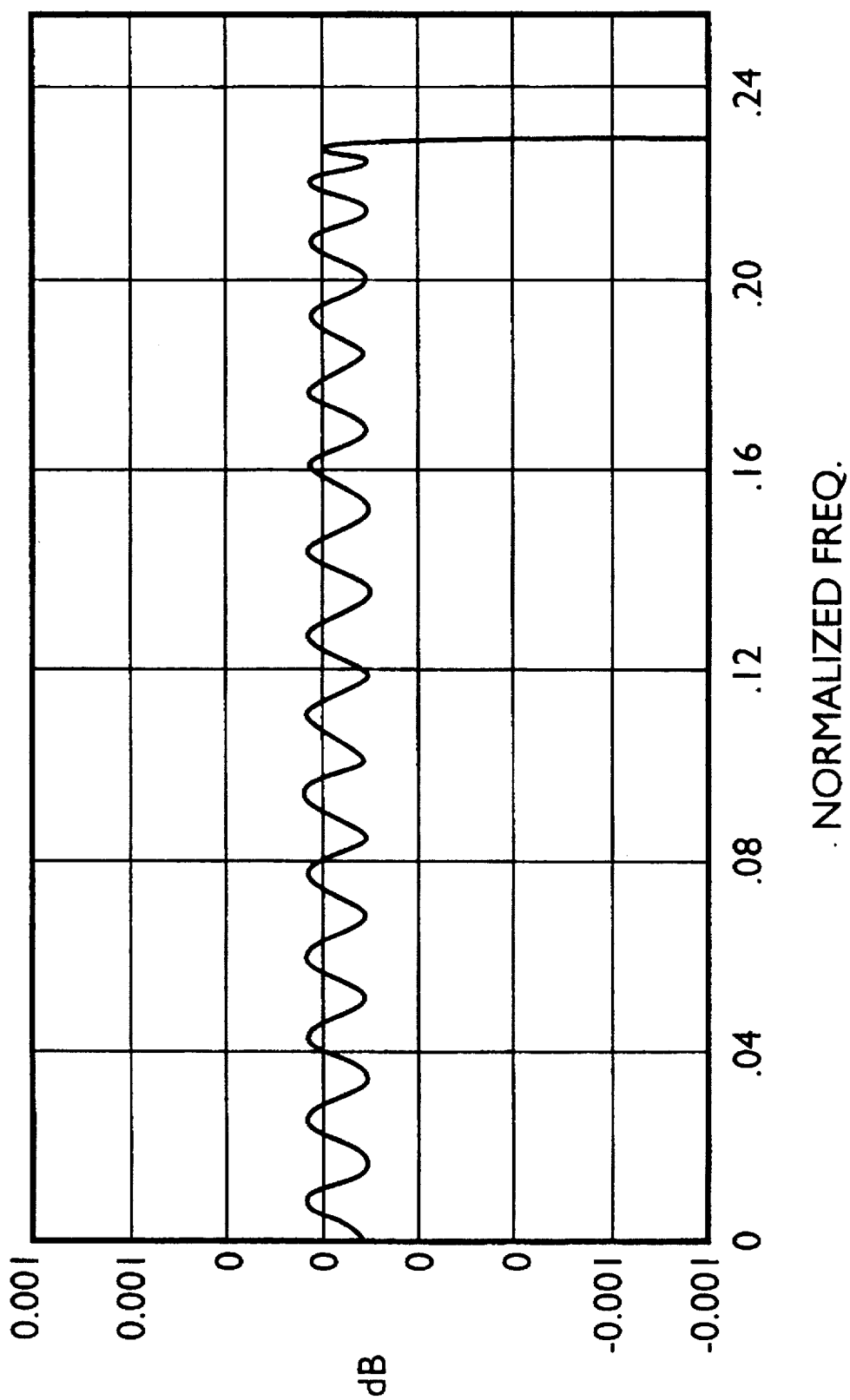
FIG. 55 graphically illustrates, in detail, the frequency response of the Decim.3 filter.

This decimator, Decim.3 916, is a symmetric (linear phase) FIR filter. It is designed to have an attenuation of about 100 dB in the stopband, and a +/−0.1 dB or less ripple in the passband. It is designed as a flat passband response half-band filter followed by a compensation filter. The frequency response of the half-band Decim.3 filter 918 is shown in FIGS. 54 and 55. When used as decimator, the Decim.3 filter 918 computes one sample for every two samples of input. Referring to FIG. 50, the transposed half-band structure is employed, since the entire filter operates at the lower sampling rate including the data tap updates.

The Decim.3 filter 918 has a linear phase characteristic which ensures the impulse response is symmetric, where the symmetry condition is:

$$h_k = h_{N-1-k} \qquad k = 0, \ldots N-1 \qquad (N \text{ odd})$$

with $h_k$ being the filter coefficients. Preferably, N is odd, but N may be even with a different symmetry condition.

The symmetry condition with N odd is reflected in the structure of the Decim.3 filter 918, similar to that shown in FIG. 50. With this structure it is not possible to use block-floating point methods, as can be done with the direct form shown in FIG. 49.

The first 30 coefficients for Decim.3 918 are listed. The response of the half-band filter is obtained by using the coefficients listed in Table C17 and after inserting zeros in between each coefficient listed in Table C17, similar to the format shown in Table C17, making the center coefficient equal to one.

TABLE C16

| | | | |
|---|---|---|---|
| 0.00169563293467031250 | −0.1517887115478515625 | 0.6137218475341796875 | −0.0121631622314453125 |
| −0.0121631622314453125 | 0.61372194753417968 | −0.1517887115478515625 | 0.0016956329345703125 |
| 0.04854583740234375 | 1. | 0.04854583740234375 | |

TABLE C17

| 30 = no. of coefficients | | |
|---|---|---|
| −0.0000286102294921875 | −0.00216233349609375 | −0.0215911865234375 |
| 0.000049591064453125 | 0.0028553009033203125 | 0.026386260986328125 |
| −0.0000934600830078125 | −0.0037174224853515625 | −0.0323505401611328125 |
| 0.00016021728515625 | 0.0047740936279296875 | 0.039966583251953125 |
| −0.0002574920654296875 | −0.006061553955078125 | −0.0500602722167968750 |
| 0.0003948211669921875 | 0.00761795043945125 | 0.0642070770263671875 |
| −0.000585556030734375 | −0.009490966796875 | −0.0857810974121096375 |
| 0.0008392333984375 | 0.011737823486328125 | 0.1235866546630859375 |
| −0.0011749267578125 | −0.0144329071044921875 | −0.2099456787109375 |
| 0.00160980224609375 | 0.0176715850830078125 | 0.6358623504638671875 |

4. Compensation Filter.

Figure 53:
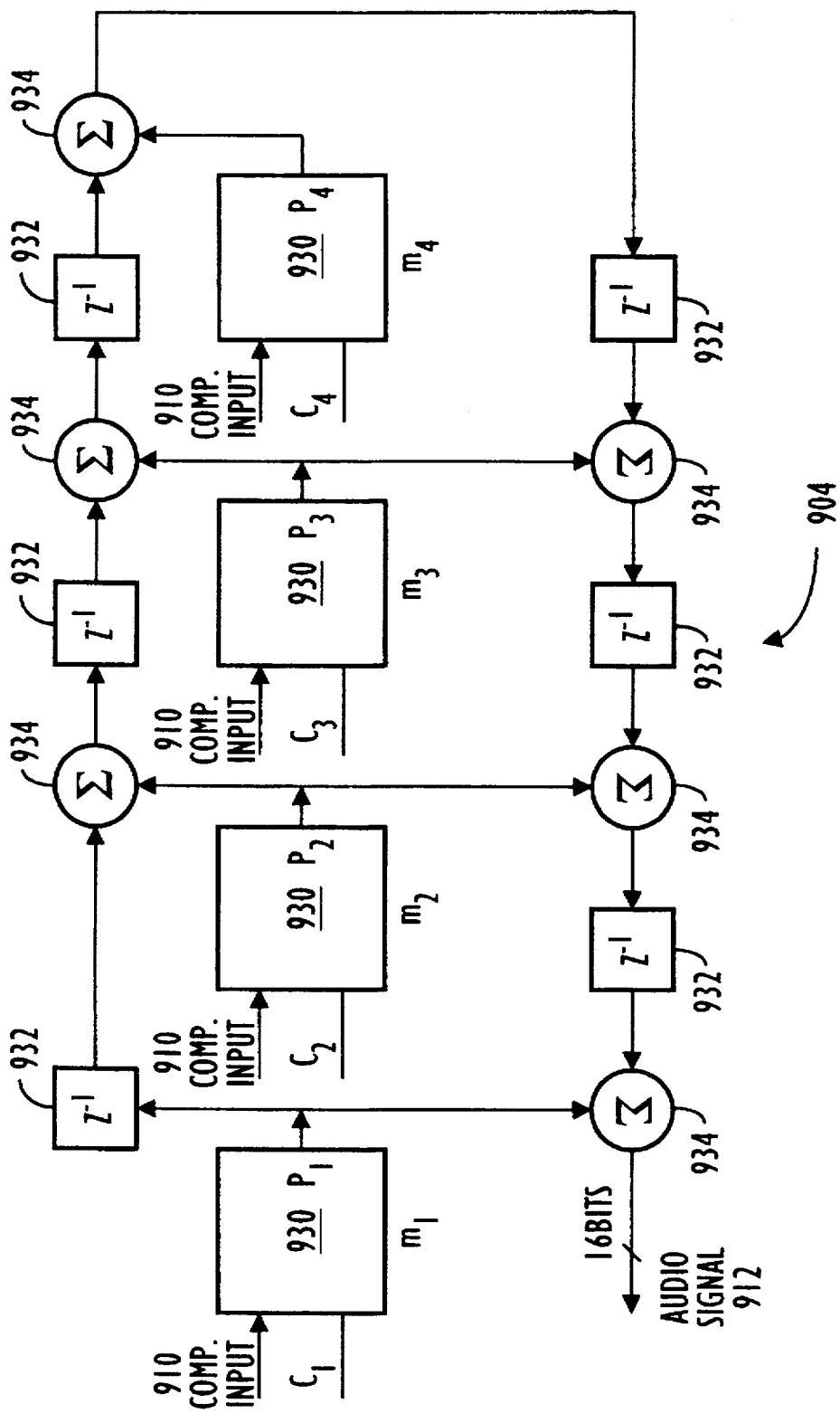
FIG. 53 is a block diagram of the compensation filter of the CODEC A/D conversion circuitry.

A Nyquist rate FIR compensator filter 904 (FIG. 53) is connected to the output of Decim.3 918 and is utilized to compensate for the rolloff introduced by the sinc$^6$ decimator filter, Decim.1 914, to give a flat response, and to provide gain compensation. FIR filter 904 includes a series of multipliers 930, denoted M1-4, which multiply the compensation input signal 910, which is the signal output from Decim.3 filter 918 (FIG. 40), by a compensator filter coefficient C1-4, respectively. The product of each respective multiplier 930, P1-4, is input to a summing node 934.

The compensator audio output signal 912 (FIG. 53) is provided to format conversion block 536 (FIG. 1) and to overrange detect circuit 913 (FIG. 39) as a 16-bit signed digital audio signal. Overrange detect circuit 913 detects where the amplitude of compensator output signal 912 is with respect to full scale and sets output bits B0 and B1. These bits are utilized by the user, using known methods, to adjust the gain of the audio signal being detected. The appropriate attenuation/gain control circuit in Mixer 606 (FIG. 2) can be programmed to increase or decrease the signal amplitude, as needed.

Figure 56:
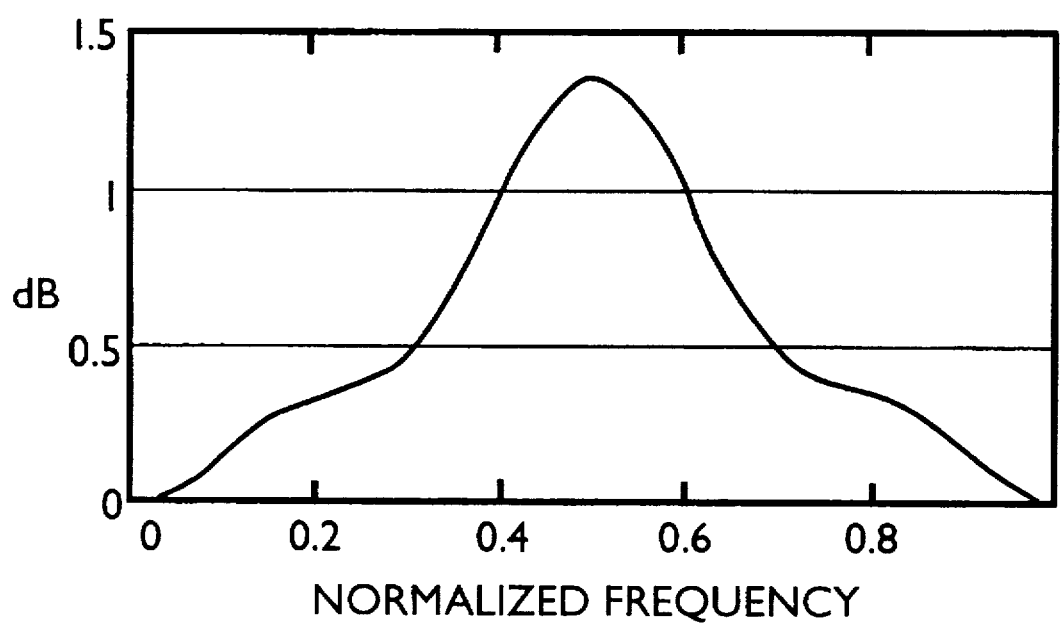
FIG. 56 graphically illustrates the compensator circuit frequency response.
Figure 57:
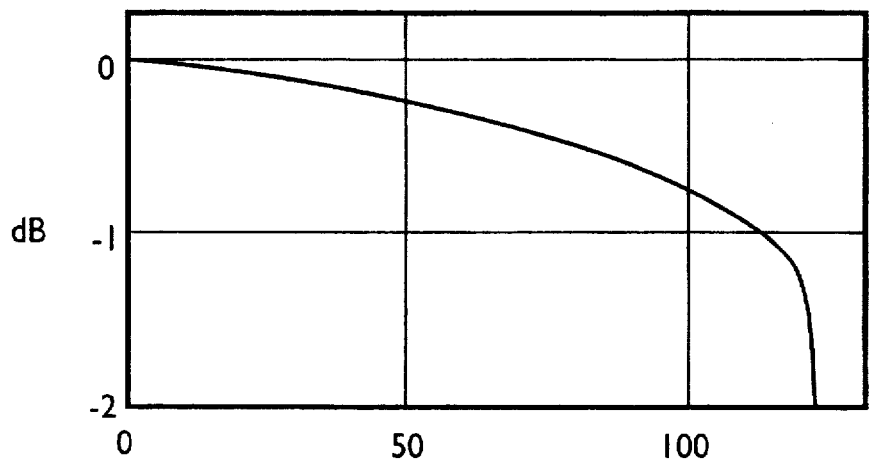
FIG. 57 graphically illustrates the total frequency response of the decimator circuitry in the passband (uncompensated)
Figure 58:
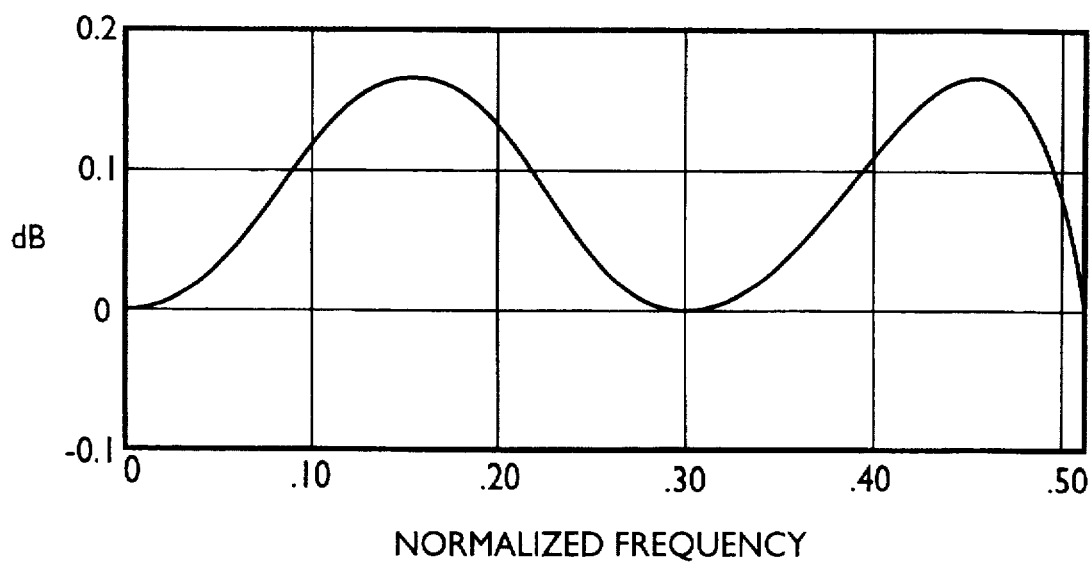
FIG. 58 graphically illustrates the total frequency response of the decimator circuitry in the passband (compensated).

The compensation filter 904 operates at the Nyquist rate and is also linear phase, with only 7 data taps, which means 4 coefficients are needed. The frequency response for the decimator after compensation filter 904 is shown in FIG. 56. The total frequency response for the decimator in the passband is shown in FIG. 57 (before compensation) and in FIG. 58 (after compensation).

Compensation filter 914 performs the following transfer function:

$$H_s\left(e^{\frac{j\pi[freq]}{32}}\right) = \left[\frac{1}{16}\frac{\sin(8\omega)}{\sin\left(\frac{\omega}{2}\right)}\right]^6 \bigg|_{\omega=\frac{\pi[freq]}{32}} = \left[\frac{1}{16}\frac{\sin\left(\frac{\pi[freq]}{4}\right)}{\sin\left(\frac{\pi[freq]}{64}\right)}\right]^6$$

where "freq." is the normalized frequency.

The impulse response coefficients for compensation filter 914 are as follows:

TABLE C18

| |
|---|
| −7.693934583022969 E-003 |
| 9.565316495127612 E-003 |
| −3.365866138777326 E-002 |
| 1.054232901311562 |

The foregoing disclosure and description of the invention are illustrative and explanatory of the preferred embodiments, and changes in the size, shape, materials and individual components, elements, connections and construction may be made without departing from the spirit of the invention.

What is claimed is:

1. A stereo audio coder-decoder (CODEC) circuit, comprising:

(a) an analog mixer circuit having a plurality of inputs and outputs;

(b) a digital-to-analog conversion circuit, having at least one input and one output, and having a multi-stage interpolation filter circuit, a noise shaper circuit and a semi-digital FIR filter circuit, whereby said at least one output is connected to an input of said analog mixer circuit;

(c) an analog-to-digital conversion circuit, having at least one input and one output, and having a fourth order sigma-delta modulator circuit, a multi-stage digital decimation filter circuit and a digital compensation circuit, whereby said at least one input is connected to an output of said analog mixer circuit;

(d) data format conversion circuitry connected to said at least one input of said digital-to-analog conversion circuit and to said at least one output of said analog-to-digital conversion circuit;

(e) on-chip memory, for storing digital audio signals, whereby said data format conversion circuitry is connected to said on-chip memory and provides data compression/decompression operations on data being input or output to or from said on-chip memory; and wherein said digital-to-analog and said analog-to-digital conversion circuits are capable of operating at independently programmable sample rates.

2. The CODEC of claim 1, further comprising a serial transfer control circuit connected to said on-chip memory.

3. The CODEC of claim 1, further comprising a clock generation circuit for selectably generating independent clock signals for controlling the sample rate at which said digital-to-analog circuit and said analog-to-digital circuit operate.

4. The CODEC of claim 1, further comprising an audio signal zero crossing detection circuit for controlling the amplitude of signals input to or output from said analog mixer circuit.

5. The CODEC of claim 1, further comprising a circuit for interleaving data being input to an external system memory from said on-chip memory, or interleaving being retrieved from said external system memory before said data is input to said on-chip memory.

6. The CODEC of claim 2, wherein said serial transfer control circuit provides bi-directional serial data between an external DSP and said on-chip memory.

7. The CODEC of claim 1, further comprising a synthesizer data digital-to-analog conversion circuit having an input and an output, where said output of said synthesizer data digital-to-analog conversion circuit is connected to an input to said analog mixer.

8. The CODEC of claim 1, further comprising off-chip local memory, wherein said local memory is connected to said on-chip memory.

9. The CODEC of claim 8, wherein a digital data path exists between said off-chip local memory and an external DSP.

10. The CODEC of claim i wherein said CODEC provides control signals for an external CD-ROM interface.

11. The CODEC of claim 1, further comprising a non-volatile serial memory interface for providing plug-and-play compatibility, where said non-volatile serial memory interface communicates with an external operating system.

12. The CODEC of claim 8, wherein said off-chip local memory is configured as a FIFO for providing data to and receiving data from said on-chip memory.

13. The CODEC of claim 8, wherein said off-chip local memory is controlled by an on-chip data sample counter, wherein said data sample counter is capable of generating a system level interrupt.

14. The CODEC of claim 1, wherein an analog microphone signal input to said mixer is summed with a plurality of other analog signals input to said mixer.

15. The CODEC of claim 1, wherein an analog path through said mixer exists between an input from said digital-to-analog conversion circuit and said analog-to-digital conversion circuit.

16. The CODEC of claim 1, wherein said analog mixer circuit includes, as an input signal, an analog signal output from a synthesizer digital-to-analog converter circuit.

17. The CODEC of claim 1, wherein said on-chip memory comprises a playback path FIFO and a record path FIFO, wherein each said FIFO includes programmable I/O thresholds for generating a system level interrupt and/or DMA scheduling.

18. The CODEC of claim 1, wherein said analog mixer circuit includes a programmable master volume control circuit for controlling the attenuation/gain of at least one of said plurality of mixer outputs.

19. The CODEC of claim 4, wherein said zero crossing detection circuit further comprises at least one fixed timer for controlling the length of time a comparator circuit, included within said zero crossing detection circuit, remains powered up.

20. The CODEC of claim 3, wherein said clock generation circuit generates selectable clock signals of varying frequency within a first and/or a second frequency range.

21. The CODEC of claim 2, wherein said serial data transfer control circuit includes a first digital data loopback path between said off-chip local memory and said digital-to-analog converter circuit and a second digital data loopback path between said off-chip local memory and said analog-to-digital converter circuit.

22. The CODEC of claim 2, wherein said serial transfer control circuit includes a bi-directional digital data path to an external synthesizer DSP.

23. The CODEC of claim 1, whereby said analog-to-digital conversion circuit and/or said digital-to-analog conversion circuit have independently programmable sample rates, wherein said independently programmable sample rates are changed within one sample period and without disabling the operation of analog circuitry in said analog-to-digital conversion circuit and said digital-to-analog conversion circuit.

24. The CODEC of claim 22, whereby said independently programmable sample rate of said digital-to-analog conversion circuit is variable and programmable over about 256 steps.

25. The CODEC of claim 1, further comprising power management circuitry for selectably suspending power to at least a portion of said CODEC.

26. The CODEC of claim 8, further comprising a local memory control circuit for controlling the data transfer operations between said off-chip local memory and said on-chip memory.

27. The CODEC of claim 1, further comprising a 3.3/5.0 volt detect circuit for providing an external system with status information regarding whether said CODEC is operating at 3.3 or 5.0 volts.

28. The CODEC of claim 22, whereby said independently programmable sample rate of said digital-to-analog conversion circuit is variable and programmable over a plurality of frequency steps.

29. The CODEC of claim 1, wherein said noise shaper circuit comprises a 5th order sigma-delta modulator.

30. A stereo audio coder-decoder (CODEC) circuit, comprising:

(a) an analog mixer circuit having a plurality of inputs and outputs;

(b) a digital-to-analog conversion circuit, having at least one input and one output, and having a multi-stage interpolation filter circuit, whereby said at least one output of said digital-to-analog conversion circuit is connected to an input of said analog mixer circuit;

(c) an analog-to-digital conversion circuit, having at least one input and one output, and having a multi-stage digital decimation filter circuit, whereby said at least one input of said analog-to-digital conversion circuit is connected to an output of said analog mixer circuit;

(d) data format conversion circuitry connected to said at least one input of said digital-to-analog conversion circuit and to said at least one output of said analog-to-digital conversion circuit;

(e) on-chip memory, for storing digital audio signals, whereby said data format conversion circuitry is connected to said on-chip memory; and wherein said digital-to-analog and said analog-to-digital conversion circuits are each controlled to operate at independently programmable sample rates.

* * * * *

UNITED STATES PATENT AND TRADEMARK OFFICE
CERTIFICATE OF CORRECTION

PATENT NO. : 5,589,830
DATED : December 31, 1996
INVENTOR(S) : Alfredo R. Linz, et al It is certified that error appears in the above-indentified patent and that said Letters Patent is hereby corrected as shown below:

At Col. 1/Line 9, delete "referenced" and insert therefore -- reference --.

At Col. 4/Line 44, after "variety" insert -- of --.

At Col. 9/Line 10, delete "5 10" and insert therefore -- 510 --.

At Col. 11/Line 54, between "DMA," and "the", insert therebetween -- the record FIFO and --.

At Col. 11/Line 54, delete "re cord" and insert therefore -- record --.

At Col. 14/Line 43, delete "oscillator" and insert therefore -- oscillators --.

At Col. 16/Line 38, delete "CSRLR" and insert therefore -- CSR1R --.

At Col. 20/Line 35, delete "by a writing" and insert therefore -- by writing --.

At Col. 20/Line 38, delete "by a writing" and insert therefore -- by writing --.

At Col. 21/Line 9, delete "to the both" and insert therefore -- to both --.

At Col. 21/Line 31, delete "this" and insert therefore -- This --.

At Col. 21/Line 44, delete "oscillator" and insert therefore -- oscillators --.

At Col. 23/Line 15, delete "607 is" and insert therefore -- 607 are --.

At Col. 23/Line 63, delete "turn is used" and insert therefore -- turn used --.

UNITED STATES PATENT AND TRADEMARK OFFICE
CERTIFICATE OF CORRECTION

PATENT NO. : 5,589,830
DATED : December 31, 1996
INVENTOR(S) : Alfredo R. Linz, et al It is certified that error appears in the above-indentified patent and that said Letters Patent is hereby corrected as shown below:

At Col. 26/Line 48, between "illustrated" and "Table", insert there between -- in --.

At Col. 27/Line 54, delete "5 12" and insert therefore -- 512 --.

At Col. 32/Line 66, delete "are" and insert therefore -- is --.

At Cols. 41 and 42, at Table C13, in Col. 1 of Table C13, delete "8.216425148181775E-004" and insert therefore -- 8.215425148181775E-004 --.

At Cols. 41 and 42, at Table C13, in Col. 1 of Table C13, delete "-5.730366042081015E-005" and insert therefore -- -5.730365042081015E-005 --.

At Cols. 41 and 42, at Table C13, in Col. 2 of Table C13, delete "1.0076766639535953E-003" and insert therefore -- 1.0876766639535953E-003 --.

At Cols. 41 and 42, at Table C13, in Col. 2 of Table C13, delete "-1.215334421266815E-002" and insert therefore -- -1.215334421265815E-002 --

At Cols. 41 and 42, at Table C13, in Col. 3 of Table C13, delete "1.328095694947460E-002" and insert therefore --1.328095684947460E-002 --.

At Col. 45/Line 63, insert a space between "$\Delta\kappa=\Delta$" and "setting."

At Col. 47/Line 28, prior to "where $T=1/f_s$" insert -- $k=0, .. 4$ --.

UNITED STATES PATENT AND TRADEMARK OFFICE
CERTIFICATE OF CORRECTION

PATENT NO. : 5,589,830
DATED : December 31, 1996
INVENTOR(S) : Alfredo R. Linz, et al It is certified that error appears in the above-indentified patent and that said Letters Patent is hereby corrected as shown below:

At Col. 51/Line 28, between "associated" and "the", insert therebetween -- with --.

At Col. 52/Line 35, delete "AA/D" and insert therefore -- A/D --.

At Cols. 53 and 54, at Table C16, in Col. 2 of Table C16, delete "0.61372194753417968" and insert therefore -- 0.61372184753417968875 --.

Signed and Sealed this

Fifth Day of August, 1997

Attest:

BRUCE LEHMAN

Attesting Officer

Commissioner of Patents and Trademarks